(12) United States Patent
Fujii et al.

(10) Patent No.: US 12,119,617 B2
(45) Date of Patent: Oct. 15, 2024

(54) LIGHT EMITTING ELEMENT

(71) Applicant: Sony Corporation, Tokyo (JP)

(72) Inventors: Kentaro Fujii, Kanagawa (JP);
Tatsushi Hamaguchi, Kanagawa (JP);
Rintaro Koda, Tokyo (JP)

(73) Assignee: Sony Corporation, Tokyo (JP)

( * ) Notice: Subject to any disclaimer, the term of this patent is extended or adjusted under 35 U.S.C. 154(b) by 1073 days.

(21) Appl. No.: 16/978,531

(22) PCT Filed: Feb. 6, 2019

(86) PCT No.: PCT/JP2019/004228
§ 371 (c)(1),
(2) Date: Sep. 4, 2020

(87) PCT Pub. No.: WO2019/171864
PCT Pub. Date: Sep. 12, 2019

(65) Prior Publication Data
US 2020/0403378 A1    Dec. 24, 2020

(30) Foreign Application Priority Data

Mar. 6, 2018   (JP) ................ 2018-039597

(51) Int. Cl.
*H01S 5/183* (2006.01)
*H01S 5/042* (2006.01)
*H01S 5/343* (2006.01)

(52) U.S. Cl.
CPC ...... *H01S 5/18361* (2013.01); *H01S 5/04254* (2019.08); *H01S 5/18311* (2013.01); *H01S 5/34333* (2013.01); *H01S 5/34346* (2013.01)

(58) Field of Classification Search
USPC ..................................... 372/44.01
See application file for complete search history.

(56) References Cited

U.S. PATENT DOCUMENTS

2014/0023380 A1*  1/2014  Takeda ............... H01S 5/18358
                                                    372/45.01
2014/0169397 A1   6/2014  Kostamovaara et al.
(Continued)

FOREIGN PATENT DOCUMENTS

CN    1340890 A    3/2002
CN    1702929 A    11/2005
(Continued)

OTHER PUBLICATIONS

J.T. Leonard et al., "Non-polar III-nitride vertical-cavity surface-emitting lasers incorporating an ion implanted aperture", Applied Physics Letters, 107, 011102, Jul. 6, 2015.
(Continued)

*Primary Examiner* — Tuan N Nguyen
(74) *Attorney, Agent, or Firm* — K&L Gates LLP

(57) ABSTRACT

A light emitting element includes a stacked structure including, in a stacked state, a first light reflection layer 41 in which a plurality of thin films is stacked, a light emitting structure 20, and a second light reflection layer 42 in which a plurality of thin films is stacked. The light emitting structure includes a first compound semiconductor layer 21, an active layer 23 and, a second compound semiconductor layer 22 which are stacked. The light emitting structure 20 is formed with a light absorbing material layer 71 (32) in parallel to a virtual plane occupied by the active layer 23. Let the oscillation wavelength be $\lambda_0$, let the equivalent refractive index from the active layer to the light absorbing material layer be $n_{eq}$, let the optical distance from the active layer to the light absorbing material layer be $L_{op}$, and let $\Lambda \equiv \{(2m+1)\lambda_0\}/(4n_{eq})$ (where m is an integer of equal to or more than 0), then, the value of $L_{op}$ is a value different from $\Lambda$, and the thickness $T_{ave}$ of the second light reflection layer 42 is a (Continued)

value different from the theoretical thickness $T_{DBR}$ of the second light reflection layer 42.

12 Claims, 40 Drawing Sheets

(56) References Cited

U.S. PATENT DOCUMENTS

| | | | | |
|---|---|---|---|---|
| 2015/0043601 | A1* | 2/2015 | Hamaguchi | H01S 5/18391 372/44.01 |
| 2015/0043606 | A1* | 2/2015 | Hamaguchi | H01S 5/18391 438/29 |
| 2016/0308332 | A1* | 10/2016 | Hamaguchi | H01S 5/0217 |
| 2018/0366906 | A1 | 12/2018 | Hamaguchi et al. | |
| 2019/0173263 | A1 | 6/2019 | Hamaguchi et al. | |

FOREIGN PATENT DOCUMENTS

| | | |
|---|---|---|
| CN | 101510665 A | 8/2009 |
| CN | 101800235 A | 8/2010 |
| CN | 101939882 A | 1/2011 |
| CN | 105914581 A | 8/2016 |
| JP | 2008034797 A | 2/2008 |
| JP | 2013201222 A | 10/2013 |
| JP | 2014022523 A | 2/2014 |
| JP | 2016157910 A | 9/2016 |
| WO | 2017018017 A1 | 2/2017 |
| WO | 2018037679 A1 | 3/2018 |

OTHER PUBLICATIONS

International Search Report issued in Application No. PCT/JP2019/004228, dated Apr. 23, 2019.

* cited by examiner

[FIRST LIGHT REFLECTION LAYER]

[FIRST LIGHT REFLECTION LAYER]

LIGHT EMITTING ELEMENT

TECHNICAL FIELD

The present disclosure relates to a light emitting element (specifically, a surface-emitting laser element also called a vertical-cavity surface-emitting laser, VCSEL).

BACKGROUND ART

For example, as disclosed in literature "Nonpolar III-nitride vertical-cavity surface-emitting lasers incorporating an ion implanted aperture," a surface-emitting laser element causes resonance of light to occur between two light reflection layers (Distributed Bragg Reflector layers, DBR layers), thereby generating laser oscillation. A light emitting structure is formed between the two DBR layers. The light emitting structure includes an n-type GaN-based compound semiconductor layer, an active layer including MQW, and a p-type GaN-based compound semiconductor layer. Further, an ITO layer constituting an electrode of one side is formed on the p-type GaN-based compound semiconductor layer, and a spacer layer including $Ta_2O_5$ having a ⅛ wavelength thickness and a p-side DBR layer are sequentially formed over the ITO layer. The position of a maximum amplitude portion of a light intensity distribution (the position of an antinode on one side of a standing wave in a resonator) is made coincident with the position of the active layer, and the ITO layer that would absorb light is made coincident with the position of a minimum amplitude portion of the light intensity distribution (the position of an antinode on the other side of the standing wave in the resonator), to thereby obtain a structure in which a threshold current is reduced. Specifically, the optical distance from the thickness-directional center of the active layer to the thickness-directional center of the ITO layer is set to (¾) wavelength. Here, the "wavelength" described above refers to the wavelength of light which is emitted from the surface-emitting laser element and which has a maximum intensity. Note that the "position of a maximum amplitude portion of a light intensity distribution (position of an antinode on one side of a standing wave in a resonator)" may hereinafter be referred to as the "position of the antinode on one side in the light intensity distribution," and the "position of a minimum amplitude portion of the light intensity distribution (position of the antinode on the other side of the standing wave in the resonator)" may be referred to as the "position of the antinode on the other side in the light intensity distribution."

CITATION LIST

Non Patent Literature

[NPL 1]
"Nonpolar III-nitride vertical-cavity surface-emitting lasers incorporating an ion implanted aperture," APPLIED PHYSICS LETTERS 107, 011102 (2015)

SUMMARY

Technical Problems

In a GaAs-based surface-emitting laser element, a resonator can be formed by highly accurate epitaxial growth, and, as a result, an oscillation wavelength can be controlled strictly. On the other hand, in a GaN-based surface-emitting laser element, in general, it is difficult to control the cavity length, and, since the cavity length is long, the laser light in a longitudinal mode which can be emitted from the surface-emitting laser element would be a plurality of kinds, resulting in a peculiar problem that the oscillation wavelength of the laser light emitted from the surface-emitting laser element is deviated. In addition, if the oscillation wavelength of the laser light is deviated, the overlap of a light field and the active layer would vary (decrease), resulting in a variation (increase) in the threshold current, making it difficult to control the threshold current. In addition, at the time of forming the DBR layers and various compound semiconductor layers, if a film thickness variation or a composition variation occurs in the DBR layers and the compound semiconductor layers, the position of the standing wave in the resonator would vary, which causes a variation (increase) in the threshold current, similarly to a case of the deviation of the oscillation wavelength. The variation in the threshold current would cause such problems as lowering in the production yield of the surface-emitting laser element. Particularly, in the case of the surface-emitting laser element, plural surface-emitting laser elements may be arrayed on one chip, and, in such a case, if the difference in the threshold current among the surface-emitting laser elements is large, the overall output may become instable, or the driving circuit may be complicated.

It is accordingly an object of the present disclosure to provide a light emitting element having such a configuration and structure that variations in a threshold current can be restrained.

Solution to Problems

A light emitting element according to a first mode of the present disclosure for achieving the above-mentioned object includes
  a stacked structure including, in a stacked state,
    a first light reflection layer in which a plurality of thin films is stacked,
    a light emitting structure, and
    a second light reflection layer in which a plurality of thin films is stacked,
  in which the light emitting structure includes
    a first compound semiconductor layer,
    an active layer, and
    a second compound semiconductor layer, that are stacked from the first light reflection layer side,
  the light emitting structure is formed with a light absorbing material layer in parallel to a virtual plane occupied by the active layer, and
  let the wavelength of light which is emitted from the active layer and which has a maximum intensity be $\lambda_0$, let the equivalent refractive index of layers occupying layers ranging from the active layer to the light absorbing material layer be $n_{eq}$, let the optical distance from the active layer to the light absorbing material layer be $L_{op}$, and let $\Lambda \equiv \{(2m+1)\lambda_0\}/(4n_{eq})$ (where m is an integer of equal to or more than 0), then,
  the value of $L_{op}$ is a value different from $\Lambda$, and
  the thickness $T_{ave}$ of the light reflection layer on the side on which the light absorbing material layer is located is a value different from a thickness $T_{DBR}$,
  where let the refractive indexes of thin films constituting the light reflection layer on the side on which the light absorbing material layer is located be $n_i$ and let the total number of the thin films be 1, then, $T_{DBR} = \Sigma(\lambda_0/4n_i)$, i=1, 2, 3, . . . , 1, and
"Σ" means to sum up from i=1 to i=1.
  A light emitting element according to a second mode of the present disclosure for achieving the above-mentioned object includes a stacked structure including, in a stacked state,
   a first light reflection layer in which a plurality of thin films is stacked,
   a light emitting structure,
   and a second light reflection layer in which a plurality of thin films is stacked,
in which the light emitting structure includes
   a first compound semiconductor layer,
   an active layer, and
   a second compound semiconductor layer, that are stacked from the first light reflection layer side,
the light emitting structure is formed, at an end portion thereof, with a light absorbing material layer in parallel to a virtual plane occupied by the active layer,
a dielectric layer is formed between the light absorbing material layer and the light reflection layer on the side on which the light absorbing material layer is located, and
let the wavelength of light which is emitted from the active layer and which has a maximum intensity be $\lambda_0$,
let the equivalent refractive index of layers occupying layers ranging from the active layer to the light absorbing material layer be $n_{eq}$, let the optical distance from the active layer to the light absorbing material layer be $L_{op}$, let the refractive index of the dielectric layer be $n_{del}$, let the optical distance from the light absorbing material layer to an interface between the light reflection layer on the side on which the light absorbing material layer is located and the dielectric layer be $L_{del}$, and let $\Lambda \equiv \{(2m+1)\lambda_0\}/(4n_{eq})$ (where m is an integer of equal to or more than 0), then
the value of $L_{op}$ is a value different from $\Lambda$, and $L_{del} \neq \lambda_0/(4n_{del})$.

Figure 27:
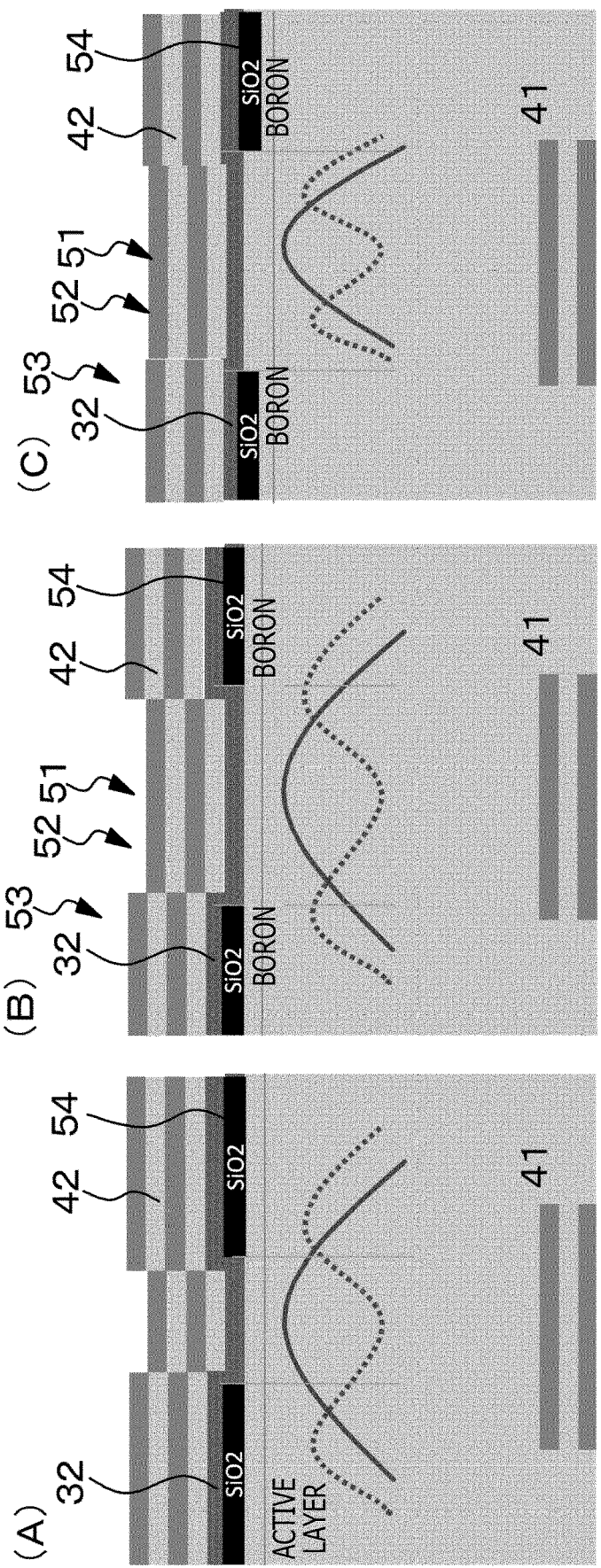

(A), (B) and (C) of FIG. 27 are conceptual diagrams each depicting the light field intensity in a conventional light emitting element, that in the light emitting element of Embodiment 9, and that in a light emitting element of Embodiment 12.

Figure 28:
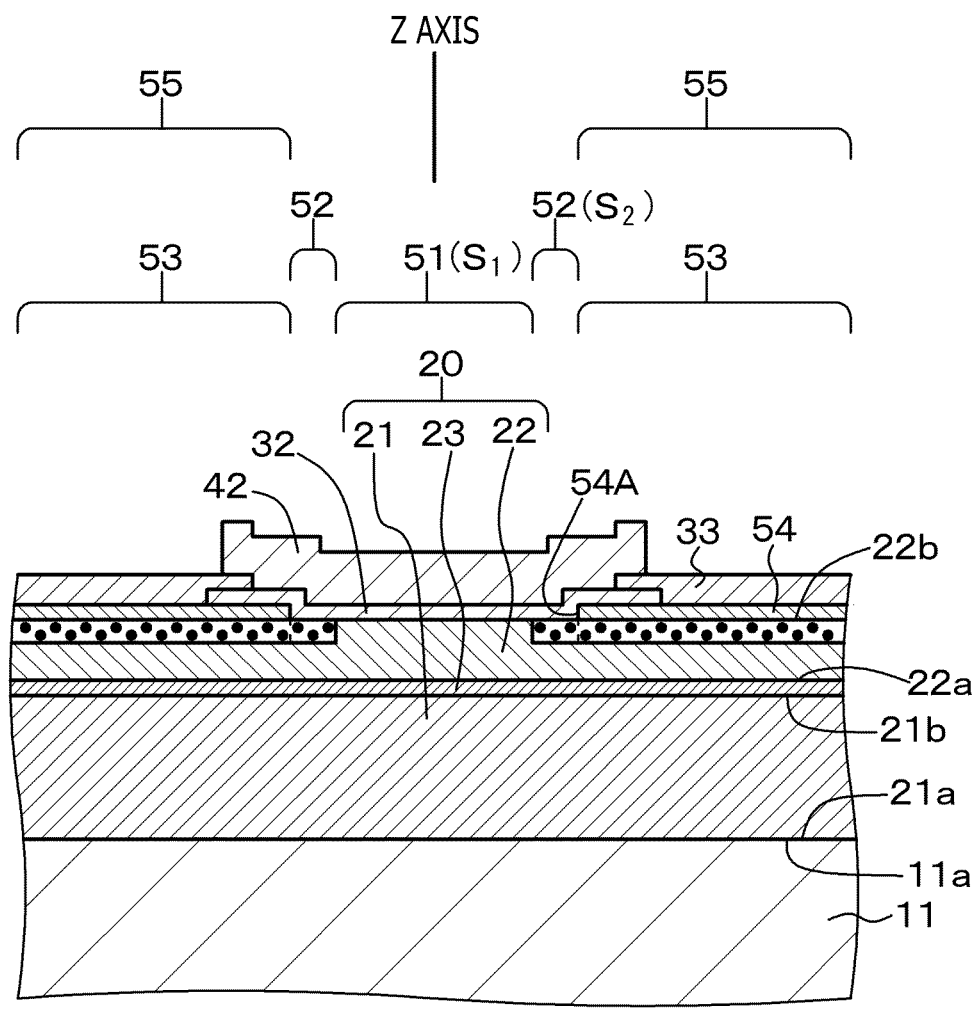

FIG. 28 is a schematic partial end view of a light emitting element of Embodiment 10.

Figure 29:
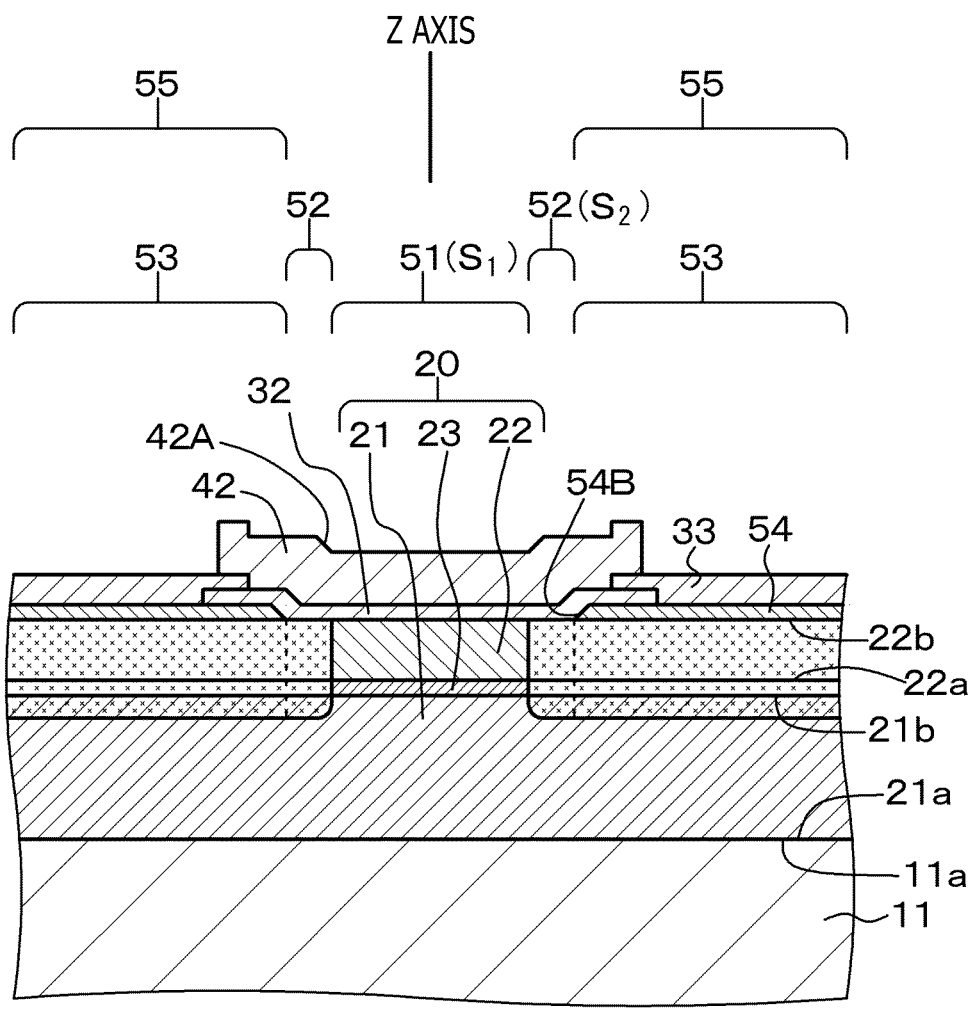

FIG. 29 is a schematic partial end view of a light emitting element of Embodiment 11.

Figure 30:
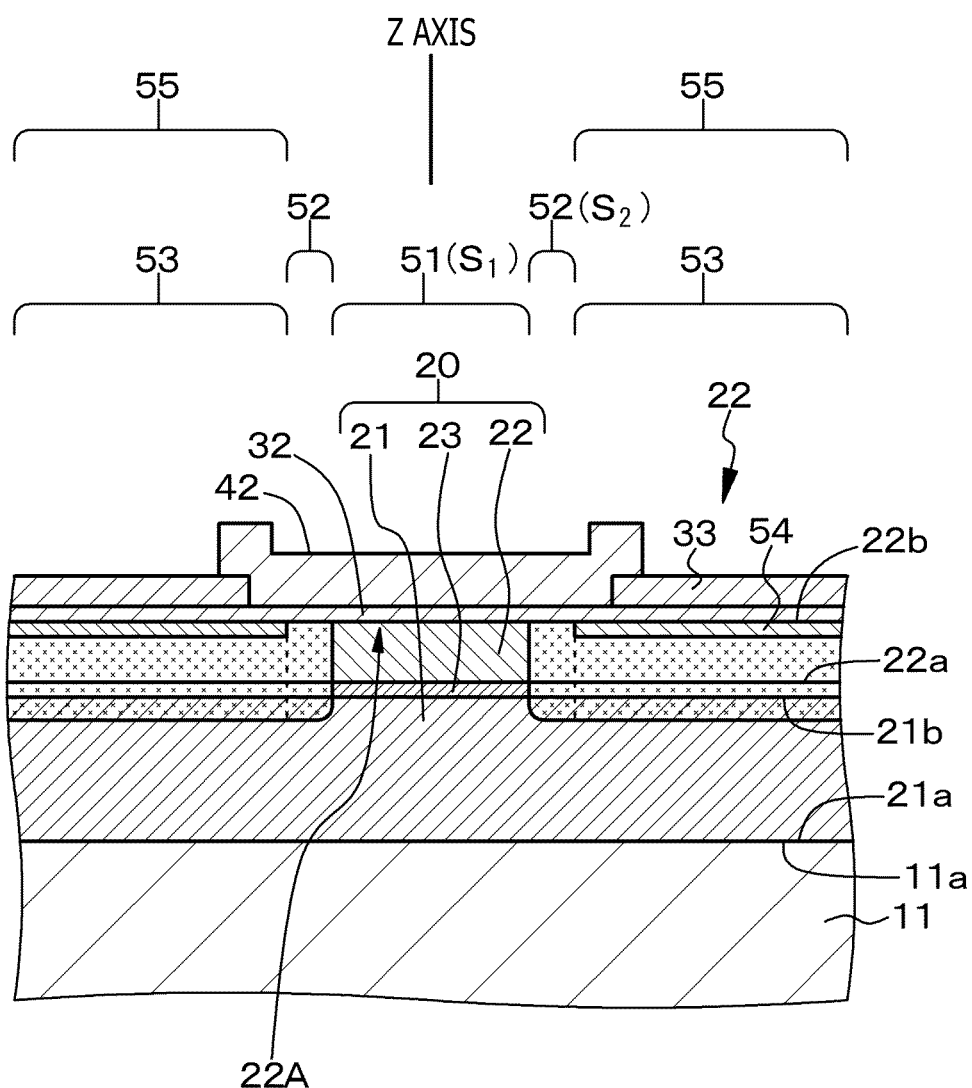

FIG. 30 is a schematic partial end view of a light emitting element of Embodiment 12.

Figure 31:
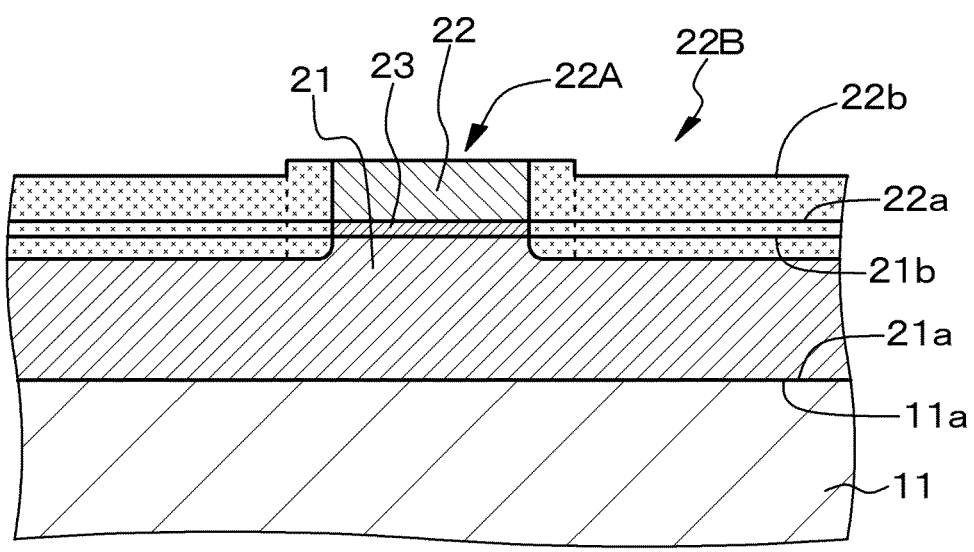

FIG. 31 is a schematic partial end view depicting a state in which an essential part of the light emitting element of Embodiment 12 depicted in FIG. 30 is cut out.

Figure 32:
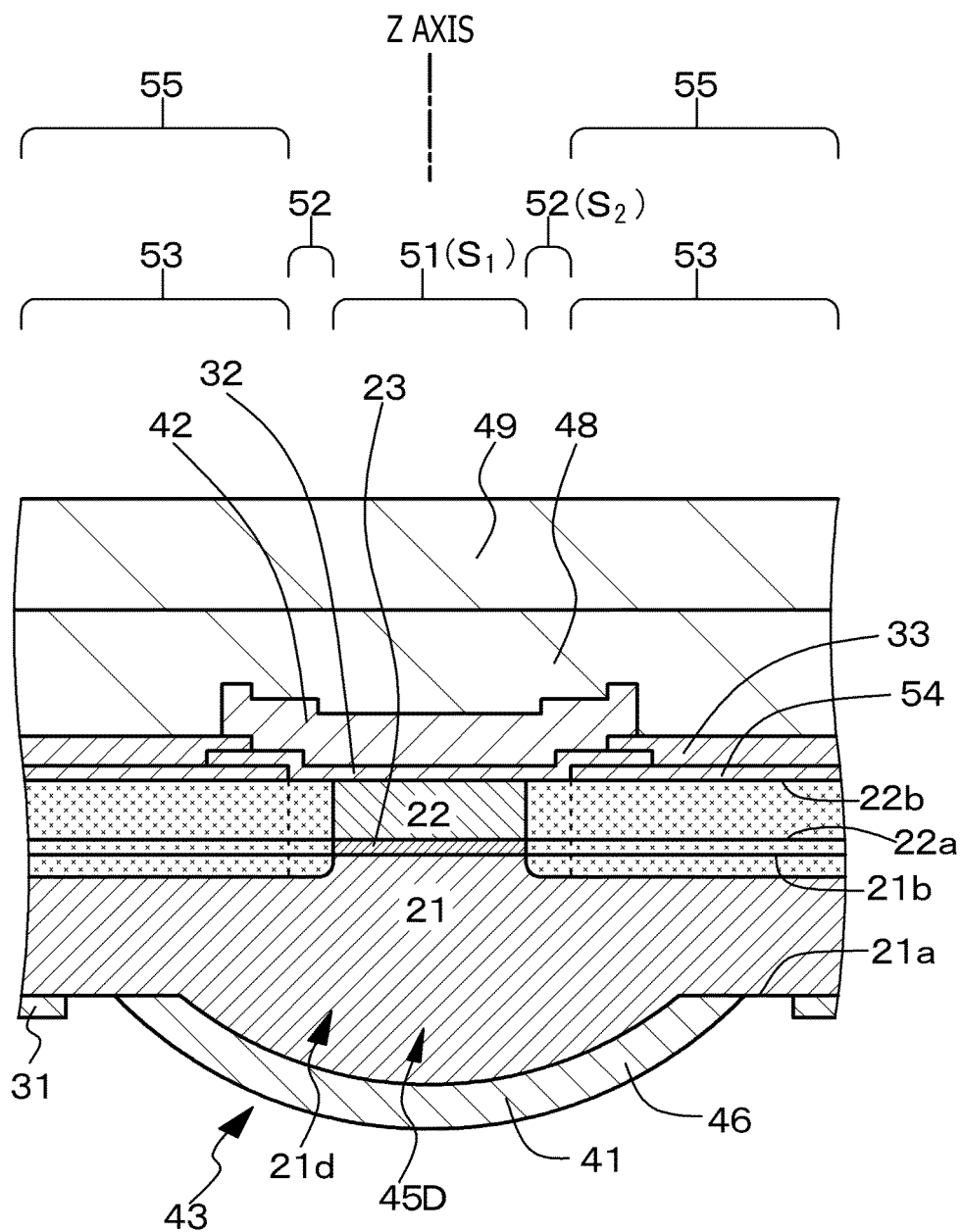

FIG. 32 is a schematic partial end view of a light emitting element of Embodiment 13.

Figure 33:
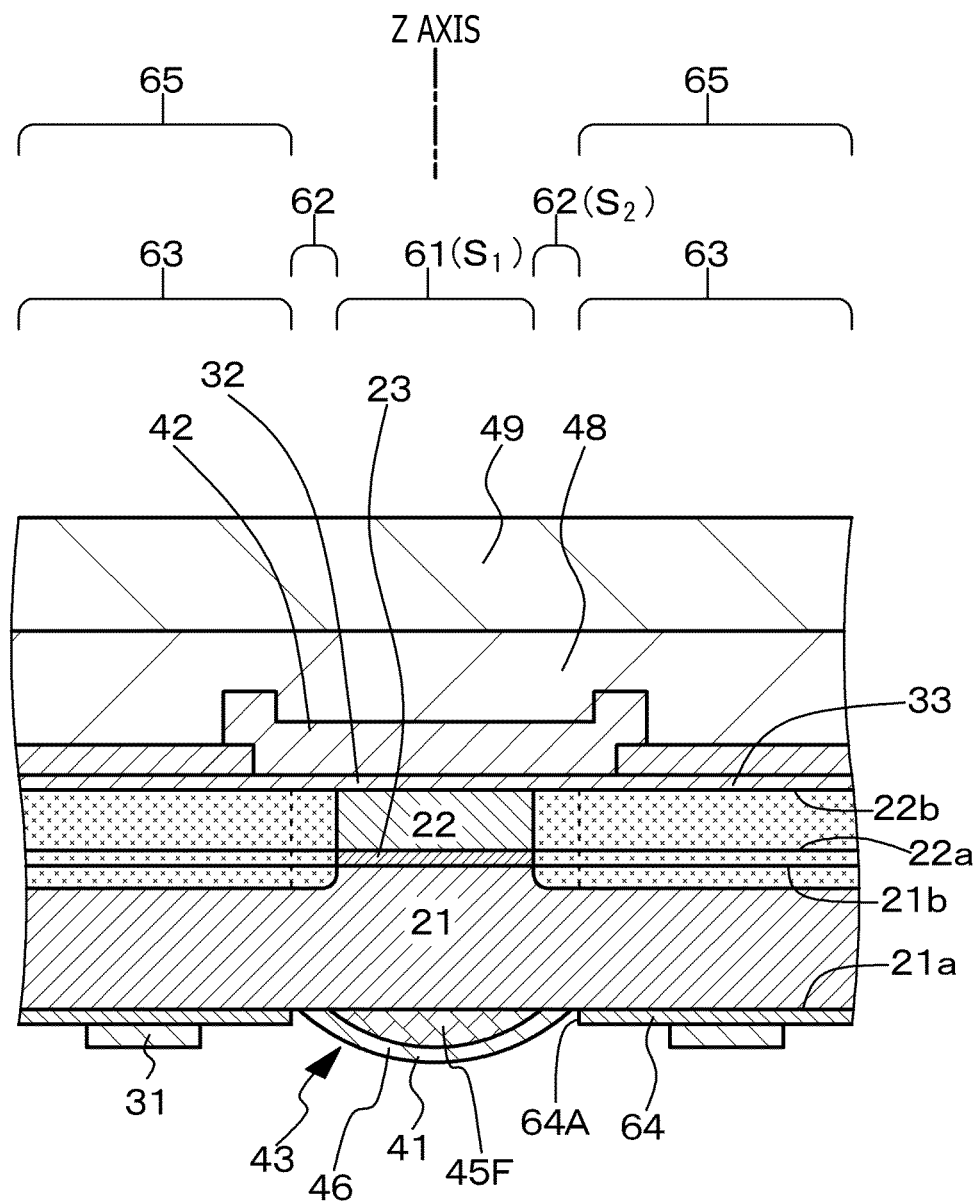

FIG. 33 is a schematic partial end view of a light emitting element of Embodiment 14.

Figure 34:
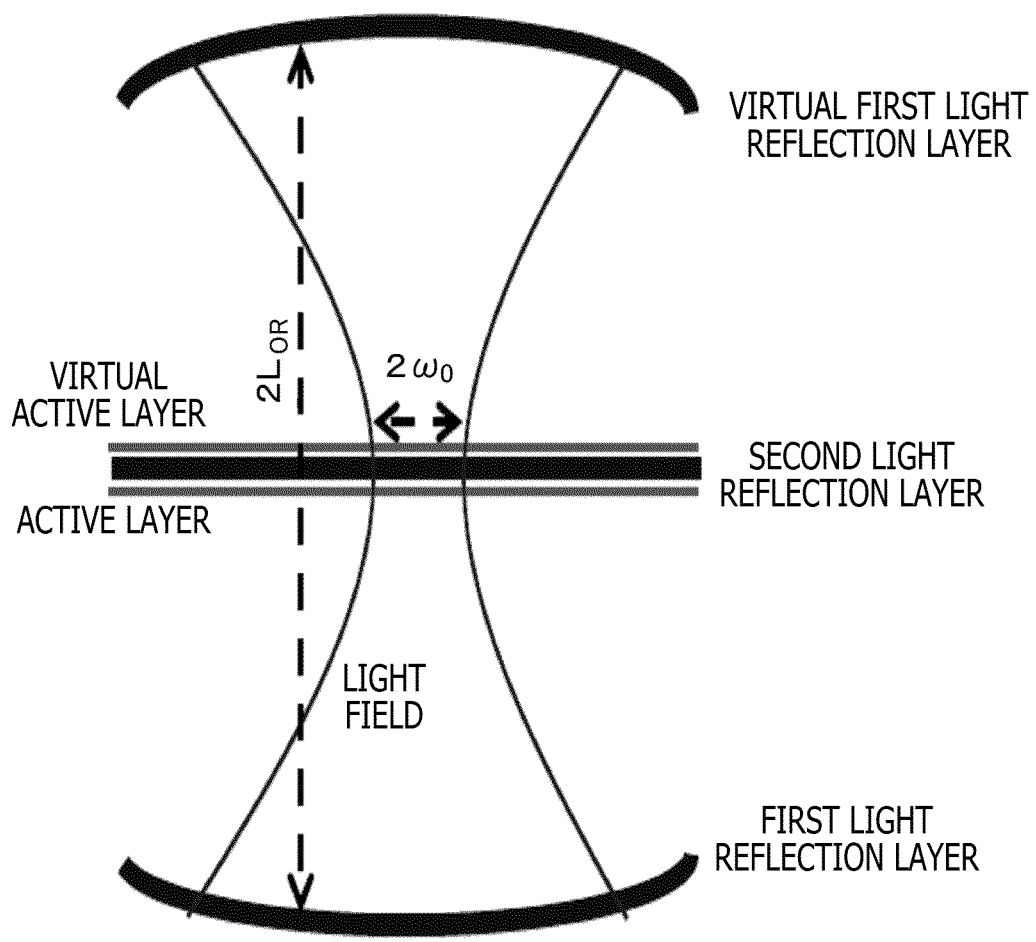

FIG. 34 is a conceptual diagram when a Fabry-Perot resonator surrounded by two recessed mirror sections having the same radius of curvature is supposed, in the light emitting element of Embodiment 8.

Figure 35:
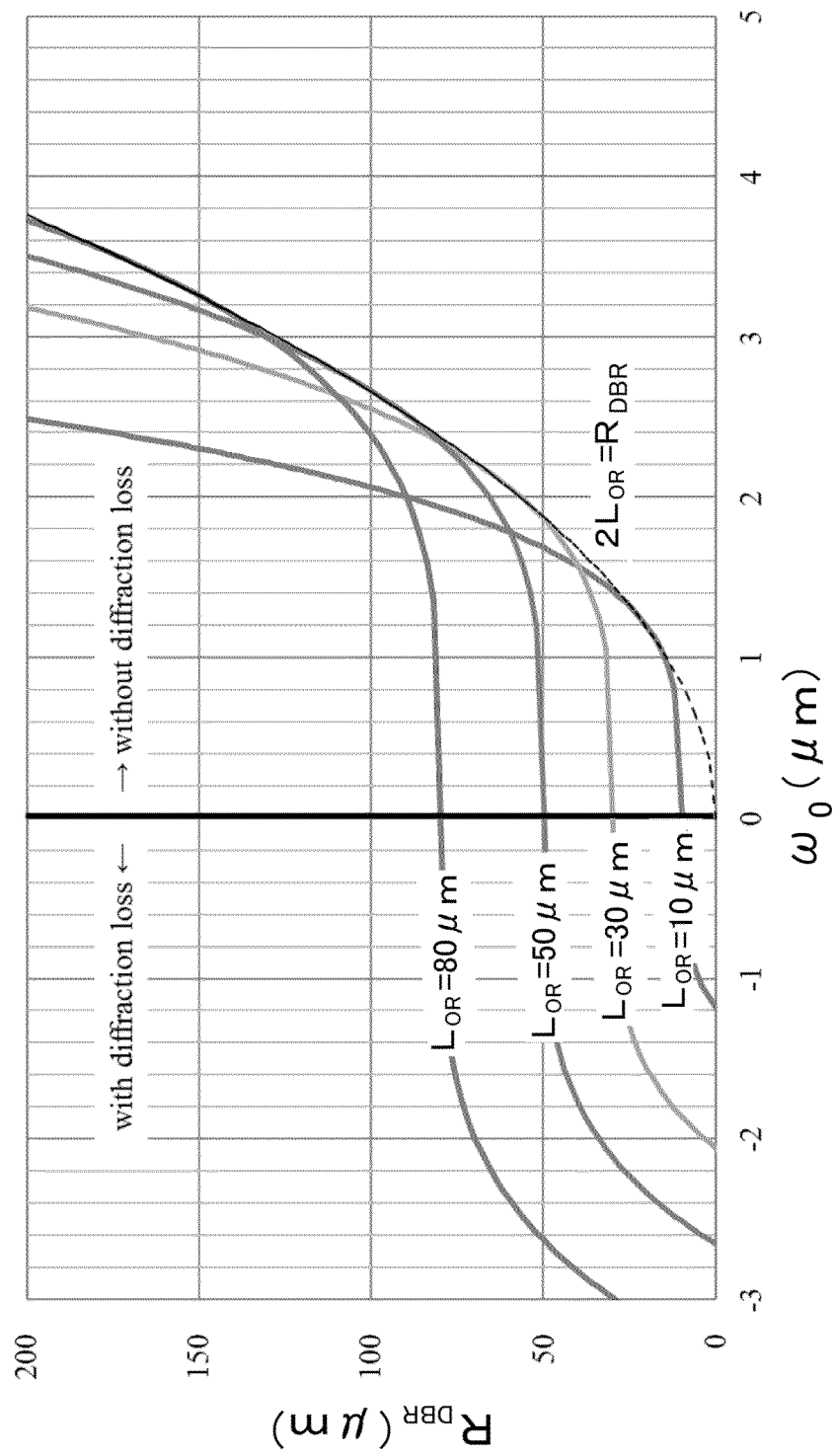

FIG. 35 is a graph depicting the relation between the value of $\omega_0$, the value of cavity length $L_{OR}$, and the value of the radius of curvature $R_{DBR}$ of a recessed mirror section of the first light reflection layer.

Figure 36:
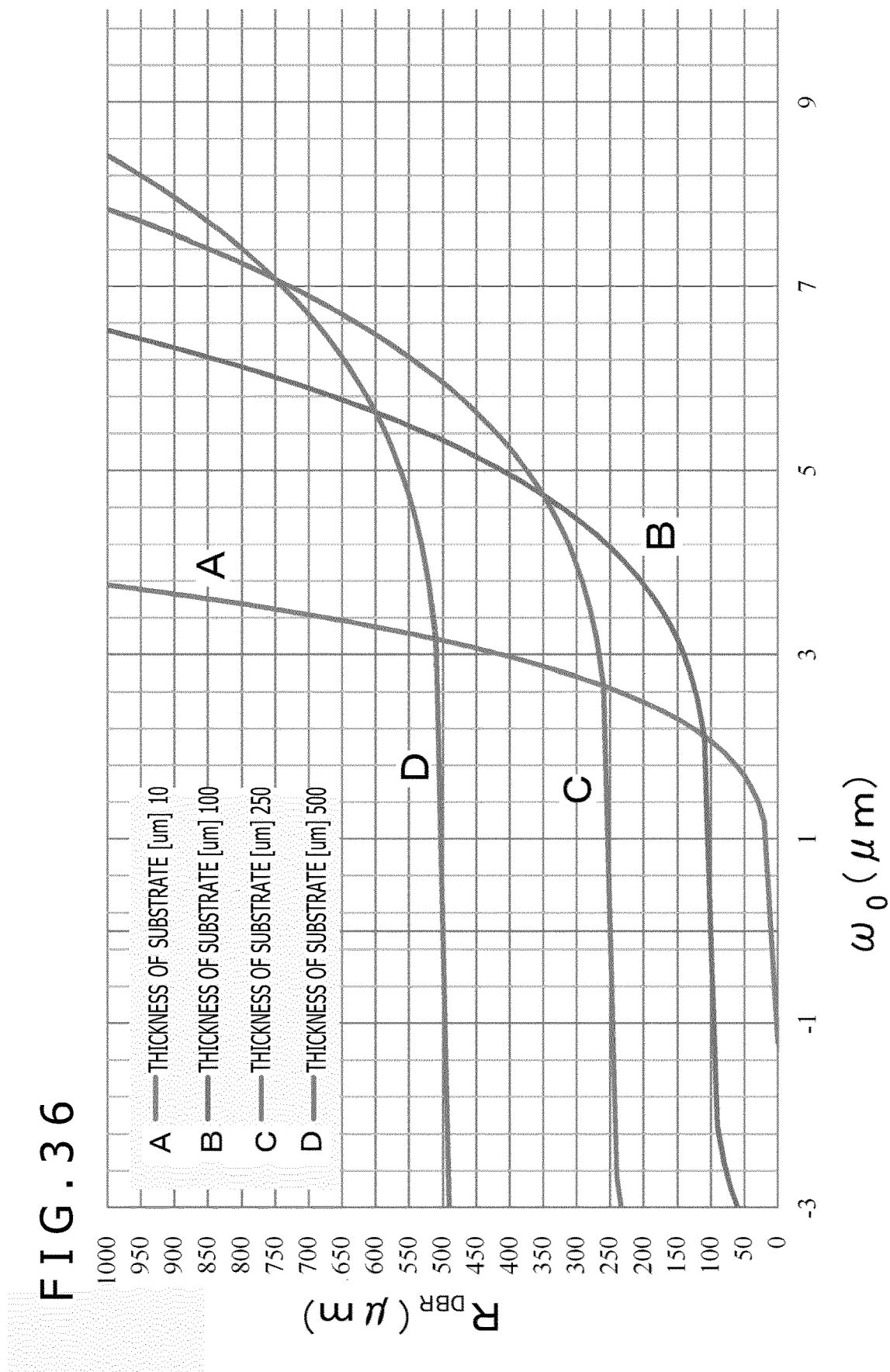

FIG. 36 is a graph depicting the relation between the value of $\omega_0$, the value of cavity length $L_{OR}$, and the value of the radius of curvature $R_{DBR}$ of a recessed mirror section of the first light reflection layer.

Figure 37A:
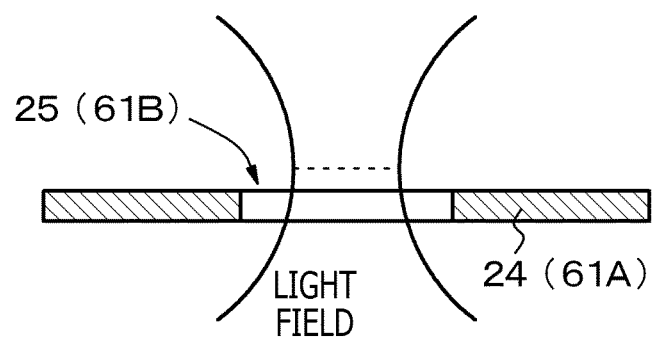
Figure 37B:
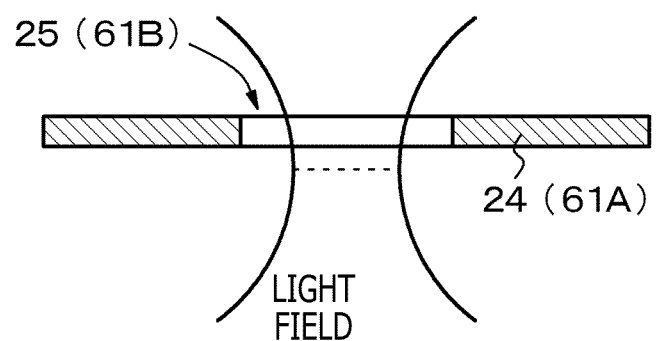

FIGS. 37A and 37B are a diagram schematically depicting a concentrated state of laser light when the value of $\omega_0$ is "positive" and a diagram schematically depicting a concentrated state of laser light when the value of $\omega_0$ is "negative," respectively.

Figure 38:
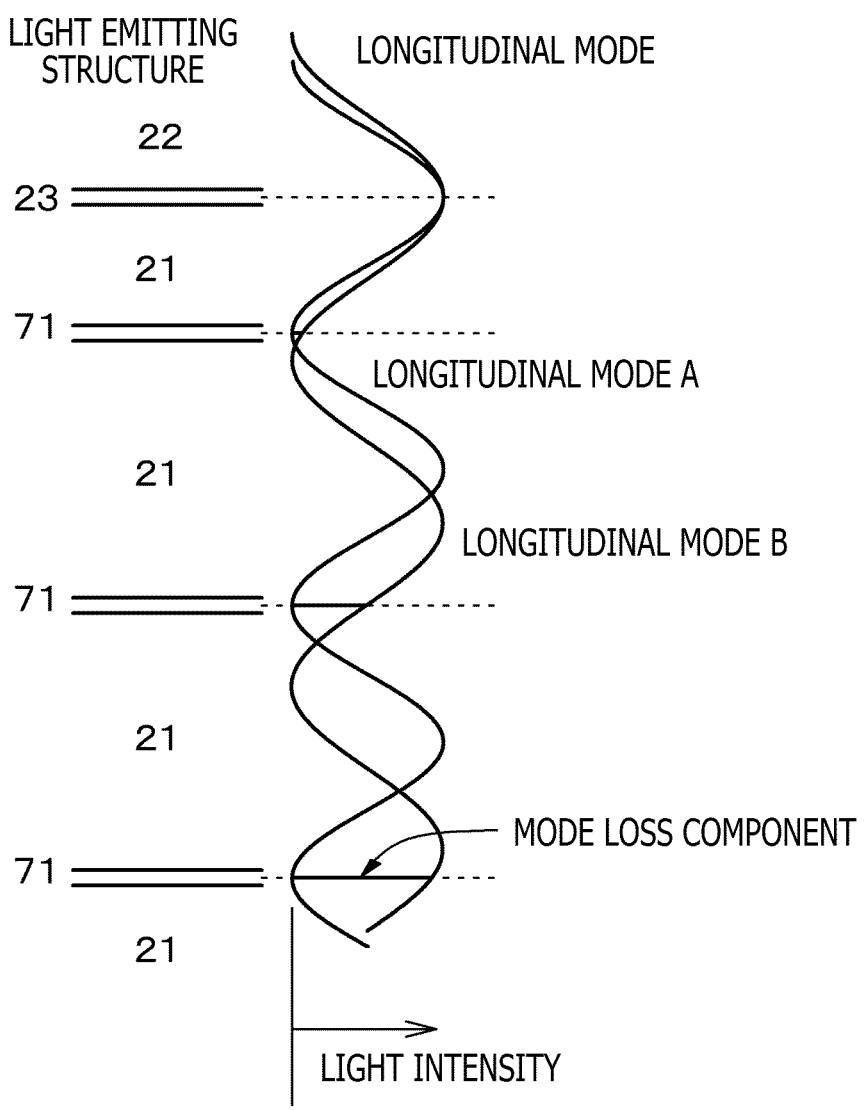

FIG. 38 is a diagram in which a schematic partial sectional view of the light emitting element of Example 1 is superposed with two longitudinal modes of a longitudinal mode A and a longitudinal mode B.

Figure 39A:
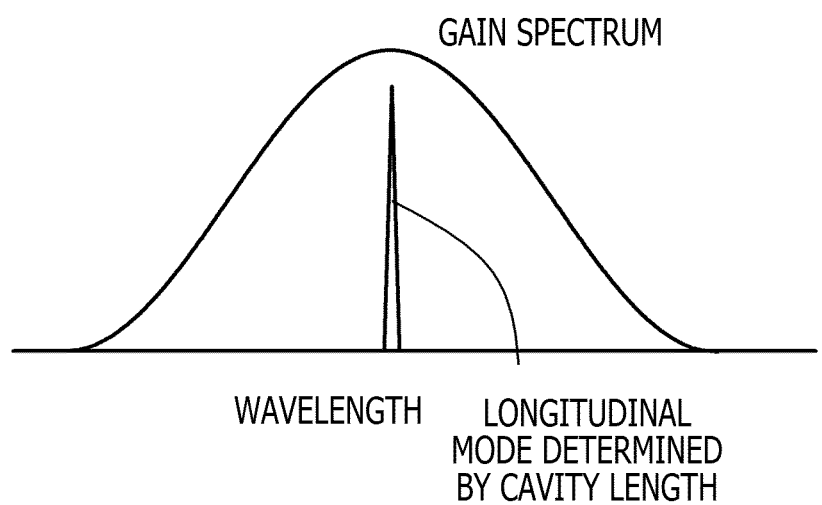
Figure 39B:
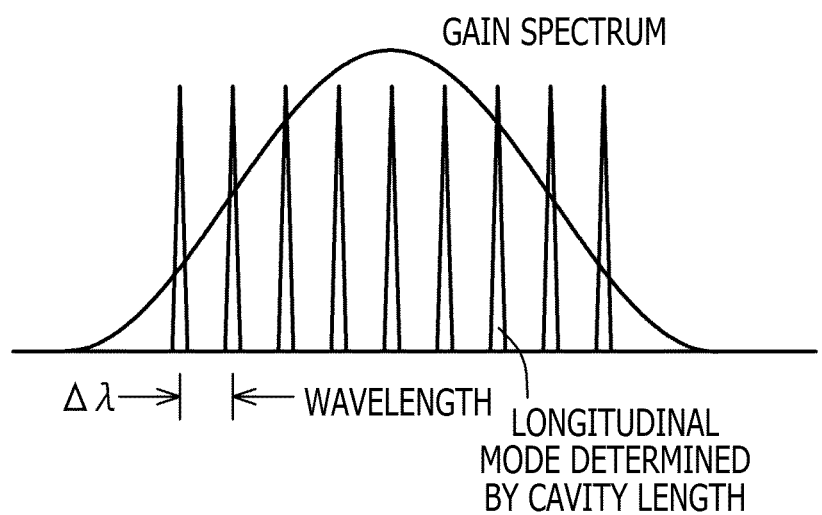

FIGS. 39A and 39B are conceptual diagrams schematically depicting longitudinal modes present in a gain spectrum determined by the active layer.

Figure 40:
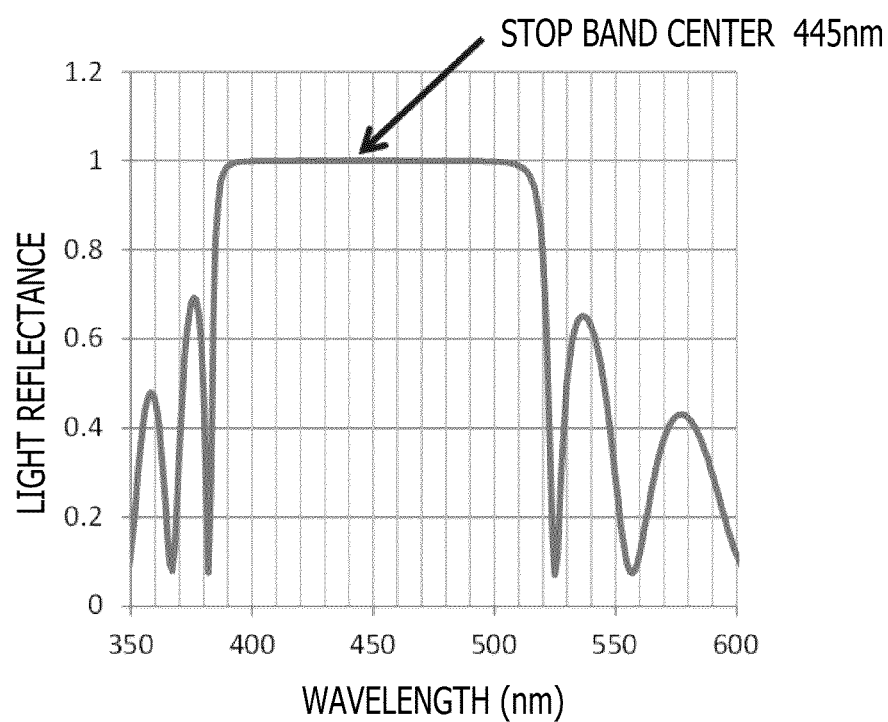

FIG. 40 is a diagram that depicts the results of measurement of light reflectance of a light reflection layer when light (incident light) is incident on the light reflection layer while the wavelength of light incident on the light reflection layer is varied and that schematically depicts the center of a stop band as a wavelength at which the light reflectance in the light reflection layer is maximized.

DESCRIPTION OF EMBODIMENTS

While the present disclosure will be described below based on embodiments thereof and referring to drawings, the present disclosure is not to be limited to the embodiments, and various numerical values and materials in the embodiments are merely illustrative. Note that the description will be made in the following order.
1. General description of light emitting elements according to first and second modes of the present disclosure
2. Embodiment 1 (Light emitting element according to first mode of present disclosure)
3. Embodiment 2 (Light emitting element according to second mode of present disclosure)
4. Embodiment 3 (Modifications of Embodiments 1 and 2)
5. Embodiment 4 (Modifications of Embodiments 1 to 3, light emitting element of (4-A)th configuration)
6. Embodiment 5 (Modification of Embodiment 4, light emitting element of (4-B)th configuration)
7. Embodiment 6 (Modifications of Embodiments 4 and 5, light emitting element of 5th configuration)
8. Embodiment 7 (Modification of Embodiment 6)
9. Embodiment 8 (Modifications of Embodiments 4 to 7, light emitting element of 1st configuration)
10. Embodiment 9 (Modifications of Embodiments 4 to 8, light emitting element of (2-A)th configuration)
11. Embodiment 10 (Modification of Embodiment 9, light emitting element of (2-B)th configuration)
12. Embodiment 11 (Modifications of Embodiments 9 and 10, light emitting element of (2-C)th configuration)
13. Embodiment 12 (Modifications of Embodiments 9 to 11, light emitting element of (2-D)th configuration)
14. Embodiment 13 (Modifications of Embodiments 9 to 12)
15. Embodiment 14 (Modifications of Embodiments 4 to 8, light emitting element of (3-A)th configuration, light emitting element of (3-B)th configuration, light emitting element of (3-C)th configuration, and light emitting element of (3-D)th configuration)
16. Others <General Description of Light Emitting Elements According to First and Second Modes of Present Disclosure>

In a light emitting element according to a first mode of the present disclosure, the value of $L_{op}$ may be $$0.95 \times \Lambda \leq L_{op} \leq 0.99 \times \Lambda, \text{ and}$$

$$T_{DBR} < T_{ave}, \text{ preferably,}$$

$$1.01 \times T_{DBR} \leq T_{ave} \leq 1.05 \times T_{DBR}$$

may be satisfied. Alternatively, the value of $L_{op}$ may be $$0.95 \times \Lambda \leq L_{op} \leq 0.99 \times \Lambda,$$

the wavelength $\lambda_{SB-C}$ at a stop band center of a light reflection layer on the side on which a light absorbing layer is located may be longer than $\lambda_0$, and it is preferable that $$1.01 \times \lambda_0 \leq \lambda_{SB-C} \leq 1.05 \times \lambda_0$$

is satisfied.

Alternatively, in the light emitting element according to the first mode of the present disclosure, the value of $L_{op}$ may be $$1.01 \times \Lambda \leq L_{op} \leq 1.05 \times \Lambda, \text{ and}$$

$$T_{ave} < T_{DBR}, \text{ preferably}$$

$$0.95 \times T_{DBR} \leq T_{ave} \leq 0.99 \times T_{DBR}$$

may be satisfied. Alternatively, the value of $L_{op}$ may be $$1.01 \times \Lambda \leq L_{op} \leq 1.05 \times \Lambda,$$

the wavelength $\lambda_{SB-C}$ at the stop band center of the light reflection layer on the side on which the light absorbing material layer is located may be shorter than $\lambda_0$, and it is preferable that $$0.95 \times \lambda_0 \leq x_{SB-C} \leq 0.99 \times \lambda_0$$

is satisfied.

Here, the wavelength at which the light reflectance of the light reflection layer is maximized is the stop band center. Specifically, as illustrated in FIG. 40, the light reflectance of the light reflection layer when light (incident light) is incident on the light reflection layer is measured while the wavelength of the light incident on the light reflection layer is varied, and the wavelength at which the light reflectance of the light reflection layer is maximized is the stop band center. In the actual light reflection layer, for example, the measurement of light reflectance is conducted at a wavelength at which the light reflectance is 80%, and the measurement result is compared with the results of simulation, whereby evaluation can be made.

In a light emitting element according to a second mode of the present disclosure, the value of $L_{op}$ may be $$0.95 \times \Lambda \leq L_{op} \leq 0.99 \times \Lambda, \text{ and}$$

$$\lambda_0/(4n_{del}) < L_{del}, \text{ preferably}$$

$$1.01 \times \lambda_0/(4n_{del}) \leq L_{del} \leq 1.05 \times \lambda_0/(4n_{del})$$

may be satisfied. Alternatively, the value of $L_{op}$ may be $$1.01 \times \Lambda \leq L_{op} \leq 1.05 \times \Lambda, \text{ and}$$

$$L_{del} < \lambda_0/(4n_{del}), \text{ preferably}$$

$$0.95 \times \lambda_0/(4n_{del}) \leq L_{del} \leq 0.99 \times \lambda_0/(4n_{del})$$

may be satisfied.

Further, in the light emitting elements according to the first and second modes of the present disclosure including the above-described preferred modes, it is preferable that the light absorbing material layer is located in the vicinity of a minimum amplitude portion generated in a standing wave of light formed inside a stacked structure. Here, let the position where the minimum amplitude portion is generated be $PS_{min-0}$ and let the positions where an amplitude of (the minimum amplitude portion)×1.05 is generated on both sides of the position $PS_{min-0}$ be $PS_{min-1}$ and $PS_{min-2}$, then the "vicinity of the minimum amplitude portion" refers to the region ranging from the position $PS_{min-1}$ to the position $PS_{min-2}$.

Further, in the light emitting elements according to the first and second modes of the present disclosure including the above-described preferred modes, it is preferable that the active layer is located in the vicinity of a maximum amplitude portion generated in the standing wave of light formed inside the stacked structure. Here, let the position where the maximum amplitude portion is generated be $P_{max-0}$ and let the positions where an amplitude of (the maximum amplitude portion)×0.95 is generated on both sides of the position $PS_{max-0}$ be $PS_{max-1}$ and $PS_{max-2}$, then the "vicinity of the maximum amplitude portion" refers to the region ranging from the position $PS_{max-1}$ to the position $PS_{max-2}$.

Further, in the light emitting elements according to the first and second modes of the present disclosure including the above-described preferred modes, the light absorbing material layer may have a light absorption coefficient of equal to or more than twice the light absorption coefficient of a compound semiconductor constituting a light emitting structure. Here, the light absorption coefficient of the light absorbing material layer and the light absorption coefficient of the compound semiconductor constituting the light emitting structure can be determined by observing the constituent materials from, for example, observation of a section of the light emitting element under an electron microscope and analogically inferring the light absorption coefficients from the known evaluation results observed for the respective constituent materials.

Further, in the light emitting elements according to the first and second modes of the present disclosure including the above-described preferred modes, the light absorbing material layer may include at least one type of material selected from the group including a compound semiconductor material narrower in bandgap than the compound semiconductor constituting the light emitting structure, a compound semiconductor material doped with an impurity, a transparent conductive material, and a dielectric material having a light absorption characteristic. Here, examples of the compound semiconductor material narrower in bandgap than the compound semiconductor constituting the light emitting structure include InGaN in the case where the compound semiconductor constituting the light emitting structure is GaN, examples of the compound semiconductor material doped with an impurity include p-GaN doped with Mg, examples of the transparent conductive material include a transparent conductive material for constituting an electrode described below, and examples of the dielectric material having a light absorption characteristic include a material for constituting a light reflection layer described below (for example, $SiO_X$, $SiN_X$, $TaO_X$, etc.). The light absorbing material layer may be formed in the first compound semiconductor layer, may be formed in the second compound semiconductor layer, may be formed at an interface between the first compound semiconductor layer and the first light reflection layer, or may be formed at an interface between the second compound semiconductor layer and the second light reflection layer. Alternatively, the light absorbing material layer may be used to function also as the electrode including the transparent conductive material described below.

Further, in the light emitting elements according to the first and second modes of the present disclosure including the above-described preferred modes, the first compound semiconductor layer, the active layer, and the second compound semiconductor layer (light emitting structure) may include a GaN-based compound semiconductor material. Here, specific examples of the GaN-based compound semiconductor include GaN, AlGaN, InGaN, and AlInGaN. Further, the compound semiconductor may contain boron (B) atoms, thallium (Tl) atoms, arsenic (As) atoms, phosphorus (P) atoms, or antimony (Sb) atoms, as desired. The active layer desirably has a quantum well structure. Specifically, the active layer may have a single quantum well structure (SQW structure) or may have a multi quantum well structure (MQW structure). The active layer having the quantum well structure has a structure in which at least one well layer and at least one barrier layer are stacked, and examples of the combination of (the compound semiconductor constituting the well layer, the compound semiconductor constituting the barrier layer) include $(In_yGa_{(1-y)}N, GaN)$, $(In_yGa_{(1-y)}N, InzGa_{(1-z)}N)$ [provided that y>z], and $(In_yGa_{(1-y)}N, AlGaN)$. The first compound semiconductor layer may include a compound semiconductor of a first conductivity type (for example, n-type), and the second compound semiconductor layer may include a compound semiconductor of a second conductivity type (for example, p-type) different from the first conductivity type. The first compound semiconductor layer and the second compound semiconductor layer are also referred to as a first clad layer and a second clad layer. It is preferable that a current constriction structure is formed between a second electrode described below and the second compound semiconductor layer. The first compound semiconductor layer and the second compound semiconductor layer may be single structure layers, may be multilayer structure layers, or may be superlattice structure layers. Further, they may be layers provided with a composition gradient layer or a concentration gradient layer.

In order to obtain the current constriction structure, a current constriction layer including an insulating material (for example, $SiO_X$, $SiN_X$, or $AlO_X$) may be formed between the second electrode described below and the second compound semiconductor layer; the second compound semiconductor layer may be etched by an RIE method or the like to form a mesa structure; a partial layer of the second compound semiconductor layer stacked may partially be oxidized from a lateral side to form a current constriction region; an impurity may be ion-injected into the second compound semiconductor layer to form a region in which conductivity is lowered; or these methods may be combined as required. It is to be noted, however, that the second electrode should be electrically connected with that part of the second compound semiconductor layer in which a current flows due to current constriction.

In the following description, that surface of the first compound semiconductor layer which faces the active layer (light emitting layer) may be referred to as a second surface of the first compound semiconductor layer, and that surface of the first compound semiconductor layer which is opposite to the second surface of the first compound semiconductor layer may be referred to as a first surface of the first compound semiconductor layer. In addition, that surface of the second compound semiconductor layer which faces the active layer may be referred to as a first surface of the second compound semiconductor layer, and that surface of the second compound semiconductor layer which is opposite to the first surface of the second compound semiconductor layer may be referred to as a second surface of the second compound semiconductor layer.

In the light emitting elements according to the first and second modes of the present disclosure, let the respective thicknesses of the active layer, the light absorbing material layer, and each of the layers constituting the part of the light emitting structure located between the active layer and the light absorbing material layer be $t_j$ and let the respective refractive indices of the layers be $n_j$, then, the equivalent refractive index $n_{eq}$ of the layers occupying layers ranging from the active layer to the light absorbing material layer is represented by $$n_{eq}=\Sigma(t_j \times n_j)/\Sigma(t_j)$$

where j=1, 2, 3, . . . , J, "J" is the total number of the active layer, the light absorbing material layer, and the layers constituting the part of the light emitting structure located between the active layer and the light absorbing material layer, and "Σ" means to sum up from j=1 to j=J. The equivalent refractive index $n_{eq}$ may be calculated by observing the constituent materials from, for example, observation of a section of the light emitting element under an electron microscope and calculating the equivalent refractive index $n_{eq}$, based on the refractive indices known for the respective constituent materials and the thicknesses obtained by the observation.

In the light emitting elements according to the first and second modes of the present disclosure, the optical distance $L_{op}$ from the active layer to the light absorbing material layer refers to the optical distance from the thickness-directional center of the active layer to the thickness-directional center of the light absorbing material layer. In addition, in the light emitting element according to the second mode of the present disclosure, the optical distance Lad from the light absorbing material layer to the interface between the light reflection layer on the side on which the light absorbing material layer is located and the dielectric layer refers to the optical distance from the thickness-directional center of the light absorbing material layer to the interface between the light reflection layer on the side on which the light absorbing material layer is located and the dielectric layer.

In the light emitting elements according to the first and second modes of the present disclosure including the above-described preferred modes (hereinafter these may collectively be referred to as the "light emitting elements of the present disclosure or the like"), it is preferable that the thickness of the light absorbing material layer is equal to or less than $\lambda_0/(4 \cdot n_{eq})$. As an example of a lower limit for the thickness of the light absorbing material layer, 1 nm may be mentioned.

Examples of a method of forming various compound semiconductor layers constituting the light emitting element include an MOCVD method (Metal Organic-Chemical Vapor Deposition method), an MOVPE method (Metal Organic-Vapor Phase Epitaxy method), a molecular beam epitaxy method (MBE method), a hydride vapor phase growth method in which a halogen contributes to transport or reaction (HVPE method), an ALD method (Atomic Layer Deposition method), a migration enhanced epitaxy method (MEE method), and a plasma-assisted physical vapor deposition method (PPD method), but these are non-limitative. Here, as an organogallium source gas in the MOCVD method, trimethylgallium (TMG) gas and triethylgallium (TEG) gas may be mentioned, and, as a nitrogen source gas, ammonium gas and hydrazine gas may be mentioned. In forming a GaN-based compound semiconductor layer having an n-type conductivity type, for example, silicon (Si) may be added as an n-type impurity (n-type dopant), and, in forming a GaN-based compound semiconductor layer having a p-type conductivity type, for example, magnesium (Mg) may be added as a p-type impurity (p-type dopant). In the case where aluminum (Al) or indium (In) is contained as constituent atoms of the GaN-based compound semiconductor layer, trimethylaluminum (TMA) gas may be used as an Al source, and trimethyl indium (TMI) gas may be used as an In source. Further, monosilane gas ($SiH_4$ gas) may be used as a Si source, while biscyclopentadienylmagnesium gas, methylcyclopentadienylmagnesium, or biscyclopentadienylmagnesium ($Cp_2Mg$) may be used as an Mg source. Note that Ge, Se, Sn, C, Te, S, O, Pd, and Po may be mentioned, other than Si, as an n-type impurity (n-type dopant), whereas Zn, Cd, Be, Ca, Ba, C, Hg, and Sr may be mentioned, other than Mg, as a p-type impurity (p-type dopant).

A first electrode electrically connected to the first compound semiconductor layer is formed, and the second electrode is formed in contact with the second compound semiconductor layer. The first electrode is formed in contact with the first compound semiconductor layer or is electrically connected to the first compound semiconductor layer through a substrate. The first electrode may include a metal or an alloy, while the second electrode may include a transparent conductive material. With the second electrode including the transparent conductive material, a current can be spread in lateral directions (in-plane directions of the second compound semiconductor layer), and the current can efficiently be supplied to an element region. It is preferable that the second electrode is formed on the second surface of the second compound semiconductor layer, and the second light reflection layer is formed on or on the upper side of the second electrode. Here, the "element region" refers to a region into which a constricted current is injected, a region in which light is confined due to a refractive index difference or the like, a region which is interposed between the first light reflection layer and the second light reflection layer and in which laser oscillation is generated, or a region which is interposed between the first light reflection layer and the second light reflection layer and which actually contributes to laser oscillation.

In the light emitting elements of the present disclosure including the above-described various preferred modes, the light generated in the active layer may be emitted to the exterior via the second light reflection layer (hereinafter, the light emitting element in this mode will be referred to as the "light emitting element of the second light reflection layer emission type" for the sake of convenience) or may be emitted to the exterior via the first light reflection layer (hereinafter, the light emitting element in this mode will be referred to as the "light emitting element of the first light reflection layer emission type" for the sake of convenience). Note that in the light emitting element of the first light reflection layer emission type, the substrate (light emitting element production substrate) may be removed in some cases. In the case of removing the substrate (light emitting element production substrate), the second light reflection layer may be fixed to a support substrate. The light emitting element may include a surface-emitting laser element (vertical-cavity surface-emitting laser, VCSEL) in which light is emitted from a top surface of the first compound semiconductor layer via the first light reflection layer or may include a surface-emitting laser element in which light is emitted from a top surface of the second compound semiconductor layer via the second light reflection layer.

In the case of removing the substrate (light emitting element production substrate), for example, the first light reflection layer and the first compound semiconductor layer may be formed over the substrate, then, the active layer, the second compound semiconductor layer, the second electrode, and the second light reflection layer may sequentially be formed over the first compound semiconductor layer (including formation of the light absorbing material layer), and, thereafter, the substrate may be removed, with the first light reflection layer as a stopper layer. Specifically, for example, the first light reflection layer and the first compound semiconductor layer are formed over the substrate, then, the active layer, the second compound semiconductor layer, the second electrode, and the second light reflection layer may sequentially be formed over the first compound semiconductor layer (including formation of the light absorbing material layer), next, the second light reflection layer may be fixed to the support substrate, and thereafter, the substrate is removed, with the first light reflection layer as a stopper layer, to expose the first compound semiconductor layer (the first surface of the first compound semiconductor layer) and the first light reflection layer. Further, the first electrode may be formed on the first compound semiconductor layer (the first surface of the first compound semiconductor layer). Alternatively, when the removal amount is controlled based on the removal rate (polishing rate) of the substrate, the stopper layer may not necessarily be used.

The removal of the substrate (light emitting element production substrate) may be conducted based on a chemical/mechanical polishing method (CMP method). Note that, first, removal of part of the substrate may be performed by a wet etching method using an aqueous alkali solution such as an aqueous sodium hydroxide solution and an aqueous potassium hydroxide solution, an ammonium solution+aqueous hydrogen peroxide solution, a sulfuric acid solution+aqueous hydrogen peroxide solution, a hydrochloric acid solution+aqueous hydrogen peroxide solution, a phosphoric acid solution+aqueous hydrogen peroxide solution or the like, a dry etching method, a lift-off method using laser, a mechanical polishing method or the like, or a combination of these, or the thickness of the substrate may be reduced, and next, the chemical/mechanical polishing method may be conducted, to exposed the first compound semiconductor layer (the first surface of the first compound semiconductor layer) and the first light reflection layer.

Examples of the substrate (light emitting element production substrate) include a GaN substrate, a sapphire substrate, a GaAs substrate, an SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, a Si substrate, and substrates obtained by forming a ground layer or a buffer layer over a surface (main surface) of these substrates. In the case of forming a GaN-based compound semiconductor layer on a substrate, use of a GaN substrate is preferred, from the viewpoint of low defect density thereof. While the GaN substrate varies in characteristic as polar/nonpolar/semipolar depending on the growth surface, any main surface (second surface) of the GaN substrate can be used for formation of a compound semiconductor layer. In addition, in regard of the main surface of these substrates, crystal orientation planes that are generally called an A plane, a B plane, a C plane, an R plane, an M plane, an N plane, an S plane and the like or planes obtained by turning off these planes to specific directions can also be used, depending on the crystal structure (for example, cubic type, hexagonal type or the like).

The support substrate may include, for example, any of the various substrates mentioned as examples of the light emitting element production substrate, or may include an insulating substrate including AlN or the like, a semiconductor substrate including Si, SiC, Ge or the like, a metallic substrate, or an alloy-based substrate, but it is preferable to use a conductive substrate. Alternatively, a metallic substrate or an alloy-based substrate is preferably used from the viewpoints of mechanical characteristics, elastic deformation, plastic deformation property, heat dissipation property and the like. As an example of the thickness of the support substrate, 0.05 to 1 mm may be mentioned. Examples of a fixing method usable for fixing the second light reflection layer to the support substrate include known methods such as a solder joining method, a normal temperature joining method, a joining method using a pressure sensitive adhesive tape, a joining method using wax joining, a method using an adhesive, but, from the viewpoint of securing conductivity, it is desirable to adopt the solder joining method or the normal temperature joining method. For example, in the case where a silicon semiconductor substrate which is a conductive substrate is used as the support substrate, it is desirable, for restraining warping due to the difference in thermal expansion coefficient, to adopt a joining method by which joining at a low temperature of 400° C. or below can be achieved. In the case where a GaN substrate is used as the support substrate, the joining temperature may be equal to or higher than 400° C.

In the light emitting element of the first reflection layer emission type, in the case of removing the substrate, examples of the layout state of the first light reflection layer and the first electrode over the first surface of the first compound semiconductor layer may include a state in which the first light reflection layer and the first electrode are in contact with each other or a state in which the first light reflection layer and the first electrode are spaced from each other, or, in some cases, a state in which the first electrode is formed ranging to the upper side of an edge portion of the first light reflection layer or a state in which the first light reflection layer is formed ranging to the upper side of an edge portion of the first electrode. Here, in the case of the state in which the first light reflection layer is formed ranging to the upper side of the edge portion of the first electrode, the first electrode should have an opening of a certain extent of size, in order to minimize its absorption of light in fundamental mode of laser oscillation. The size of the opening varies depending on the wavelength of the fundamental mode and a light confining structure in lateral directions (in-plane directions of the first compound semiconductor layer), so that it is not limited, but is preferably on the order of several times $\lambda_0$. Alternatively, the first light reflection layer and the first electrode may be spaced from each other, that is, they may have an offset, and the spaced-apart distance may be within 1 mm.

Further, in the light emitting elements of the present disclosure including the above-described various preferred modes, the surface roughness Ra of the second compound semiconductor layer (the second surface of the second compound semiconductor layer) is preferably equal to or less than 1.0 nm. The surface roughness Ra is defined in JIS B-610:2001 and, specifically, can be measured on the basis of observation based on AFM or section TEM.

The first electrode desirably has, for example, a monolayer or multilayer configuration including at least one metal (inclusive of alloy) selected from the group including gold (Au), silver (Ag), palladium (Pd), platinum (Pt), nickel (Ni), Ti (titanium), vanadium (V), tungsten (W), chromium (Cr), Al (aluminum), Cu (copper), Zn (zinc), tin (Sn), and indium (In). Specific examples include Ti/Au, Ti/Al, Ti/Al/Au, Ti/Pt/Au, Ni/Au, Ni/Au/Pt, Ni/Pt, Pd/Pt, and Ag/Pd. Note that the layer on the former side of "/" in the multilayer configuration is located on the more active layer side. This also applies to the following description. The first electrode can be formed in a film form, for example, by a PVD method such as a vacuum deposition method and a sputtering method.

Examples of the transparent conductive material constituting the second electrode include indium-based transparent conductive materials [specifically, for example, indium tin oxide (ITO, inclusive of Sn-doped $In_2O_3$, crystalline ITO, and amorphous ITO), indium zinc oxide (IZO), indium gallium oxide (IGO), indium-doped gallium zinc oxide (IGZO, In—$GaZnO_4$), IFO (F-doped $In_2O_3$), ITiO (Ti-doped $In_2O_3$), InSn, InSnZnO], tin-based transparent conductive materials [specifically, for example, tin oxide ($SnO_2$), ATO (Sb-doped $SnO_2$), FTO (F-doped $SnO_2$)], zinc-based transparent conductive material [specifically, for example, zinc oxide (ZnO, inclusive of Al-doped ZnO (AZO) and B-doped ZnO), gallium-doped zinc oxide (GZO), AlMgZnO (aluminum oxide- and magnesium oxide-doped zinc oxide)], and NiO. Alternatively, examples of the second electrode include transparent conductive films including gallium oxide, titanium oxide, niobium oxide, antimony oxide, nickel oxide or the like as a parent layer and include transparent conductive materials such as spinel-type oxide or an oxide having a $YbFe_2O_4$ structure. It is to be noted, however, that though depending on the layout state of the second light reflection layer and the second electrode, the material constituting the second electrode is not limited to the transparent conductive materials, and metals such as palladium (Pd), platinum (Pt), nickel (Ni), gold (Au), cobalt (Co), and rhodium (Rh) can also be used. The second electrode is only required to include at least one of these materials. The second electrode can be formed in a film form, for example, by a PVD method such as a vacuum deposition method and a sputtering method. Alternatively, a semiconductor layer low in resistance may be used as a transparent electrode layer; in this case, specifically, an n-type GaN-based compound semiconductor layer may also be used. Further, in the case where a layer adjacent to the n-type GaN-based compound semiconductor layer is of a p-type, it is possible, by joining the two layers through a tunnel junction, to lower the electric resistance at the interface.

A pad electrode may be provided on the first electrode and the second electrode, for electrical connection to an external electrode or circuit. It is desirable that the pad electrode has a single layer configuration or multilayer configuration that includes at least one metal selected from the group including Ti (titanium), aluminum (Al), Pt (platinum), Au (gold), Ni (nickel), and Pd (palladium). Alternatively, the pad electrode may have a multilayer configuration, examples of which include a multilayer configuration of Ti/Pt/Au, a multilayer configuration of Ti/Au, a multilayer configuration of Ti/Pd/Au, a multilayer configuration of Ti/Pd/Au, a multilayer configuration of Ti/Ni/Au, and a multilayer configuration of Ti/Ni/Au/Cr/Au. In the case where the first electrode includes an Ag layer or an Ag/Pd layer, it is preferable to form a cover metal layer including, for example, Ni/TiW/Pd/TiW/Ni on a surface of the first electrode and to form a pad electrode including, for example, a multilayer configuration of Ti/Ni/Au or a multilayer configuration of Ti/Ni/Au/Cr/Au on the cover metal layer.

The light reflection layer (Distributed Bragg Reflector layer, DBR layer) includes, for example, a semiconductor multilayer film or a dielectric multilayer film. Examples of the dielectric material include oxides, nitrides (for example, $SiN_X$, $AlN_X$, AlGaN, $GaN_X$, $BN_X$, etc.), or fluorides and the like of Si, Mg, Al, Hf, Nb, Zr, Sc, Ta, Ga, Zn, Y, B, Ti and the like. Specific examples include $SiO_X$, $TiO_X$, $NbO_X$, $ZrO_X$, $TaO_X$, $ZnO_X$, $AlO_X$, $HfO_X$, $SiN_X$, and $AlN_X$. Of these dielectric materials, two or more kinds of dielectric films including dielectric materials having different refractive indices may alternately be stacked, whereby the light reflection layer can be obtained. For example, multilayer films of $SiO_X/SiN_Y$, $SiO_X/TaO_X$, $SiO_X/NbO_Y$, $SiO_X/ZrO_Y$, $SiO_X/AlN_Y$ or the like are preferred. For obtaining a desired light reflectance, the materials constituting each dielectric film, film thickness, the number of films stacked and the like may be selected, as required. The thickness of each dielectric film can be adjusted, as required, according to the material used or the like, and is determined by $\lambda_0$ and the refractive index n of the material used at $\lambda_0$. Specifically, the thickness is preferably an odd number times, or a value around the odd number times, $\lambda_0/(4n)$. For example, in the case where the light reflection layer includes $SiO_X/NbO_Y$ in a light emitting element with a $\lambda_0$ of 410 nm, a value on the order of 40 to 70 nm may be mentioned as an example of the thickness. The number of films stacked may be, for example, equal to or more than two, preferably on the order of 5 to 20. The thickness of the light reflection layer as a whole may be, for example, on the order of 0.6 to 1.7 μm. In addition, the light reflectance of the light reflection layer is desirably equal to or more than 95%.

Alternatively, it is desirable that the first light reflection layer includes a dielectric film containing at least N (nitrogen) atoms, and, further, it is more desirable that the dielectric film containing N atoms is an uppermost layer of the dielectric multilayer film. Alternatively, it is desirable that the first light reflection layer is covered with a dielectric material layer containing at least N (nitrogen) atoms. Alternatively, it is desirable to subject the surface of the first light reflection layer to a nitriding treatment to cause the surface of the first light reflection layer to be a layer containing at least N (nitrogen) atoms (hereinafter referred to as the "surface layer" for the sake of convenience). The thickness of the dielectric film or dielectric material layer or the surface layer containing at least N atoms is preferably an odd number times, or a value around the odd number times, $\lambda_0/(4n)$. Specific examples of the material constituting the dielectric film or dielectric material layer containing at least N atoms include $SiN_X$ and $SiO_XN_Z$. With the dielectric film or dielectric material layer or the surface layer containing at least N atoms being thus formed, it is ensured that, when the compound semiconductor layer covering the first light reflection layer is formed, deviation between the crystal axis of the compound semiconductor layer covering the first light reflection layer and the crystal axis of a light emitting element production substrate can be improved, and the quality of the light emitting structure to serve as a resonator can be enhanced.

The light reflection layer can be formed based on known methods, specific examples of which include PVD methods such as a vacuum deposition method, a sputtering method, a reactive sputtering method, an ECR plasma sputtering method, a magnetron sputtering method, an ion beam assisted vapor deposition method, an ion plating method, and a laser ablation method; various CVD methods; coating methods such as a spraying method, a spin coating method, and a dipping method; methods by combining two or more of these methods; and methods by combining these methods with one or more of total or partial pretreatment, irradiation with an inert gas (Ar, He, Xe or the like) or plasma, irradiation with oxygen gas, ozone gas, or plasma, an oxidizing treatment (heat treatment), and an exposure treatment.

The light reflection layer is not particularly limited in size and shape, insofar as it covers a current injection region (described below) or an element region. Specific examples of the shapes of the element region, the first light reflection layer, the second light reflection layer, the boundary between the current injection region and a current non-injection inside region, the shape of the boundary between the current non-injection inside region and the current non-injection outside region, and the plan-view shapes of openings provided in the element region and a current constriction region include a circle, ellipses, rectangles, and polygons (triangle, tetragons, hexagons, etc.). In addition, examples of the plan-view shape of the first electrode include annular shapes. The plan-view shapes of the element region, the first light reflection layer, and the second light reflection layer, the plan-view shape of the opening provided in the current constriction layer, the plan-view shape of an inside ring of the annular first electrode, the shape of the boundary between the current injection region and the current non-injection inside region, and the shape of the boundary between the current non-injection inside region and the current non-injection outside region are desirably similar shapes. In the case where the shape of the boundary between the current injection region and the current non-injection inside region is circular, the diameter is preferably on the order of 5 to 100 μm. Here, the "element region" refers to a region into which a constricted current is injected, a region in which light is confined due to a refractive index difference or the like, a region which is interposed between the first light reflection layer and the second light reflection layer and in which laser oscillation is generated, or the region which is interposed between the first light reflection layer and the second light reflection layer and which actually contributes to laser oscillation.

Side surfaces and exposed surfaces of the stacked structure and the light emitting structure may be covered with a coating layer. Formation of the coating layer can be conducted based on a known method. It is preferable that the refractive index of a material constituting the coating layer is smaller than the refractive indices of the materials constituting the stacked structure and the light emitting structure. Examples of an insulating material constituting the coating layer include $SiO_X$-based materials including $SiO_2$, $SiN_X$-based materials, $SiO_XN_Z$-based materials, $TaO_X$, $ZrO_X$, $AlN_X$, $AlO_X$, and $GaO_X$ and organic materials such as polyimide resins. Examples of the method of forming the coating layer include PVD methods such as a vacuum deposition method and a sputtering method and CVD methods, and the coating layer can also be formed based on coating methods.

Embodiment 1

Embodiment 1 relates to a light emitting element according to a first mode of the present disclosure.

Figure 1A:
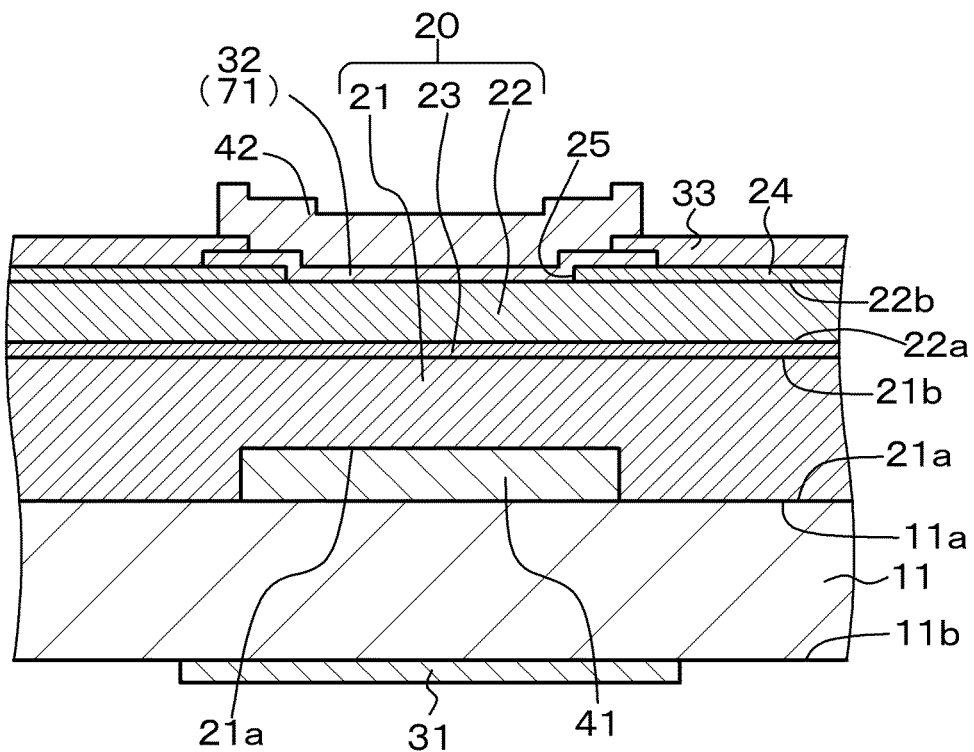
FIGS. 1A and 1B are schematic partial sectional views of a light emitting element of Embodiment 1 and a modification thereof.

As a schematic partial sectional view is depicted in FIG. 1A, a light emitting element of Embodiment 1 or light emitting elements of Embodiments 2 to 14 described below are each specifically a surface-emitting laser element (vertical-cavity surface-emitting laser, VCSEL) that includes a stacked structure including, in a stacked state, a first light reflection layer 41 in which a plurality of thin films is stacked, a light emitting structure 20, and a second light reflection layer 42 in which a plurality of thin films is stacked, in which the light emitting structure 20 includes a first compound semiconductor layer 21, an active layer (light emitting layer) 23, and a second compound semiconductor layer 22, stacked from the first light reflection layer side.

In Embodiment 1 or Embodiments 2 to 14 described below, the first compound semiconductor layer 21, the active layer 23, and the second compound semiconductor layer 22 (light emitting structure 20) include a GaN-based compound semiconductor material. Specifically, the first compound semiconductor layer 21 includes an n-GaN layer, the active layer 23 includes a quintuple multi quantum well structure in which an $In_{0.04}Ga_{0.96}N$ layer (barrier layer) and an $In_{0.16}Ga_{0.84}N$ layer (well layer) are stacked, and the second compound semiconductor layer 22 includes a p-GaN layer. In addition, a first electrode 31 includes Ti/Pt/Au, and a pad electrode (not illustrated) including, for example, Ti/Pt/Au or V/Pt/Au, for electrical connection to an external electrode or circuit, is formed on or connected onto an edge portion of the first electrode 31. A second electrode 32 includes a transparent conductive material, specifically, ITO, and a pad electrode 33 including, for example, Pd/Ti/Pt/Au, Ti/Pd/Au, or Ti/Ni/Au, for electrical connection to an external electrode or circuit, is formed on or connected onto an edge portion of the second electrode 32. The first light reflection layer 41 and the second light reflection layer 42 each include a stacked structure of an SiN layer and an $SiO_2$ layer (the total number of dielectric films stacked: 20). The second electrode 32 functions also as a light absorbing material layer 71 and is provided between the second compound semiconductor layer 22 and the second light reflection layer 42 in the light emitting element of Embodiment 1. That region of the first light reflection layer 41 which ranges from a first surface 21*a* of the first compound semiconductor layer 21 to a certain depth, the light emitting structure 20 (the first compound semiconductor layer 21, the active layer 23, and the second compound semiconductor layer 22), and that region of the second light reflection layer 42 which ranges from a second surface 22*b* of the second compound semiconductor layer 22 to a certain depth constitute a resonator.

The cavity length is equal to or more than $5\times10^{-6}$ m (5 μm). The wavelength (which may hereinafter be referred to as an "oscillation wavelength" for the sake of convenience) $\lambda_0$ of light which is emitted from the active layer and which has a maximum intensity is 445 nm. The thickness of the second electrode 32 (the light absorbing material layer 71) is equal to or less than $\lambda_0/(4\cdot n_{eq})$, and, specifically, is 3 nm. Besides, the light absorption coefficient of the light absorbing material layer 71 is equal to or more than two times, and, specifically, is $1\times10^3$ times, the light absorption coefficient of the second compound semiconductor layer 22 including the p-GaN layer.

The first light reflection layer 41 and the first compound semiconductor layer 21 are provided over a conductive substrate 11 (a light emitting element production substrate, specifically, an n-GaN substrate) (specifically, over a first surface 11a of the substrate 11). In addition, light generated in the active layer 23 is emitted to the exterior via the second light reflection layer 42. In other words, the light emitting element of Embodiment 1 is a light emitting element of a second light reflection layer emission type, and, specifically, includes a surface-emitting laser element (vertical-cavity surface-emitting laser, VCSEL) in which light is emitted from a top surface of the second compound semiconductor layer 22 via the second light reflection layer 42. The first electrode 31 is provided on an outer surface (second surface 11b) of the substrate 11. The first compound semiconductor layer 21 and the first light reflection layer 41 including a multilayer film are formed over the first surface 11a opposite to the second surface 11b of the substrate 11.

In the light emitting element of Embodiment 1, a current constriction layer 24 including an insulating material such as $SiO_2$ is formed between the second electrode 32 and the second compound semiconductor layer 22. The current constriction layer 24 is formed with a circular opening 25, and the second compound semiconductor layer 22 is exposed at a bottom portion of the opening 25.

The second electrode 32 is formed on the second surface 22b of the second compound semiconductor layer 22, and the second light reflection layer 42 including a multilayer film is formed on the second electrode 32. Specifically, the second electrode 32 is formed ranging from a position on the second surface 22b of the second compound semiconductor layer 22 to a position on the current constriction layer 24, and the second light reflection layer 42 is formed on the second electrode 32. Further, the pad electrode 33 for electrical connection to an external electrode or circuit is connected onto an edge portion of the second electrode 32. The plan-view shape of the element region is circular, and the plan-view shapes of the first electrode 31, the first light reflection layer 41, the second light reflection layer 42, and the opening 25 provided in the current constriction layer 24 are also circular. While the first light reflection layer 41 and the second light reflection layer 42 have a multilayer structure, they are each represented by a single layer for simplification of the drawing. Formation of the current constriction layer 24 is not essential.

Further, in the light emitting element of Embodiment 1, the light emitting structure 20 is formed with the light absorbing material layer 71 in parallel to a virtual plane occupied by the active layer 23, and, let the wavelength of light which is emitted from the active layer 23 and which has a maximum intensity be $\lambda_0$, let the equivalent refractive index of the layers occupying layers ranging from the active layer 23 to the light absorbing material layer 71 be $n_{eq}$, let the optical distance from the active layer 23 to the light absorbing material layer 71 be $L_{op}$, and let $\Lambda$ $\{(2m+1)\lambda_0\}/(4n_{eq})$ (provided that m is an integer of equal to or more than 0), then, the value of $L_{op}$ is a value different from $\Lambda$. In addition, the thickness $T_{ave}$ of the light reflection layer (second light reflection layer 42) on the side on which the light absorbing material layer 71 is located is a value different from the thickness $T_{DBR}$ (theoretical thickness of the light reflection layer (second light reflection layer 42) on the side on which the light absorbing material layer 71 is located, and the thickness of ¼ wavelength). Here, let the refractive indices of thin films constituting the light reflection layer (second light reflection layer 42) on the side on which the light absorbing material layer 71 is located be $n_i$ and let the total number of the thin films be 1, then, $T_{DBR} = \Sigma(\lambda_0/4n_i)$ where i=1, 2, 3, ..., 1, and "$\Sigma$" means to sum up from i=1 to i=1. Specifically, in Embodiment 1, as mentioned above, the second light reflection layer 42 includes the SiN layer (refractive index=2.05) and $SiO_2$ layer (refractive index=1.49), and 1=22 (the total number of the SiN layers: 11, the total number of the $SiO_2$ layers: 11). Besides, m=1, and $\Lambda = \{(2m+1)\lambda_0\}/(4n_{eq})$ $= 136$(nm).

Besides, in Embodiment 1, the value of $L_{op}$ is $0.95\times\Lambda \leq L_{op} \leq 0.99\times\Lambda$ and $T_{DBR} < T_{ave}$, preferably, $1.01\times T_{DBR} \leq T_{ave} \leq 1.05\times T_{DBR}$ is satisfied. Alternatively, the value of $L_{op}$ is $0.95\times\Lambda \leq L_{op} \leq 0.99\times\Lambda$ and the wavelength $\lambda_{SB-C}$ of a stop band center of the light reflection layer (second light reflection layer 42) on the side on which the light absorbing material layer 71 is located is longer than $\lambda_0$, and, desirably, $1.01\times\lambda_0 \leq \lambda_{SB-C} \leq 1.05\times\lambda_0$ is satisfied. Note that if the value of $L_{op}$ is less than $0.95\times\Lambda$ or exceeds $1.05\times\Lambda$ as described below, a rise in the threshold current may be brought about.

Alternatively, the value of $L_{op}$ is $1.01\times\Lambda \leq L_{op} \leq 1.05\times\Lambda$ and $T_{ave} < T_{DBR}$, preferably, $0.95\times T_{DBR} \leq T_{ave} \leq 0.99\times T_{DBR}$.

Alternatively, the value of $L_{op}$ is $1.01\times\Lambda \leq L_{op} \leq 1.05\times\Lambda$ and the wavelength $\lambda_{SB-C}$ of a stop band center of the light reflection layer on the side on which the light absorbing material layer 71 is located is shorter than $\lambda_0$, desirably, $0.95\times\lambda_0 \leq \lambda_{SB-C} \leq 0.99\times\lambda_0$ is satisfied.

In addition, the light absorbing material layer 71 is located in the vicinity of a minimum amplitude portion generated in a standing wave of light formed inside the stacked structure, and the active layer 23 is located in the vicinity of a maximum amplitude portion generated in the standing wave of light formed inside the stacked structure. This similarly applies to Embodiments 2 to 14 described below.

Figure 5A:
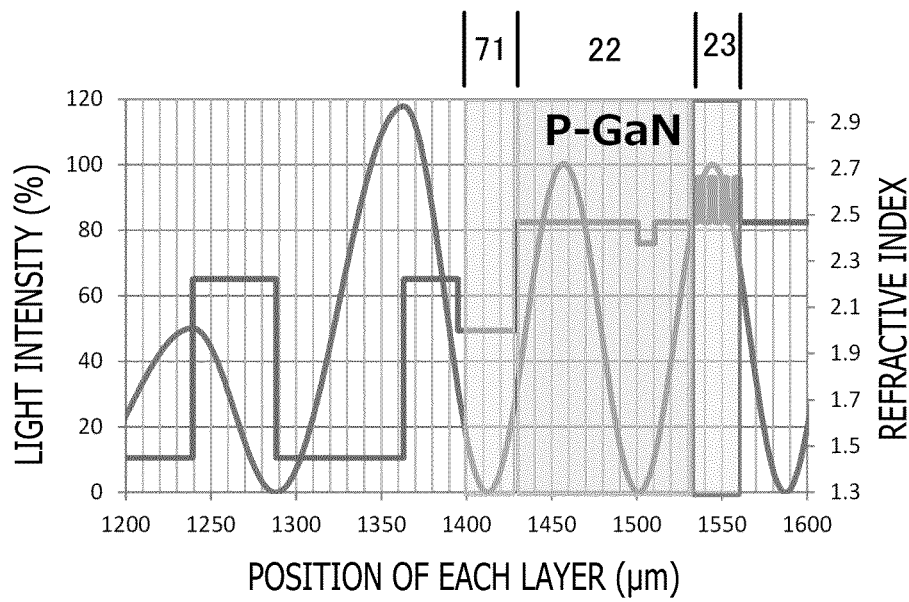
FIGS. 5A and 5B are diagrams depicting schematically the relations between the positions of an active layer and the like and a light field and the relations between the positions of the active layer and the like and the position of refractive index, in the case where $L_{op}=1.00\times\Lambda$ (provided that m=1) and $L_{op}=1.02\times\Lambda$ (provided that m=1) in Embodiment 1.
Figure 5B:
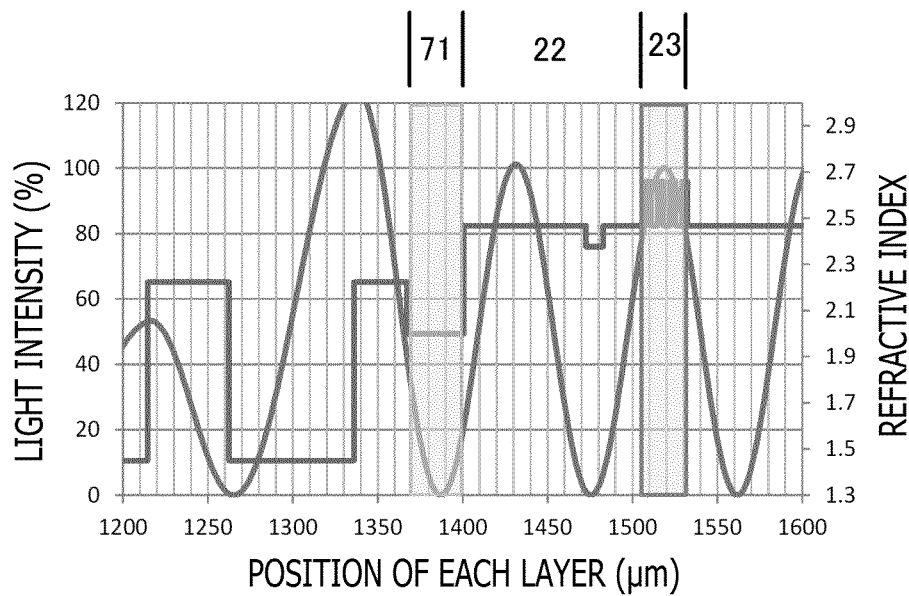
Figure 6:
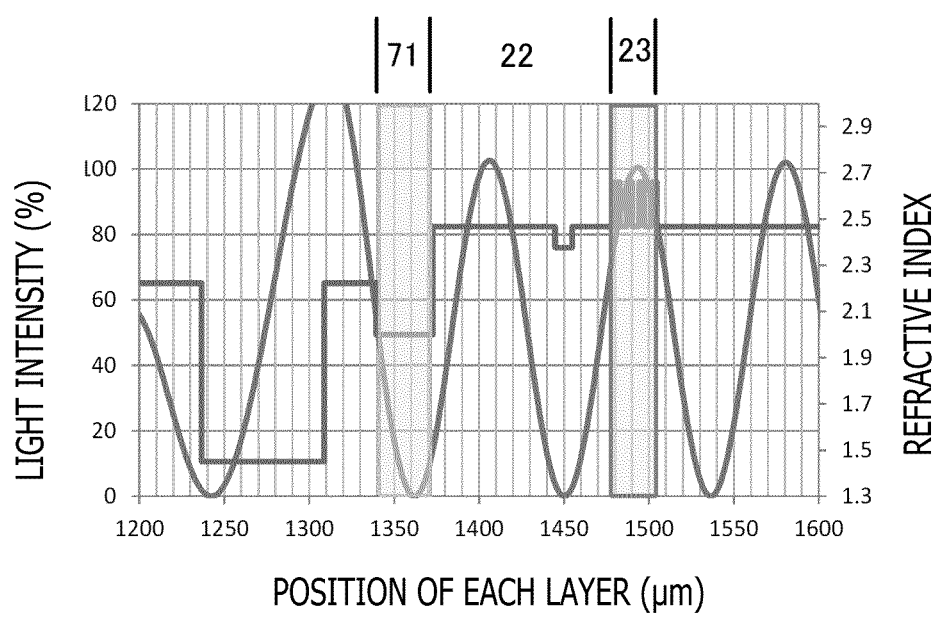
FIG. 6 is a diagram depicting schematically the relations between the positions of the active layer and the like and a light field and the relations between the positions of the active layer and the like and the position of refractive index in the case where $L_{op}=1.04\times\Lambda$ (provided that m=1) in Embodiment 1.

The relation between the positions of the active layer and the like and a light field and the relation between the positions of the active layer and the like and the position of refractive index in the cases where $L_{op}=1.00\times\Lambda$ (provided that m=1), $L_{op}=1.02\times\Lambda$ (provided that m=1), and $L_{op}=1.04\times\Lambda$ (provided that m=1) are depicted in FIGS. 5A, 5B, and 6.

In the related art, as illustrated in FIG. 5A, $L_{op}=1.00\times\Lambda$. Therefore, the position of a maximum amplitude portion in a light intensity distribution (the position of an antinode on one side of a standing wave in the resonator) and the position of the active layer 23 coincide with each other, and the position of a minimum amplitude portion in the light intensity distribution (the position of an antinode on the other side of the standing wave in the resonator) and the position of the light absorbing material layer 71 including ITO which would absorb light coincide with each other. On the other hand, as depicted in FIG. 5B and FIG. 6, in the light emitting elements of Embodiment 1, $L_{op}=1.02\times\Lambda$ or $L_{op}=1.04\times\Lambda$ is established, and, therefore, the position of an antinode on one side of the standing wave in the resonator and the position of the active layer 23 do not coincide with each other, nor do the position of an antinode on the other side of the standing wave in the resonator and the position of the light absorbing material layer 71 coincide with each other. Specifically, in these cases, the antinodes of the standing wave in the resonator are generally deviated to the active layer side. Here, in the case where the film thicknesses of the plural thin films including a dielectric material that constitute the second light reflection layer 42 are reduced for some reason, or in the case where the oscillation wavelength $\lambda_0$ is deviated to the shorter wavelength side, the positions of the antinodes of the standing wave in the resonator are generally moved toward the second light reflection layer side. In other words, a position at which a reflection mirror is considered to be effectively present is present inside the second reflection layer 42; this position is, in the case where the film thicknesses of the plural thin films including a dielectric material that constitute the second light reflection layer 42 are reduced for some reason, deviated to a farther position from the active layer 23, and the standing wave is also deviated in the same direction. Even if a variation in the wavelength occurs, the same effect is obtained as in the case of the deviation of the film thickness. As a result, in the related art illustrated in FIG. 5A, the position of the antinode on one side of the standing wave in the resonator and the position of the active layer 23 fail to coincide with each other, and the position of the antinode on the other side of the standing wave in the resonator and the position of the light absorbing material layer 71 fail to coincide with each other. On the other hand, in the light emitting elements of Embodiment 1 depicted in FIG. 5B and FIG. 6, the positions of the antinodes of the standing wave in the resonator are generally moved toward the second light reflection layer side, that is, in such a direction that the position of the antinode on one side of the standing wave in the resonator and the position of the active layer 23 coincide with each other, and in such a direction that the position of the antinode on the other side of the standing wave in the resonator and the position of the light absorbing material layer 71 coincide with each other. As a result of these, variations in the positions of the antinodes of the standing wave in the resonator can be canceled.

Figure 7A:
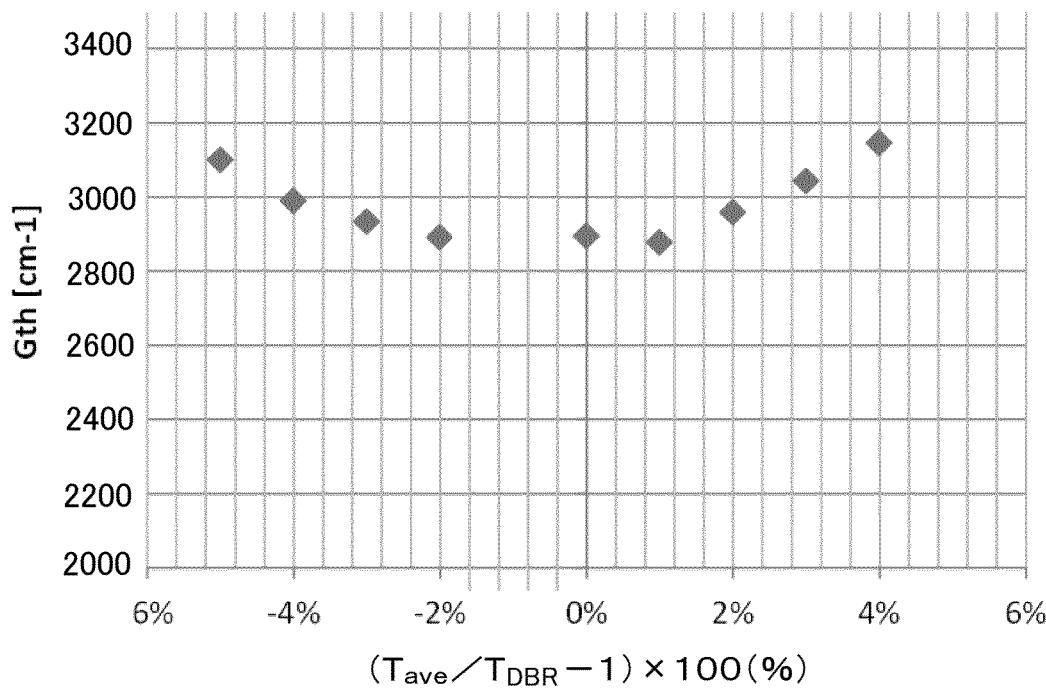
FIGS. 7A and 7B are diagrams depicting the results of simulation of the relation between $(T_{ave}/T_{DBR})$ and gain $G_{th}$ in the case where $L_{op}=1.01\times\Lambda$ (provided that m=1) and the results of simulation of the relation between $(T_{ave}/T_{DBR})$ and gain $G_{th}$ in the case where $L_{op}=0.99\times\Lambda$ (provided that m=1), in Embodiment 1.
Figure 7B:
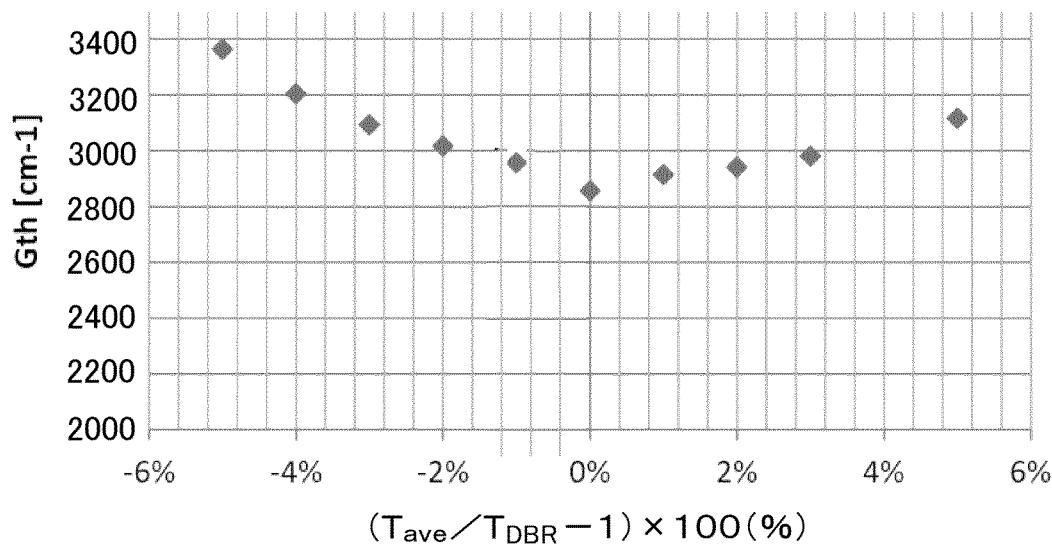
Figure 8:
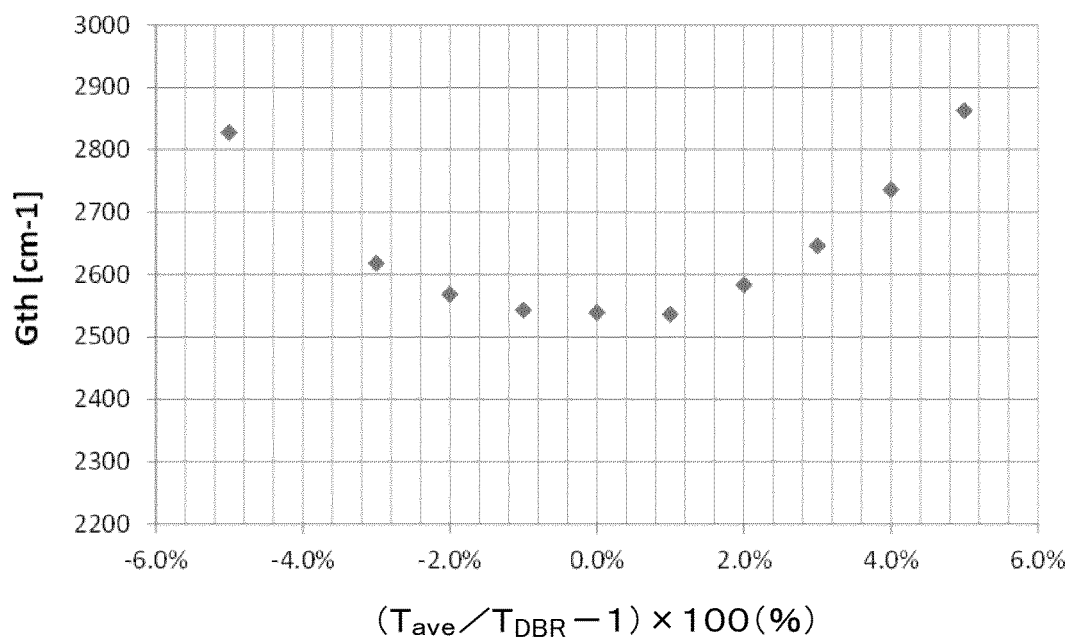
FIG. 8 is a diagram depicting the results of simulation of the relation between $(T_{ave}/T_{DBR})$ and gain $G_{th}$ in the case where $L_{op}=1.00\times\Lambda$ (provided that m=1), as Comparative Example 1.
Figure 9:
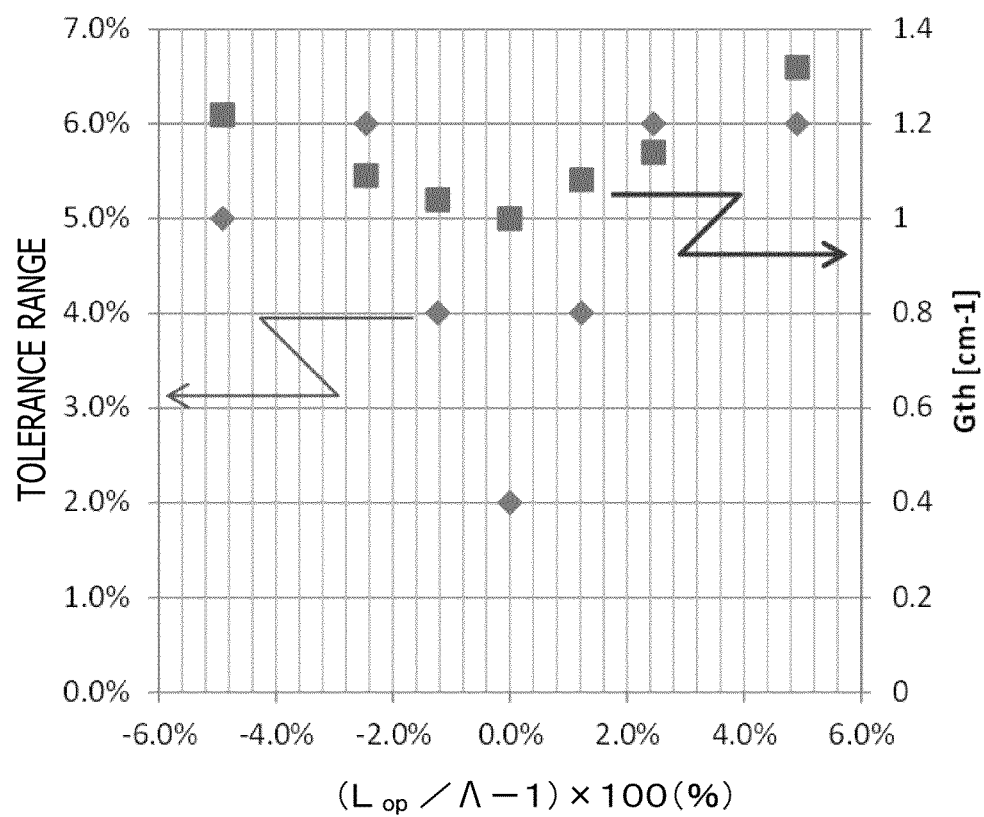
FIG. 9 is a diagram depicting the results of simulation of the relation between $(L_{op}/\Lambda)$ and the tolerance of thickness $T_{ave}$ as well as the relation between $(L_{op}/\Lambda)$ and gain $G_{th}$, in Embodiment 1.

The results of simulation of the relation between $(T_{ave}/T_{DBR})$ and gain $G_{th}$ in the case where $L_{op}=1.01\times\Lambda$ (provided that m=1) are depicted in FIG. 7A, and the results of simulation of the relation between $(T_{ave}/T_{DBR})$ and gain $G_{th}$ in the case where $L_{op}=0.99\times\Lambda$ (provided that m=1) are depicted in FIG. 7B. Further, as Comparative Example 1, the results of simulation of the relation between $(T_{ave}/T_{DBR})$ and gain $G_{th}$ in the case where $L_{op}=1.00\times\Lambda$ (provided that m=1) are depicted in FIG. 8. In addition, the results of simulation of the relation between $(L_{op}/\Lambda)$ and tolerance of thickness $T_{ave}$ and the relation between $(L_{op}/\Lambda)$ and gain $G_{th}$ are depicted in FIG. 9.

From comparison between FIG. 7A and FIG. 8 and comparison between FIG. 7B and FIG. 8, it is found that a variation in gain $G_{th}$ in response to a variation in thickness $T_{ave}$ is smaller in Embodiment 1 than in Comparative Example 1. In other words, in the light emitting element of Embodiment 1, a variation in the threshold current can be restrained more, even in the case where there is variability of the thickness of the second light reflection layer 42. In other words, it is found that the tolerance in relation to variability of $T_{ave}$ is enlarged. Here, the "tolerance in relation to variability of $T_{ave}$" is defined as a deviation range such that the rise rate of gain $G_{th}$ becomes equal to or less than 4% based on a minimum value of the gain $G_{th}$. Further, a reduction in overlap between the active layer 23 and the light field and a reduction in overlap between the second electrode 32 (light absorbing material layer 71) and the light field occur simultaneously, and the reduction in gain $G_{th}$ is canceled, resulting in that an enlarged tolerance can be realized.

In the case where the value of $L_{op}$ is $1.01\times\Lambda\leq L_{op}\leq1.05\times\Lambda$ or $0.95\times\Lambda\leq L_{op}\leq0.99\times\Lambda$, the position of the maximum amplitude portion in the light intensity distribution (the position of the antinode on one side of the standing wave in the resonator) and the position of the active layer 23 fail to coincide with each other, and the position of the minimum amplitude portion in the light intensity distribution (the position of the antinode on the other side of the standing wave in the resonator) and the position of the light absorbing material layer 71 including ITO which would absorb light fail to coincide with each other. On the other hand, since $T_{ave}<T_{DBR}$ or $T_{ave}>T_{DBR}$, or since the wavelength $\lambda_{SB-C}$ of the stop band center of the light reflection layer on the side on which the light absorbing material layer 71 is located is made to be different from $\lambda_0$, the light field is shifted, the position of the antinode on one side in the light intensity distribution and the position of the active layer 23 come to coincide with each other, and the position of the antinode on the other side in the light intensity distribution and the position of the light absorbing material layer 71 come to coincide with each other. As a result, an increase in gain and an increase in loss cancel each other, and variations in the threshold current can be restrained. In forming a light reflection layer in which a plurality of thin films including a dielectric material is stacked, generally, a film thickness in-plane distribution on the order of 5% exists, though depending on a film forming apparatus. Therefore, it suffices if the above-mentioned condition is satisfied, in order to effectively restrain variations in the threshold current, even in the case where a film thickness in-plane distribution on the order of 5% is present. Moreover, since the tolerance in relation to variability of $T_{ave}$ is enlarged, an enhanced production yield of the light emitting element can be realized, a stabilized threshold current can be realized, and, even in the case where plural surface-emitting laser elements are arranged in an array on one chip, speckle is reduced, and a light source with even threshold current can be provided.

The variability of the thickness of the light reflection layer varies depending on the apparatus for forming the light reflection layer, and the like. Therefore, it is recommendable to carry out various tests, to grasp the state of variability of the thickness of the light reflection layer and to determine (design) a most suitable value of $L_{op}$. In addition, for example, the wavelength $\lambda_0$ may vary depending on composition variability of the active layer or the like. Besides, also in the case where a variation in the wavelength $\lambda_0$ has occurred, the position of the antinode on one side in the light intensity distribution and the position of the active layer 23 fail to coincide with each other, and the position of the antinode on the other side in the light intensity distribution and the position of the light absorbing material layer 71 fail to coincide with each other; in this case, however, if the above-mentioned condition is satisfied, variations in the threshold current can be restrained effectively.

Figure 11A:
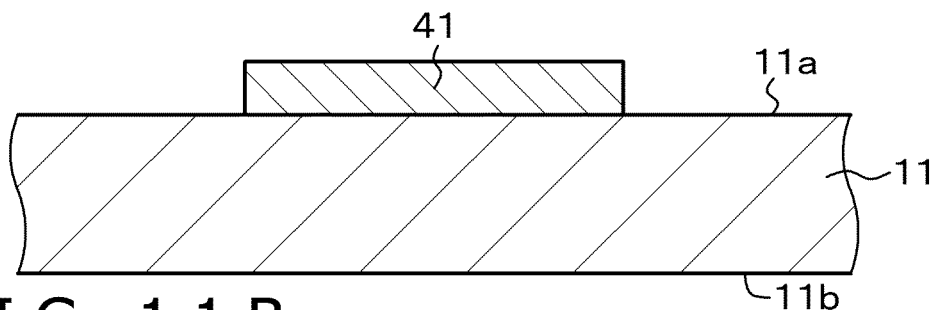
FIGS. 11A, 11B, and 11C are schematic partial end views of a stacked structure and the like for explaining a manufacturing method for the light emitting element of Embodiment 1.
Figure 11B:
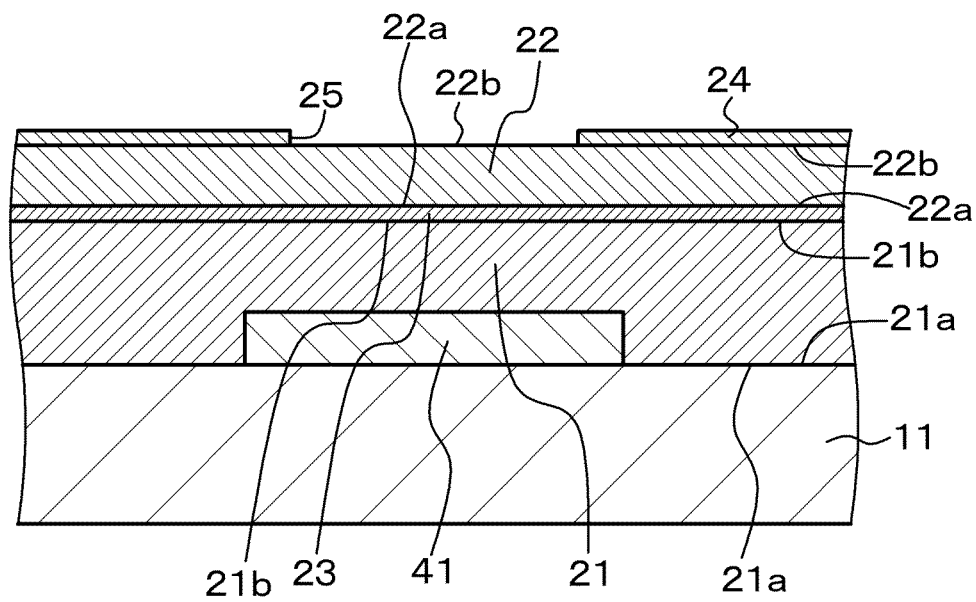
Figure 11C:
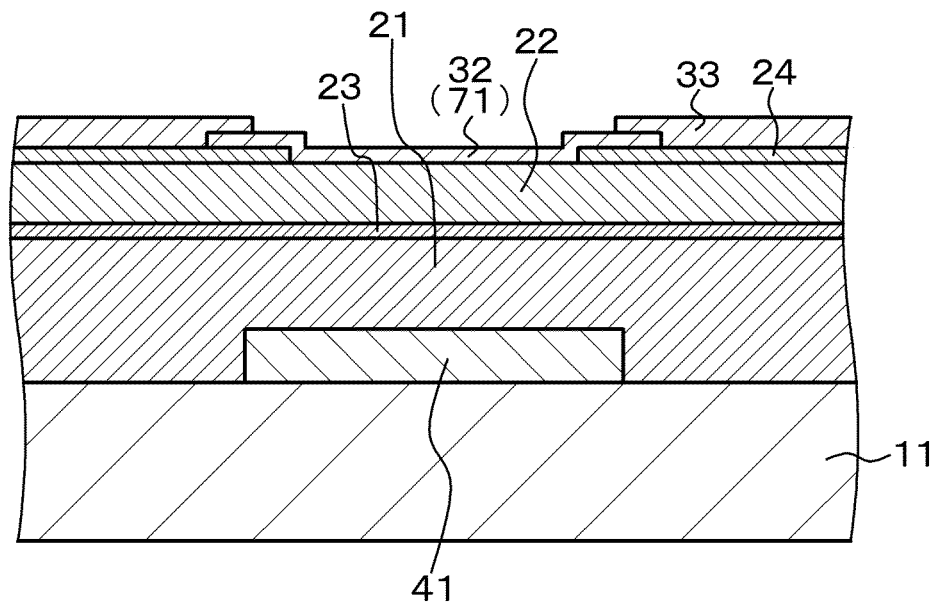

A manufacturing method for the light emitting element of Embodiment 1 will be described below, referring to FIGS. 11A, 11B, and 11C which are schematic partial end views of the stacked structure and the like.

[Step-100]

First, a first light reflection layer 41 including a multilayer film and having a projected shape is formed on a first surface 11a of a light emitting element production substrate 11. Specifically, the first light reflection layer 41 including a multilayer film and patterned is formed, based on a known method, on the first surface 11a of the light emitting element production substrate 11 including a GaN substrate. In this way, a structure as depicted in FIG. 11A can be obtained. The shape of the first light reflection layer 41 is disk-like. It is to be noted, however, that the shape of the first light reflection layer 41 is not limited to this.

[Step-110]

Next, a light emitting structure 20 including, in a stacked state,
- a first compound semiconductor layer 21 including a GaN-based compound semiconductor and having a first surface 21a and a second surface 21b opposite to the first surface 21a,
- an active layer (light emitting layer) 23 including a GaN-based compound semiconductor and being in contact with the second surface 21b of the first compound semiconductor layer 21, and
- a second compound semiconductor layer 22 including a GaN-based compound semiconductor and having a first surface 22a and a second surface 22b opposite to the first surface 22a, with the first surface 22a in contact with the active layer 23,
is formed on the light emitting element production substrate 11 including the first light reflection layer 41. Specifically, the first compound semiconductor layer 21 including n-GaN is formed by lateral growth by use of a method for epitaxial growth in lateral direction such as an ELO method, and, further, the active layer 23 and the second compound semiconductor layer 22 are formed over the first compound semiconductor layer 21, based on an epitaxial growth method, whereby the light emitting structure 20 can be obtained.

[Step-120]

Thereafter, a current constriction layer 24 having an opening 25 and including $SiO_2$ is formed on the second surface 22b of the second compound semiconductor layer 22 (see FIG. 11B), based on a known method.

[Step-130]

Subsequently, over the range from the second surface 22b of the second compound semiconductor layer 22 exposed at the bottom surface of the opening 25 to a position on the current constriction layer 24, a second electrode 32 is formed based on, for example, a lift-off method, and, further, a pad electrode 33 is formed based on a known method. In this way, a structure as illustrated in FIG. 11C can be obtained. Next, over the range from a position on the second electrode 32 to a position on the pad electrode 33, a second light reflection layer 42 is formed based on a known method.

[Step-140]

Thereafter, a first electrode 31 and the like are formed, based on a known method, over an outer surface (second surface 11b) of the light emitting element production substrate 11. In this way, a structure as depicted in FIG. 1A can be obtained. Then, further, what is generally called element isolation is conducted to isolate the light emitting element, and side surfaces and exposed surfaces of the stacked structure and the light emitting structure are coated with, for example, a coating layer including an insulating material such as $SiO_2$. Then, packaging or sealing is conducted, whereby the light emitting element of Embodiment 1 can be completed.

In the case where the light emitting structure includes a GaAs-based compound semiconductor layer, the cavity length L is normally as short as 1 μm or below, and laser light in a longitudinal mode emitted from the surface-emitting laser element is of one kind (one wavelength) (see a conceptual diagram of FIG. 39A). Therefore, the oscillation wavelength of the laser light in a longitudinal mode emitted from the surface-emitting laser element can be controlled accurately. On the other hand, in the case where the light emitting structure includes a GaN-based compound semiconductor layer, the cavity length L is normally as long as several times the wavelength of the laser light emitted from the surface-emitting laser element (specifically, for example, 5 μm or above). Therefore, the laser light in a longitudinal mode which may be emitted from the surface-emitting laser element would be of a plurality of kinds (see a conceptual diagram of FIG. 39B), and it may be difficult to accurately control the oscillation wavelength of the laser light which may be emitted from the surface-emitting laser element.

In the case where plural longitudinal modes are generated in a gain spectrum determined by the active layer 23, this is schematically represented as depicted in FIG. 38. Note that in FIG. 38, two longitudinal modes of a longitudinal mode A and a longitudinal mode B are illustrated. Further, in this case, it is assumed that the light absorbing material layer 71 is located at a minimum amplitude portion of longitudinal mode A but is not located at a minimum amplitude portion of longitudinal mode B. Then, mode loss in the longitudinal mode A is minimized, but mode loss in the longitudinal mode B is large. In FIG. 38, the mode loss component in the longitudinal mode B is schematically depicted in a solid line. Therefore, oscillation is easier in the longitudinal mode A than in the longitudinal mode B. For this reason, by using such a structure, that is, by controlling the position of the light absorbing material layer 71, a specific longitudinal mode can be stabilized, and oscillation can be facilitated. On the other hand, since the mode losses concerning undesired other longitudinal modes can be increased, oscillation in the undesired other longitudinal modes can be restrained.

As described above, in the light emitting element of Embodiment 1, the light absorbing material layer is formed in the light emitting structure, and, therefore, oscillation of laser light which is in plural kinds of longitudinal modes that can be emitted from the surface-emitting laser element and which is in undesired longitudinal modes can be restrained. As a result, the oscillation wavelength of the laser light emitted can be controlled accurately.

Figure 1B:
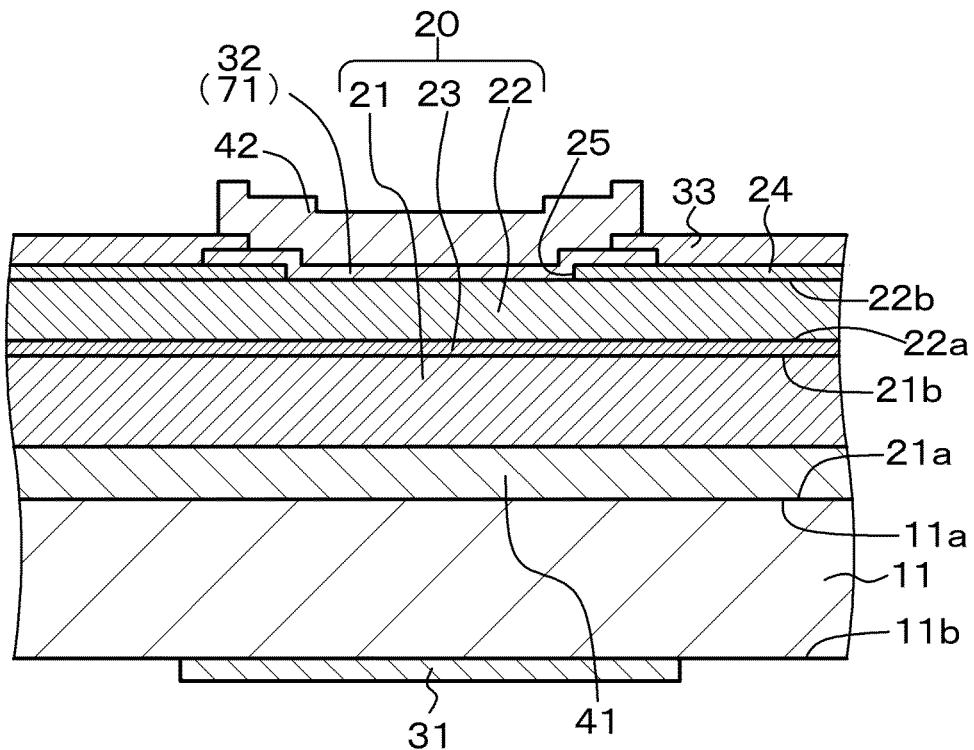

In [Step-100], the first light reflection layer 41 including a multilayer film may be formed on the first surface 11a of the light emitting element production substrate 11 including the GaN substrate, based on an epitaxial growth method. Note that patterning of the first light reflection layer 41 is unnecessary, in principle. In this way, finally, a light emitting element having a structure of which a schematic partial sectional view is depicted in FIG. 1B can be obtained.

Alternatively, the light absorbing material layer 71 may include a compound semiconductor material narrower in bandgap than the compound semiconductor constituting the light emitting structure 20, specifically, p-$In_{0.2}Ga_{0.8}N$, for example, inside the second compound semiconductor layer 22, separately from the second electrode 32. The thickness of the light absorbing material layer 71 is equal to or less than $\lambda_0/(4 \cdot n_{eq})$, and, specifically, is 3 nm. In addition, the light absorption coefficient of the light absorbing material layer 71 is equal to or more than two times, and specifically, is $1 \times 10^3$ times, the light absorption coefficient of the second compound semiconductor layer 22 including the p-GaN layer.

Alternatively, the light absorbing material layer 71 may include a compound semiconductor material doped with an impurity, specifically, a compound semiconductor material (specifically, p-GaN:Mg) having an impurity concentration (impurity: Mg) of $1 \times 10^{19}/cm^3$, for example, inside the second compound semiconductor layer 22, separately from the second electrode 32.

As described above, in Embodiment 1, since the thickness $T_{ave}$ of the light reflection layer on the side on which the light absorbing material layer is located is a value different from the thickness $T_{DBR}$ (intrinsically desired thickness of the light reflection layer), and, in the light emitting element of Embodiment 2 described below, since $L_{del} \neq \lambda_0/(4n_{del})$ (in other words, a thickness different from an intrinsically desired thickness of the dielectric layer), the position of a maximum amplitude portion in the light intensity distribution and the position of the active layer are deviated from each other, or the position of a minimum amplitude portion in the light intensity distribution and the position of the light absorbing material layer are deviated from each other, resulting in lowering in light emission efficiency. However, in the light emitting element of Embodiment 1 or Embodiment 2, since the value of $L_{op}$ is a value different from $\Lambda$, the deviation between the position of the maximum amplitude portion in the light intensity distribution and the position of the active layer can be reduced, and an increase in the gain of the light emitting element can be realized. As a result, the lowering in the light emission efficiency can be canceled by the increase in the gain, and a variation (increase) in a threshold current can be restrained. Moreover, since the tolerance concerning variability of $T_{ave}$ and variability of $L_{del}$ is enlarged, enhanced production yield of the light emitting element can be realized, a stabilized threshold current can be realized, and, even in the case where plural surface-emitting laser elements are arranged in an array on one chip, speckle is restrained, and a light source with an even threshold current can be provided.

Embodiment 2

Embodiment 2 relates to a light emitting element according to a second mode of the present disclosure.

Figure 2A:
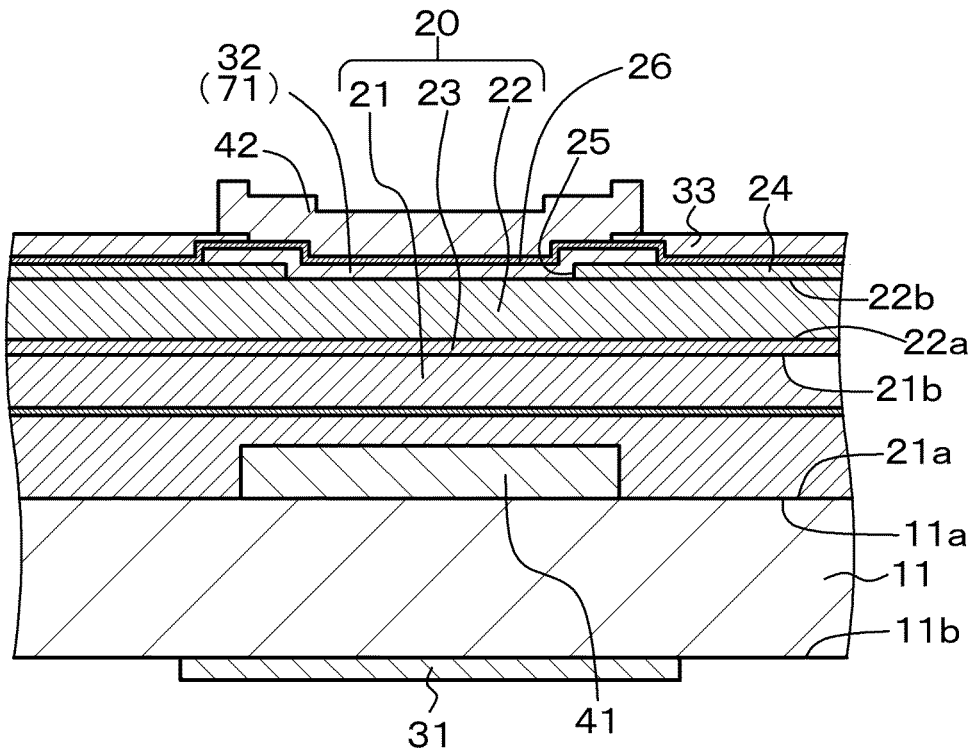
FIGS. 2A and 2B are schematic partial sectional views of a light emitting element of Embodiment 2 and a modification thereof.
Figure 2B:
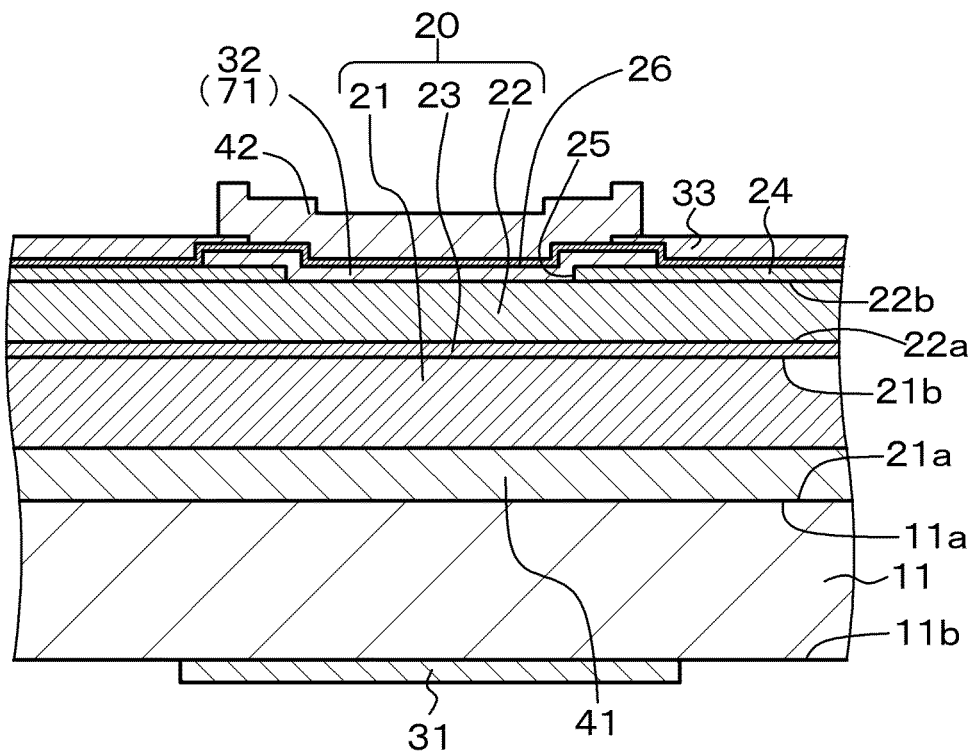

In light emitting elements of Embodiment 2 and a modification thereof of which schematic partial sectional views are depicted in FIGS. 2A and 2B, a light absorbing material layer 71 is formed at an end portion of a light emitting structure 20 in parallel to a virtual plane occupied by an active layer 23, and a dielectric layer 26 is formed between the light absorbing material layer 71 and a light reflection layer on the side on which the light absorbing material layer 71 is located (specifically, a second light reflection layer 42). Note that the light emitting element of Embodiment 2 illustrated in FIG. 2A corresponds to the light emitting element of Embodiment 1 depicted in FIG. 1A, and the modification of the light emitting element of Embodiment 2 illustrated in FIG. 2B corresponds to the modification of the light emitting element of Embodiment 1 depicted in FIG. 1B. Then, let the wavelength of light which is emitted from the active layer 23 and which has a maximum intensity be $\lambda_0$, let the equivalent refractive index of a layer occupying layers ranging from the active layer 23 to the light absorbing material layer 71 be $n_{eq}$, let the optical distance from the active layer 23 to the light absorbing material layer 71 be $L_{op}$, let the refractive index of a dielectric layer 26 be ma, let the optical distance from the light absorbing material layer 71 to the interface between the light reflection layer on the side on which the light absorbing material layer 71 is located (specifically, the second light reflection layer 42) and the dielectric layer 26 be $L_{del}$, and let $\Lambda \equiv \{(2m+1)\lambda_0\}/(4n_{eq})$ (provided that m is an integer of equal to or more than 0), then, the value of $L_{op}$ is a value different from $\Lambda$, and $L_{del} \neq \lambda_0/(4n_{del})$.

Here, the dielectric layer 26 has a function as a phase adjusting layer.

Specifically, in the light emitting element of Embodiment 2, the value of $L_{op}$ is $0.95 \times \Lambda \leq L_{op} \leq 0.99 \times \Lambda$ and $\lambda_0/(4n_{del}) \leq L_{del}$, preferably, $1.01 \times \lambda_0/(4n_{del}) \leq L_{del} \leq 1.05 \times \lambda_0/(4n_{del})$.

Alternatively, the value of $L_{op}$ is $1.01 \times \Lambda \leq L_{op} \leq 1.05 \times \Lambda$ and $L_{del} < \lambda_0/(4n_{del})$, preferably, $0.95 \times \lambda_0/(4n_{del}) \leq L_{op} \leq 0.99 \times \lambda_0/(4n_{del})$.

Figure 10A:
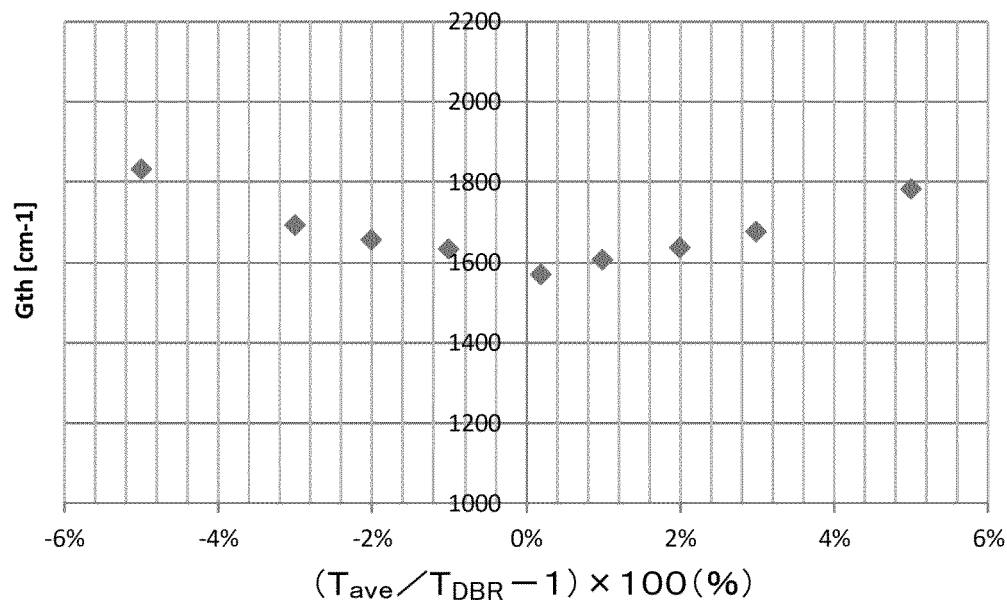
FIGS. 10A and 10B are diagrams depicting the results of simulation of the relation between $(T_{ave}/T_{DBR})$ and gain $G_{th}$ in the case where $L_{op}=0.99\times\Lambda$ (provided that m=1) and the results of simulation of the relation between $(T_{ave}/T_{DBR})$ and gain $G_{th}$ in the case where $L_{op}=1.01\times\Lambda$ (provided that m=1), in Embodiment 2.
Figure 10B:
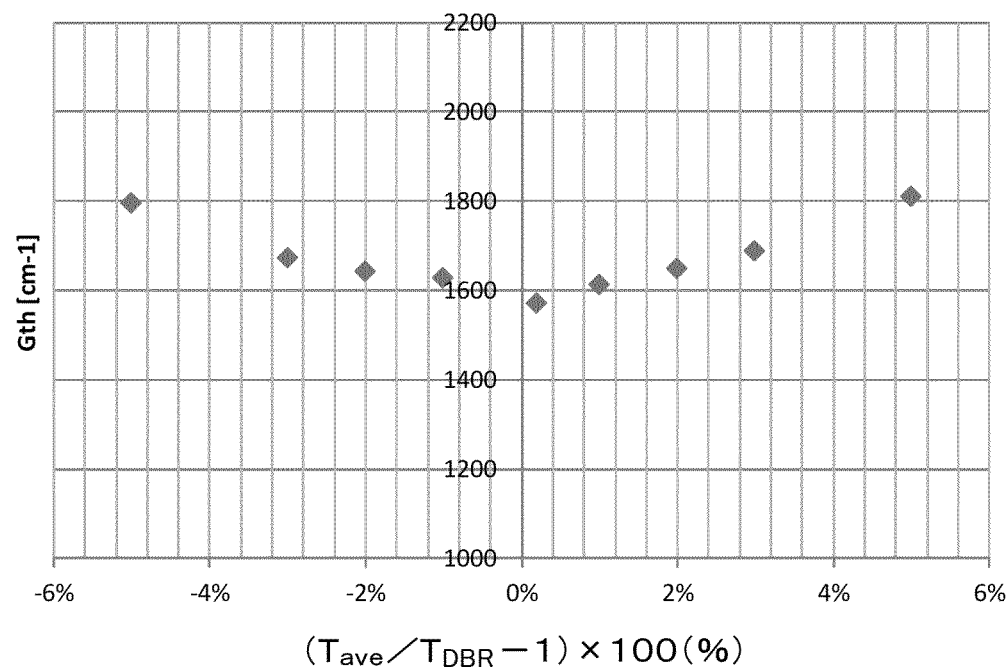

The results of simulation of the relation between ($T_{ave}/T_{DBR}$) and gain $G_{th}$ in the case where $L_{op}=0.99 \times \Lambda$ (provided that m=1) are depicted in FIG. 10A and the results of simulation of the relation between ($T_{ave}/T_{DBR}$) and gain $G_{th}$ in the case where $L_{op}=1.01\times\Lambda$ (provided that m=1) are illustrated in FIG. 10B.

In the light emitting element of Embodiment 2 as well, since the value of $L_{op}$ is a value different from $\Lambda$, the position of the antinode on one side in the light intensity distribution and the position of the active layer 23 fail to coincide with each other, and the position of the antinode on the other side in the light intensity distribution and the position of the light absorbing material layer 71 fail to coincide with each other. On the other hand, since $L_{del}<\lambda_0/(4n_{del})$ or $\lambda_0/(4n_{del})\le L_{del}$, the light field is shifted, the position of the antinode on one side in the light intensity distribution and the position of the active layer 23 coincide with each other, and the position of the antinode on the other side in the light intensity distribution and the position of the light absorbing material layer 71 coincide with each other. As a result, an increase in gain and an increase in loss are canceled each other, and a variation in a threshold current can be restrained. In forming the dielectric layer, generally, a film thickness in-plane distribution on the order of 5% exists, though depending on the film forming apparatus. Therefore, it suffices if the above-mentioned condition is satisfied, in order to effectively restrain variations in the threshold current, even in the case where a film thickness in-plane distribution on the order of 5% is present. Moreover, since the tolerance in relation to the variability of Lad is enlarged, enhanced production yield of the light emitting element can be realized, a stabilized threshold current can be contrived, and, even in the case where plural surface-emitting laser element are arranged in an array on one chip, speckle is reduced, and a light source with an even threshold current can be provided. Here, the "tolerance in relation to the variability of $L_{del}$" is defined as a deviation range such that the rise rate of the threshold current will be equal to or less than 4% based on a minimum of the threshold current. Then, a reduction in the overlap between the active layer 23 and the light field and a reduction in the overlap between the second electrode 32 (light absorbing material layer 71) and the light field occur simultaneously, and the reduction in gain $G_{th}$ is canceled, resulting in that an enlarged tolerance can be realized.

The variability of the thickness of the dielectric layer varies depending on the apparatus for forming the dielectric layer, and the like. Therefore, it is recommendable to carry out various tests, to grasp the state of variability of the thickness of the dielectric layer and to determine (design) a most suitable value of $L_{op}$. In addition, for example, the wavelength $\lambda_0$ may vary depending on composition variability of the dielectric layer. Besides, also in the case where a variation in the wavelength $\lambda_0$ has occurred, the position of the antinode on one side in the light intensity distribution and the position of the active layer 23 fail to coincide with each other, and the position of the antinode on the other side in the light intensity distribution and the position of the light absorbing material layer 71 fail to coincide with each other; in this case, however, if the above-mentioned condition is satisfied, variations in the threshold current can be restrained effectively.

Embodiment 3

Embodiment 3 is a modification of Embodiments 1 and 2. A light emitting element of Embodiment 3, more specifically, includes a surface-emitting laser element (vertical-cavity surface-emitting laser, VCSEL) in which laser light is emitted from a top surface of a first compound semiconductor layer 21 via a first light reflection layer 41.

Figure 3A:
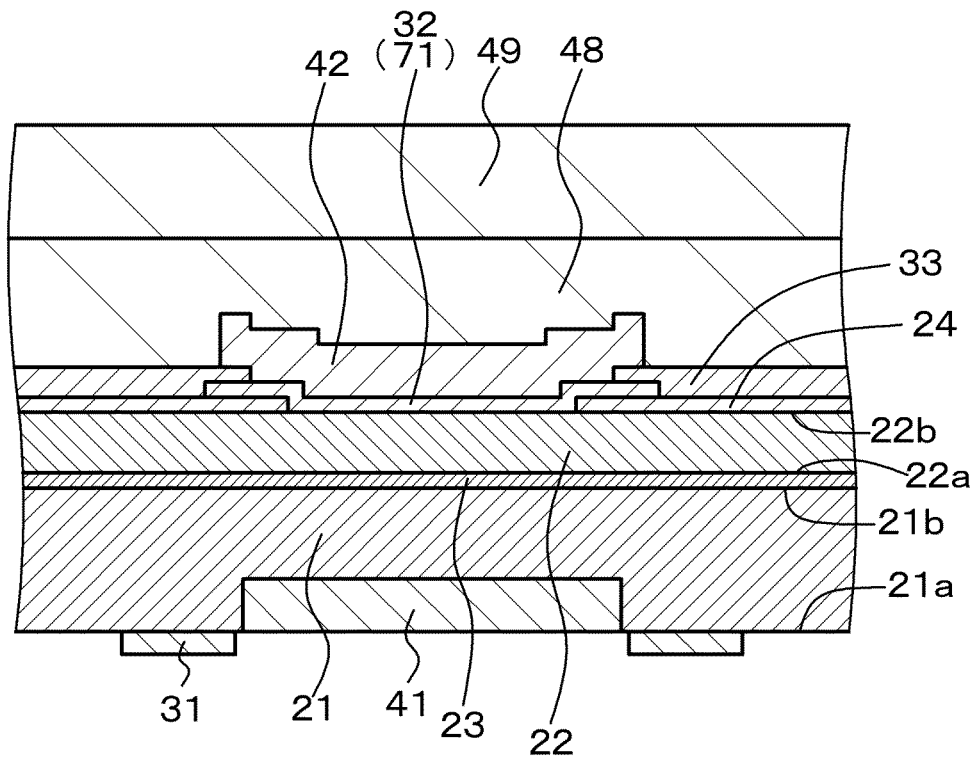
FIGS. 3A and 3B are schematic partial sectional views of a light emitting element of Embodiment 3.

In the light emitting element of Embodiment 3, as a schematic partial sectional view is depicted in FIG. 3A, a second light reflection layer 42 is fixed to a support substrate 49 including a silicon semiconductor substrate, through a joint layer 48 including a gold (Au) layer or a tin (Sn)-containing solder layer, by a solder joining method.

A manufacturing method for the light emitting element of Embodiment 3 will be described below.

[Step-300]

First, for example, by steps similar to [Step-100] to [Step-130] of Embodiment 1, a state depicted in FIG. 1A (provided that a first electrode 31 is not formed) can be obtained.

[Step-310]

Thereafter, the second light reflection layer 42 is fixed to the support substrate 49 through the joint layer 48.

[Step-320]

Next, a light emitting element production substrate 11 is removed, to expose a first surface 21a of the first compound semiconductor layer 21 and the first light reflection layer 41. Specifically, first, the thickness of the light emitting element production substrate 11 is reduced based on a mechanical polishing method, and then the remainder portion of the light emitting element production substrate 11 is removed based on a CMP method. In this way, the first surface 21a of the first compound semiconductor layer 21 and the first light reflection layer 41 are exposed.

[Step-330]

Thereafter, the first electrode 31 is formed on the first surface 21a of the first compound semiconductor layer 21. In this way, the light emitting element of Embodiment 3 having a structure depicted in FIG. 3A can be obtained.

In manufacturing the light emitting element of Embodiment 3, the light emitting element production substrate is removed in a state in which the first light reflection layer has been formed. Therefore, the first light reflection layer functions as a kind of stopper at the time of removal of the light emitting element production substrate. As a result, the variability of removal of the light emitting element production substrate in the plane of the light emitting element production substrate, and, further, the variability of thickness of the first compound semiconductor layer can be restrained from being generated, and a uniform cavity length can be realized. As a result, stabilization of characteristics of the light emitting element obtained can be achieved. Moreover, since the surface (flat surface) of the first compound semiconductor layer at the interface between the first light reflection layer and the first compound semiconductor layer is flat, scattering of laser light on the flat surface can be minimized.

In the example of the light emitting element described above and denoted in FIG. 3A, an end portion of the first electrode 31 is spaced from the first light reflection layer 41. That is, the first light reflection layer 41 and the first electrode 31 are spaced from each other, in other words, they have an offset, and the spaced-apart distance is within 1 mm, specifically, for example, 0.05 mm on average. It is to be noted, however, that such a structure is not limitative; an end portion of the first electrode 31 may be in contact with the first light reflection layer 41, or an end portion of the first electrode 31 may be formed ranging to the upper side of an edge portion of the first light reflection layer 41.

Figure 3B:
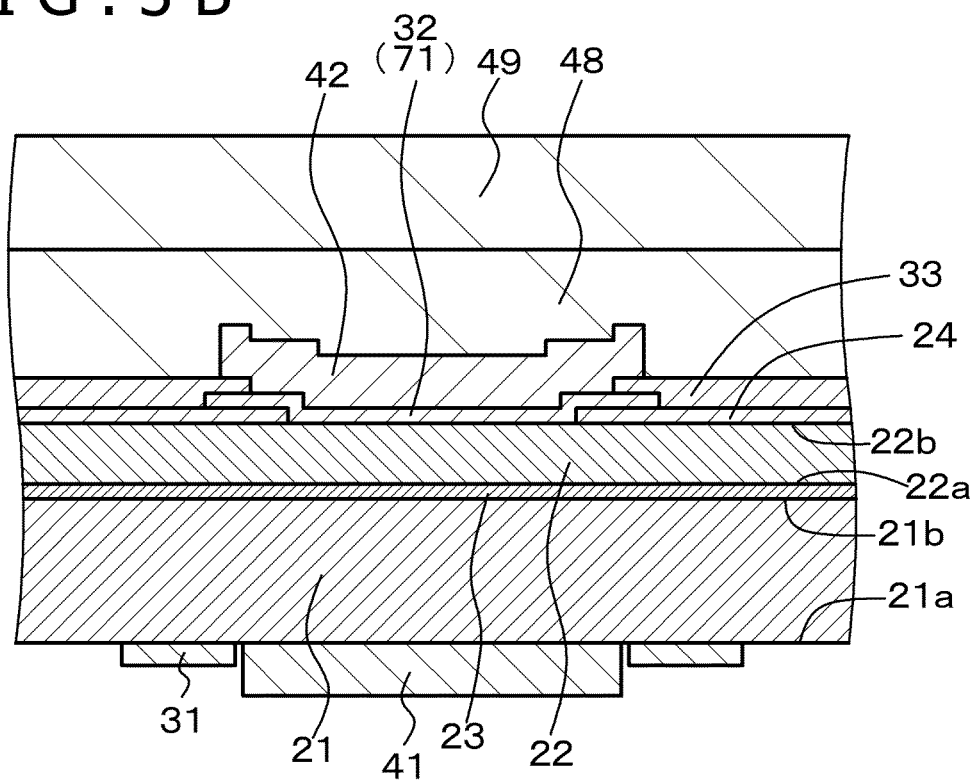

In addition, by omitting [Step-100] of Embodiment 1, first, for example, steps similar to [Step-110] to [Step-130] of Embodiment 1 may be performed, after which [Step-310] and [Step-320] may be carried out, to expose the first surface 21a of the first compound semiconductor layer 21, and then, the first light reflection layer 41 and the first electrode 31 may be formed over the first surface 21a of the first compound semiconductor layer 21. A schematic partial sectional view of the light emitting element obtained in this way is depicted in FIG. 3B.

Figure 4:
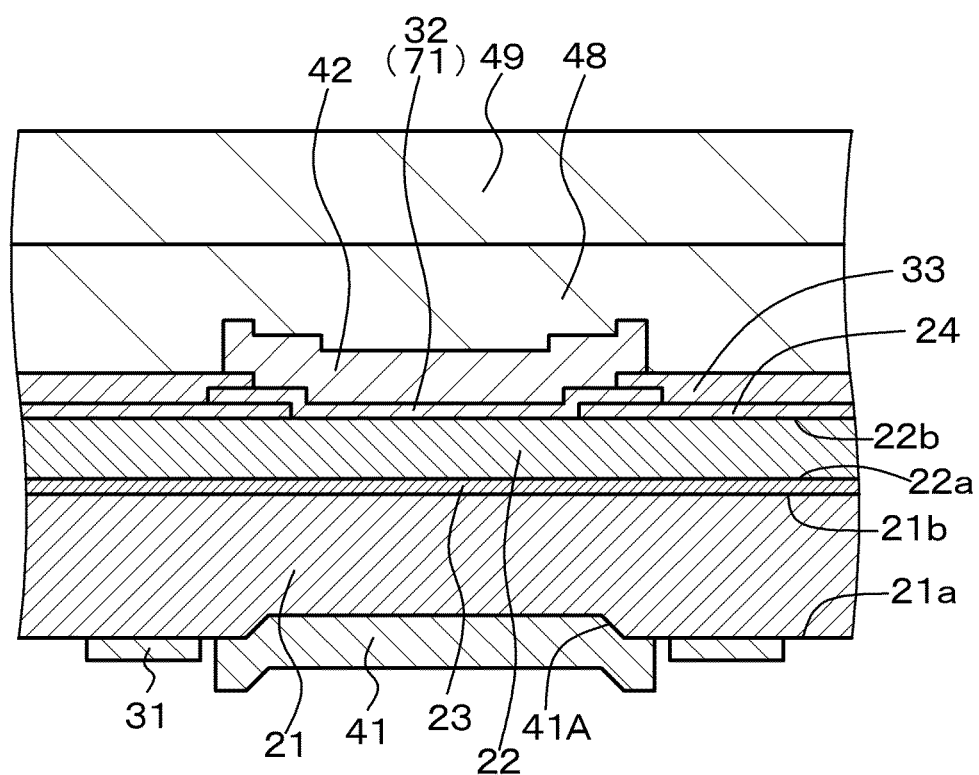
FIG. 4 is a schematic partial sectional view of a modification of the light emitting element of Embodiment 3.

Besides, in forming the first light reflection layer 41 on the first surface 21a of the first compound semiconductor layer 21, the first compound semiconductor layer 21 may be etched to form a recess in the first surface 21a of the first compound semiconductor layer 21, and the first light reflection layer 41 may be formed at the recess (see FIG. 4). Note that an inclined portion formed in the first compound semiconductor layer 21 is denoted by reference sign 41A.

Embodiment 4

Embodiment 4 is a modification of the light emitting elements of Embodiments 1 to 3.

As mentioned above, in the case where the light emitting structure includes a GaAs-based compound semiconductor, the cavity length $L_{OR}$ is on the order of 1 μm. On the other hand, in the case where the light emitting structure includes a GaN-based compound semiconductor, the cavity length $L_{OR}$ is normally as long as several times the wavelength of the laser light emitted from the surface-emitting laser element. In other words, the cavity length $L_{OR}$ is much longer than 1 μm. When the cavity length $L_{OR}$ is thus elongated, unlike the conventional GaAs-based surface-emitting laser element adopting a cavity length $L_{OR}$ on the order of 1 μm, diffraction loss increases and, therefore, laser oscillation is difficult to perform. In other words, the laser element may not function as a surface-emitting laser element but may function as an LED. Here, the "diffraction loss" refers to a phenomenon in which laser light reciprocating in a resonator is gradually dissipated to the exterior of the resonator, since light generally tends to spread due to a diffraction effect. In addition, in the case where the light emitting structure includes a GaN-based compound semiconductor, the problem of thermal saturation may be mentioned. Here, the "thermal saturation" refers to a phenomenon in which, at the time of driving of a surface-emitting laser element, light output is saturated due to self-heating. The materials used for the light reflection layer (for example, such materials as $SiO_2$ and $Ta_2O_5$) are lower than the GaN-based compound semiconductor in the value of thermal conductivity. Therefore, an increase in the thickness of the GaN-based compound semiconductor layer leads to restraining of thermal saturation. However, when the thickness of the GaN-based compound semiconductor layer is increased, the cavity length $L_{OR}$ is increased, so that the above-mentioned problem is generated. A technology for imparting a function as a recessed mirror to the light reflection layer is known, for example, in JP 2006-114753A and JP 2000-022277A. However, these pieces of patent literature make no mention concerning the problem of an increase in diffraction loss due to increase of the cavity length $L_{OR}$ or the problem of thermal saturation.

In order to solve these problems, in the light emitting element of Embodiment 4, a first light reflection layer 41 has a recessed mirror section, and a second light reflection layer 42 has a flat shape.

With the first light reflection layer thus having the recessed mirror section, the light spreading through diffraction with the active layer as a start point and being incident on the first light reflection layer can securely be reflected toward the active layer and can be concentrated on the active layer. Therefore, an increase in diffraction loss can be avoided, laser oscillation can securely be performed, and the problem of thermal saturation can be avoided since the cavity length is long.

In the light emitting element of Embodiment 4, the figure drawn by the interface, facing the light emitting structure, of a part of the recessed mirror section of the first light reflection layer when the first light reflection layer is cut along a virtual plane containing the stacking direction of the stacked structure may be a part of a circle or a part of a parabola. The figure may not strictly be a part of a circle or may not strictly be a part of a parabola. In other words, a case where the figure is roughly a part of a circle and a case where the figure is roughly a part of a parabola are also included in the case where "the figure is a part of a circle or a part of a parabola." That portion (region) of the first light reflection layer which is a part of a circle or a part of a parabola as described above may be referred to as an "effective region in the recessed mirror section of the first light reflection layer." Note that the figure drawn by the interface, facing the light emitting structure, of a part of the recessed mirror section can be determined by measuring the shape of the interface by a measuring instrument, and analyzing the thus obtained data on the basis of the least squares method.

In addition, in the light emitting element of Embodiment 4, the second compound semiconductor layer is provided with a current injection region and a current non-injection region surrounding the current injection region, and the shortest distance $D_{CI}$ from the area center of gravity of the current injection region to the boundary between the current injection region and the current non-injection region may satisfy the following formula. Here, a light emitting element of such a configuration is referred to as a "light emitting element of the first configuration" for the sake of convenience. Note that for the deduction of the following formula, see, for example, H. Kogelnik and T. Li, "Laser Beams and Resonators," Applied Optics/Vol. 5, No. 10/Oct. 1966. Besides, $\omega_0$ is also called a beam waist radius.

$$D_{CI} \geq \omega_0/2 \tag{1-1}$$

provided that $$\omega_0^2 \equiv (\lambda_0/\pi)\{L_{OR}(R_{DBR}-L_{OR})\}^{1/2} \tag{1-2}$$

where $\lambda_0$: oscillation wavelength (wavelength of light which is emitted from the active layer and which has maximum intensity)

$L_{OR}$: cavity length $R_{DBR}$: radius of curvature of recessed mirror section of first light reflection layer Here, the light emitting element of Embodiment 4 has the recessed mirror section only at the first light reflection layer; however, when taking into account the symmetry with respect to the flat mirror of the second light reflection layer, the resonator can be expanded to a Fabry-Perot resonator sandwiched between two recessed mirror sections having the same radius of curvature (see the schematic diagram of FIG. 34). In this instance, the cavity length of the virtual Fabry-Perot resonator is twice the cavity length $L_{OR}$. Graphs representing the relations between the value of $\omega_0$, the value of the cavity length $L_{OR}$, and the value of the radius of curvature $R_{DBR}$ of the recessed mirror section of the first light reflection layer are depicted in FIGS. 35 and 36. Note that, that the value of $\omega_0$ is "positive" means that the laser light is schematically in the state of FIG. 37A, and that the value of $\omega_0$ is "negative" means that the laser light is schematically in the state of FIG. 37B. The state of the laser light may be the state depicted in FIG. 37A or may be the state depicted in FIG. 37B. It is to be noted, however, that when the radius of curvature $R_{DBR}$ becomes smaller than the cavity length $L_{OR}$, the virtual Fabry-Perot resonator having the two recessed mirror sections comes into the state depicted in FIG. 37B, confinement becomes excessive, and diffraction loss is generated. Therefore, the state depicted in FIG. 37A in which the radius of curvature $R_{DBR}$ is larger than the cavity length $L_{OR}$ is preferred. Note that when the active layer is disposed close to a flat light reflection layer of the two light reflection layers, specifically, to the second light reflection layer, the light field is more concentrated in the active layer. In other words, confinement of the light field in the active layer is strengthened, and laser oscillation is facilitated.

Incidentally, in the case where a region in which the light reflected by the first light reflection layer is concentrated is not included in the current injection region corresponding to a region in which the active layer has a gain due to current injection, induced emission of light from carriers is hindered, possibly leading to hindrance of laser oscillation. With the above-mentioned formulas (1-1) and (1-2) satisfied, it is possible to ensure that the region into which the light reflected by the first light reflection layer is concentrated is included in the current injection region, and laser oscillation can securely be achieved.

Moreover, the light emitting element of the first configuration may further include
a mode loss action part that is provided on the second surface of the second compound semiconductor layer and that constitutes a mode loss action region acting on a variation in an oscillation mode loss,
a second electrode formed ranging from a position on the second surface of the second compound semiconductor layer to a position on the mode loss action part, and
a first electrode electrically connected to the first compound semiconductor layer,
in which the second light reflection layer may be formed on the second electrode,
the light emitting structure may be formed with a current injection region, a current non-injection inside region surrounding the current injection region, and a current non-injection outside region surrounding the current non-injection inside region, and
an orthogonal projection image of the mode loss action region and an orthogonal projection image of the current non-injection outside region may overlap with each other.

In addition, in the light emitting element of the first configuration including such a preferred configuration, the radius $r'_{DBR}$ of the effective region in the recessed mirror section of the first light reflection layer may satisfy $\omega_0 \leq r'_{DBR} \leq 20 \cdot \omega_0$, preferably $\omega_0 \leq r'_{DBR} \leq 10 \cdot \omega_0$. Alternatively, as the value of $r'_{DBR}$, $r'_{DBR} \leq 1 \times 10^{-4}$ m, preferably, $r'^{DBR} \leq 5 \times 10^{-5}$ m, may be mentioned as an example. In addition, as the height $h_{DBR}$ of a base section (described below), $h_{DBR} \leq 5 \times 10^{-5}$ m may be mentioned as an example. Further, in the light emitting element of the first configuration including such a preferred configuration, $D_{CI} \geq \omega_0$ may be satisfied. Furthermore, in the light emitting element of the first configuration including such a preferred configuration, $R_{DBR} \leq 1 \times 10^{-3}$ m, preferably, $1 \times 10^{-5}$ m $\leq R_{DBR} \leq 1 \times 10^{-3}$ m, and more preferably, $1 \times 10^{-5}$ m $\leq R_{DBR} \leq 1 \times 10^{-4}$ m, may be satisfied.

In addition, the light emitting element of Embodiment 4 may further include
a mode loss action part that is provided on the second surface of the second compound semiconductor layer and that constitutes a mode loss action region acting on a variation in an oscillation mode loss,
a second electrode formed ranging from a position on the second surface of the second compound semiconductor layer to a position on the mode loss action part, and
a first electrode electrically connected to the first compound semiconductor layer,
in which the second light reflection layer may be formed on the second electrode,
the light emitting structure may be formed with a current injection region, a current non-injection inside region surrounding the current injection region, and a current non-injection outside region surrounding the current non-injection inside region, and
an orthogonal projection image of the mode loss action region and an orthogonal projection image of the current non-injection outside region may overlap with each other. Here, a light emitting element of such a configuration is referred to as a "light emitting element of the second configuration" for the sake of convenience.

Alternatively, the light emitting element of Embodiment 4 including the above-mentioned preferred mode may further include
a second electrode formed on the second surface of the second compound semiconductor layer,
a second light reflection layer formed on the second electrode,
a mode loss action part that is provided on the first surface of the first compound semiconductor layer and that constitutes a mode loss action region acting on a variation in an oscillation mode loss, and
a first electrode electrically connected to the first compound semiconductor layer,
in which the first light reflection layer may be formed ranging from a position on the first surface of the first compound semiconductor layer to a position on the mode loss action part,
the light emitting structure may be formed with a current injection region, a current non-injection inside region surrounding the current injection region, and a current non-injection outside region surrounding the current non-injection inside region, and
an orthogonal projection image of the mode loss action region and an orthogonal projection image of the current non-injection outside region may overlap with each other. Here, a light emitting element of such a configuration is referred to as a "light emitting element of the third configuration" for the sake of convenience. Note that the definition of the light emitting element of the third configuration may be applied to the light emitting element of the first configuration.

In the light emitting element of the second configuration or the light emitting element of the third configuration, the light emitting structure is formed with the current non-injection region (collective term for the current non-injection inside region and the current non-injection outside region); in this case, specifically, the current non-injection region may be formed in a region on the second electrode side of the second compound semiconductor layer, in the thickness direction, may be formed in the whole part of the second compound semiconductor layer, may be formed in the second compound semiconductor layer and the active layer, or may be formed ranging from the second compound semiconductor layer to a part of the first compound semiconductor layer. While the orthogonal projection image of the mode loss action region and the orthogonal projection image of the current non-injection outside region overlap with each other, the orthogonal projection image of the mode loss action region and the orthogonal projection image of the current non-injection outside region may not necessarily overlap with each other in a region sufficiently spaced from the current injection region.

In the light emitting element of the second configuration, the current non-injection outside region may be located on a lower side of the mode loss action region.

In the light emitting element of the second configuration including the above-mentioned preferred configuration, let the area of the orthogonal projection image of the current injection region be $S_1$ and let the area of the orthogonal projection image of the current non-injection inside region be $S_2$, then $$0.01 \le S_1/(S_1+S_2) \le 0.7$$

may be satisfied. In addition, in the light emitting element of the third configuration, let the area of the orthogonal projection image of the current injection region be $S_1'$ and let the area of the orthogonal projection image of the current non-injection inside region be $S_2'$, then, $$0.01 \le S_1'/(S_1'+S_2') \le 0.7$$

may be satisfied. It is to be noted, however, that the range of $S_1/(S_1'+S_2)$ and the range of $S_1'/(S_1'+S_2')$ are not limited to the above-mentioned ranges.

In the light emitting element of the second configuration or the light emitting element of the third configuration including the above-mentioned preferred configurations, the current non-injection inside region and the current non-injection outside region may be formed by ion injection into the light emitting structure. A light emitting element of such a configuration is referred to as a "light emitting element of the (2-A)th configuration" or a "light emitting element of the (3-A)th configuration" for the sake of convenience. In addition, in this case, the ion species may be at least one kind of ions (or one kind of ions or two or more kinds of ions) selected from the group including boron, proton, phosphorus, arsenic, carbon, nitrogen, fluorine, oxygen, germanium, and silicon.

Alternatively, in the light emitting element of the second configuration or the light emitting element of the third configuration including the above-mentioned preferred configurations, the current non-injection inside region and the current non-injection outside region may be formed by irradiation with plasma of the second surface of the second compound semiconductor layer, by an ashing treatment of the second surface of the second compound semiconductor layer, or by a reactive ion etching treatment of the second surface of the second compound semiconductor layer. A light emitting element of such a configuration is referred to as a "light emitting element of the (2-B)th configuration" or a "light emitting element of the (3-B)th configuration" for the sake of convenience. In these treatments, the current non-injection inside region and the current non-injection outside region are exposed to plasma particles, and, therefore, conductivity of the second compound semiconductor layer is deteriorated, and the current non-injection inside region and the current non-injection outside region are brought into a high-resistance state. In other words, the current non-injection inside region and the current non-injection outside region may be formed by exposure of the second surface of the second compound semiconductor layer to the plasma particles. Specific examples of the plasma particles include argon, oxygen, and nitrogen.

Alternatively, in the light emitting element of the second configuration or the light emitting element of the third configuration including the above-mentioned preferred configurations, the second light reflection layer may have a region by which the light from the first light reflection layer is reflected or scattered toward the outside of the resonator structure including the first light reflection layer and the second light reflection layer. A light emitting element of such a configuration is referred to as a "light emitting element of the (2-C)th configuration" or a "light emitting element of the (3-C)th configuration" for the sake of convenience. Specifically, a region of the second light reflection layer located on an upper side of a side wall of the mode loss action part (a side wall of an opening provided in the mode loss action part) has a normal tapered inclination or has a region curved to be protuberant toward the first light reflection layer. Alternatively, in the light emitting element of the second configuration or the light emitting element of the third configuration including the abovementioned preferred configurations, the first light reflection layer may have a region by which the light from the second light reflection layer is reflected or scattered toward the outside of the resonator structure including the first light reflection layer and the second light reflection layer. Specifically, it is sufficient if a normal tapered inclination is formed or a curved portion protuberant toward the second light reflection layer is formed, in a region of a part of the first light reflection layer; alternatively, it is sufficient if a region of the first light reflection layer located on an upper side of a side wall of the mode loss action part (a side wall of an opening provided in the mode loss action part) has a normal tapered inclination or has a region curved to be protuberant toward the second light reflection layer. In addition, light may be scattered at the boundary (side wall edge portion) between a top surface of the mode loss action part and a side wall of the opening provided in the mode loss action part, whereby the light is scattered toward the outside of the resonator structure including the first light reflection layer and the second light reflection layer.

In the light emitting element of the (2-A)th configuration, the light emitting element of the (2-B)th configuration, or the light emitting element of the (2-C)th configuration described above, let the optical distance from the active layer in the current injection region to the second surface of the second compound semiconductor layer be $L_2$ and let the optical distance from the active layer in the mode loss action region to a top surface of the mode loss action part be $L_0$, then, $$L_0 > L_2$$

may be satisfied. In addition, in the light emitting element of the (3-A)th configuration, the light emitting element of the (3-B)th configuration, or the light emitting element of the (3-C)th configuration described above, let the optical distance from the active layer in the current injection region to the first surface of the first compound semiconductor layer be $L_1'$ and let the optical distance from the active layer in the mode loss action region to a top surface of the mode loss action part be $L_0'$, then, $$L_0' > L_1'$$

may be satisfied. Further, in the light emitting element of the (2-A)th configuration, the light emitting element of the (3-A)th configuration, the light emitting element of the (2-B)th configuration, the light emitting element of the (3-B)th configuration, the light emitting element of the (2-C)th configuration, or the light emitting element of the (3-C)th configuration described above, including these configurations, light having a generated higher order mode may be dissipated toward the outside of the resonator structure including the first light reflection layer and the second light reflection layer, by the mode loss action region, whereby the oscillation mode loss may be increased. In other words, the light field intensity in the fundamental mode and the higher order mode generated is reduced in going away from a Z axis, in the orthogonal projection image of the mode loss action region, by the presence of the mode loss action region acting on a variation in the oscillation mode loss; in this case, the mode loss in the higher order mode is larger than the reduction in the light field intensity in the fundamental mode, so that the fundamental mode can be stabilized more, and, since mode loss can be restrained as compared to the case where the current injection inside region is not present, lowering in the threshold current can be realized.

In addition, in the light emitting element of the (2-A)th configuration, the light emitting element of the (3-A)th configuration, the light emitting element of the (2-B)th configuration, the light emitting element of the (3-B)th configuration, the light emitting element of the (2-C)th configuration, or the light emitting element of the (3-C)th configuration described above, the mode loss action part may include a dielectric material, a metallic material, or an alloy material. Examples of the dielectric material include $SiO_X$, $SiN_X$, $AlN_X$, $AlO_X$, $TaO_X$, and $ZrO_X$, and examples of the metallic material or alloy material include titanium, gold, platinum, and alloys thereof, but these materials are not limitative. Light may be absorbed by the mode loss action part including these materials, and mode loss can be increased. Alternatively, even when light is not directly absorbed, mode loss can be controlled by disturbing a phase. In this case, the mode loss action part may include a dielectric material, and the optical thickness $t_0$ of the mode loss action part may be a value deviated from an integral multiple of ¼ of the oscillation wavelength $\lambda_0$. In other words, the phase of light going around the inside of the resonator and forming a standing wave may be disturbed in the mode loss action part, to thereby break the standing wave of the light and to cause a mode loss corresponding thereto. Alternatively, the mode loss action part may include a dielectric material, and the optical thickness $t_0$ of the mode loss action part (with a refractive index being $n_{m\text{-}loss}$) may be an integral multiple of ¼ of the oscillation wavelength $\lambda_0$. In other words, the optical thickness $t_0$ of the mode loss action part may be such a thickness that the phase of the light generated in the light emitting element is not disturbed and the standing wave of the light is not broken. It is to be noted, however, that the optical thickness $t_0$ may not necessarily be an integral multiple of ¼ of the oscillation wavelength $\lambda_0$ in a strict sense, and it is sufficient if $$(\lambda_0/4n_{m\text{-}loss}) \times m - (\lambda_0/8n_{m\text{-}loss}) \leq t_0 \leq (\lambda_0/4n_{m\text{-}loss}) \times 2m + (\lambda_0/8n_{m\text{-}loss})$$

is satisfied. Alternatively, the mode loss action part may include a dielectric material, a metallic material, or an alloy material, whereby the light passing through the mode loss action part may be disturbed in phase or may be absorbed, by the mode loss action part. Further, with these configurations adopted, control of the oscillation mode loss can be performed with a higher degree of freedom, and the degree of freedom in designing the light emitting element can further be enhanced.

Alternatively, in the light emitting element of the second configuration including the above-mentioned preferred configurations, a projected portion may be formed on the second surface side of the second compound semiconductor layer, and the mode loss action part may be formed on a region of the second surface of the second compound semiconductor layer that surrounds the projected portion. A light emitting element of such a configuration is referred to as a "light emitting element of the (2-D)th configuration" for the sake of convenience. The projected portion occupies the current injection region and the current non-injection inside region. In addition, in this case, let the optical distance from the active layer in the current injection region to the second surface of the second compound semiconductor layer be $L_2$ and let the optical distance from the active layer in the mode loss action region to the top surface of the mode loss action part be $L_0$, then, $$L_0 \leq L_2$$

may be satisfied. Further, in these cases, the light having a generated higher order mode may be confined in the current injection region and the current non-injection region by the mode loss action region, whereby the oscillation mode loss may be reduced. In other words, the light field intensities in the fundamental mode and the higher order mode generated are increased in the orthogonal projection images of the current injection region and the current non-injection inside region, by the presence of the mode loss action region acting on a variation in the oscillation mode loss. Further, in these cases, the mode loss action part may include a dielectric material, a metallic material, or an alloy material. Here, as the dielectric material, the metallic material, or the alloy material, the above-mentioned various materials may be mentioned.

Alternatively, in the light emitting element of the third configuration including the above-mentioned preferred configurations, a projected portion may be formed on the first surface side of the first compound semiconductor layer, and the mode loss action part may be formed on a region of the first surface of the first compound semiconductor layer that surrounds the projected portion, or the mode loss action part may include a region of the first compound semiconductor layer that surrounds the projected portion. A light emitting element of such a configuration is referred to as a "light emitting element of the (3-D)th configuration" for the sake of convenience. The projected portion coincides with the orthogonal projection images of the current injection region and the current non-injection inside region. In addition, in this case, let the optical distance from the active layer in the current injection region to the first surface of the first compound semiconductor layer be $L_1'$ and let the optical distance from the active layer in the mode loss action region to the top surface of the mode loss action part be $L_0'$, then, $$L_0' \leq L_1'$$

may be satisfied. Further, in these cases, the light having a generated higher order mode may be confined in the current injection region and the current non-injection region, by the mode loss action region, whereby oscillation mode loss may be reduced. Further, in these cases, the mode loss action part may include a dielectric material, a metallic material, or an alloy material. Here, as the dielectric material, the metallic material, or the alloy material, the above-mentioned various materials may be mentioned.

Further, in the light emitting element of Embodiment 4 including the above-described preferred modes and configurations (inclusive of the light emitting element of the first configuration to the light emitting element of the third configuration), a compound semiconductor substrate may be disposed between the first surface of the first compound semiconductor layer and the first light reflection layer. Here, a light emitting element of such a configuration is referred to as a "light emitting element of the fourth configuration" for the sake of convenience. In this case, the compound semiconductor substrate may include a GaN substrate. Note that, as the thickness of the compound semiconductor substrate, $5 \times 10^{-5}$ m to $1 \times 10^{-4}$ m may be mentioned as an example, but such a value is not limitative. In addition, in the light emitting element of the fourth configuration including such a configuration, the recessed mirror section of the first light reflection layer may include a base section including a projecting section of the compound semiconductor substrate and a multilayer light reflection film formed on the surface of at least a part of the base section. Here, a light emitting element of such a configuration is referred to as a "light emitting element of the (4-A)th configuration" for the sake of convenience. Alternatively, the recessed mirror section of the first light reflection layer may include a base section formed on the compound semiconductor substrate and a multilayer light reflection film formed on the surface of at least a part of the base section. Here, a light emitting element of such a configuration is referred to as a "light emitting element of the (4-B)th configuration" for the sake of convenience. The material constituting the base section in the light emitting element of the (4-A)th configuration is, for example, a GaN substrate. As the GaN substrate, any of a polar substrate, a semi-polar substrate, and a nonpolar substrate may be used. On the other hand, examples of the material constituting the base section in the light emitting element of the (4-B)th configuration include transparent dielectric materials such as $TiO_2$, $Ta_2O_5$, or $SiO_2$, silicon reins, and epoxy resins.

Alternatively, in the light emitting element of Embodiment 4 including the above-described preferred modes and configurations (inclusive of the light emitting element of the first configuration to the light emitting element of the third embodiment), a first light reflection layer may be formed on the first surface of the first compound semiconductor layer. Here, a light emitting element of such a configuration is referred to as a "light emitting element of the fifth configuration" for the sake of convenience.

Further, in the light emitting element of Embodiment 4 including the above-described preferred modes and configurations (inclusive of the light emitting element of the first configuration to the light emitting element of the fifth configuration), the value of thermal conductivity of the light emitting structure may be higher than the value of thermal conductivity of the first light reflection layer. The value of the thermal conductivity of the dielectric material constituting the first light reflection layer is generally on the order of 10 watt/(m·K) or below. On the other hand, the value of the thermal conductivity of the GaN-based compound semiconductor constituting the light emitting structure is on the order of 50 watt/(m·K) to 100 watt/(m·K).

Furthermore, in the light emitting element of Embodiment 4 including the above-described preferred modes and configurations (inclusive of the light emitting element of the first configuration to the light emitting element of the fifth configuration), let the radius of curvature of the recessed mirror section of the light emitting element (specifically, the effective region with a radius $r'_{DBR}$ in the recessed mirror section of the first light reflection layer) be $R_{DBR}$, then, $R_{DBR} \leq 1 \times 10^{-3}$ m, preferably, $1 \times 10^{-5}$ m $\leq R_{DBR} \leq 1 \times 10^{-3}$ m, more preferably, $1 \times 10^{-5}$ m $\leq R_{DBR} \leq 1 \times 10^{-4}$ m, may be satisfied. In addition, it is desirable that $1 \times 10^{-5}$ m $\leq L_{OR}$, preferably, $1 \times 10^{-5}$ m $\leq L_{OR} \leq 5 \times 10^{-4}$ m, more preferably, $1 \times 10^{-5} \leq L_{OR} \leq 1 \times 10^{-4}$ m, is satisfied.

Further, in the light emitting element of Embodiment 4 including the above-described preferred modes and configurations (inclusive of the light emitting element of the first configuration to the light emitting element of the fifth configuration), a protuberant-shaped portion may be formed in the periphery of the first light reflection layer, and the first light reflection layer may not project from the protuberant-shaped portion, whereby the first light reflection layer can be protected. In other words, since the first light reflection layer is provided in the state of being recessed relative to the protuberant-shaped portion, for example, even if some kind of object comes into contact with the protuberant-shaped portion, the object does not make contact with the first light reflection layer, so that the first light reflection layer can securely be protected.

In addition, in the light emitting element of Embodiment 4 including the above-described preferred modes and configurations (inclusive of the light emitting element of the first configuration to the light emitting element of the fifth configuration), the materials constituting the various compound semiconductor layers (inclusive of the compound semiconductor substrate) located between the active layer and the first light reflection layer preferably do not have a modulation in a refractive index of equal to or more than 10% (do not have a refractive index difference of equal to or more than 10%, based on an average refractive index of the light emitting structure), whereby generation of disturbance of a light field in the resonator can be restrained.

Besides, it is natural that the various configurations and structures of the light emitting element of Embodiment 4 including the above-described preferred modes and configurations (inclusive of the light emitting element of the first configuration to the light emitting element of the fifth configuration) are applicable to the light emitting elements of Embodiments 1 to 3, except for the structure and configuration such that the first light reflection layer 41 has the recessed mirror section and the second light reflection layer 42 has a flat shape.

While a specific description of the light emitting element of Embodiment 4 will be given below, the second light reflection layer 41 having a recessed mirror section 43 is disposed on the first surface 21a side of the first compound semiconductor layer 21, and the second light reflection layer 42 having the flat shape is disposed on the second surface 22b side of the second compound semiconductor layer 22. The second electrode 32 functions also as a light absorbing material layer 71. This similarly applies to Embodiments 5 to 14 described below.

Figure 12:
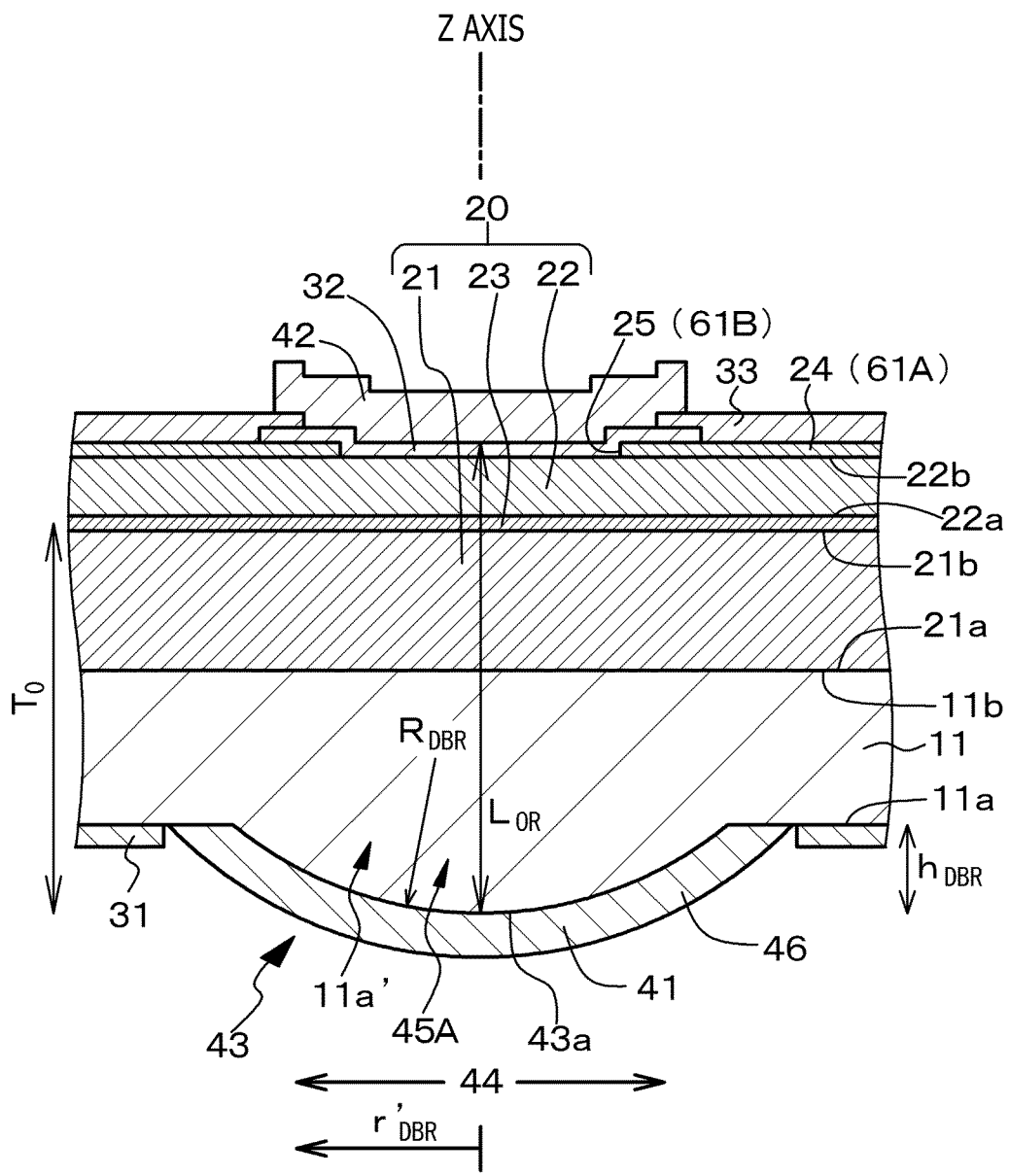
FIG. 12 is a schematic partial end view of a light emitting element of Embodiment 4.

The light emitting element of Embodiment 4 is specifically a light emitting element of the (4-A)th configuration. The light emitting elements of Embodiment 4 or Embodiments 5 to 12 described below include, more specifically, a surface-emitting laser element (vertical-cavity surface-emitting laser, VCSEL) in which laser light is emitted from a top surface of the second compound semiconductor layer via the second light reflection layer. In addition, the light emitting elements of Embodiments 13 and 14 described below include, more specifically, a surface-emitting laser element (vertical-cavity surface-emitting laser, VCSEL) in which laser light is emitted from a top surface of the first compound semiconductor layer via the first light reflection layer. A schematic partial end view of the light emitting element of Embodiment 4 is depicted in FIG. 12.

In addition, in the light emitting element of Embodiment 4, a figure drawn by an interface 43a, facing the light emitting structure, of a part of the recessed mirror section 43 of the first light reflection layer 41 (an effective region 44 in the recessed mirror section 43 of the first light reflection layer 41) when the first light reflection layer 41 is cut along a virtual plane containing the stacking direction of the stacked structure is a part of a circle or a part of a parabola. Note that the shape (a figure of sectional shape) of that part of the recessed mirror section 43 which is located on the outside of the effective region 44 may not necessarily be a part of a circle or a part of a parabola.

Further, the recessed mirror section 43 of the first light reflection layer 41 includes a base section 45A including a projecting section 11a' of the first surface 11a of the compound semiconductor substrate 11 and a multilayer light reflection film 46 formed on the surface of at least a part of the base section 45A (specifically, the surface of the base section 45A). Further, let the radius of curvature of the recessed mirror section 43 (specifically, the effective region 44 with a radius $r'_{DBR}$ in the recessed mirror section 43 of the first light reflection layer 41) be $R_{DBR}$, then, $$R_{DBR} \leq 1 \times 10^{-3} \, m$$

is satisfied. Specifically, though not limitative,
$L_{OR}$=50 μm,
$R_{DBR}$=70 μm, and
$r'_{DBR}$=20 μm
may be mentioned as examples. In addition, as the oscillation wavelength $\lambda_0$,
$\lambda_0$=450 nm
may be mentioned as an example.

Here, let the distance from the active layer 23 to the interface between the base section 45A and the multilayer light reflection film 46 be $T_0$, a function x=f(z) of an ideal parabola can be represented by $$x=z^2/t_0, \text{ and}$$

$$h_{DBR}=r'^2_{DBR}/2T_0,$$

but it is natural that, when the figure drawn by the interface 43a is a part of a parabola, the parabola may be a parabola deviated from such an ideal parabola.

In addition, the value of thermal conductivity of the light emitting structure 20 is higher than the value of thermal conductivity of the first light reflection layer 41. The value of the thermal conductivity of the dielectric material constituting the first light reflection layer 41 is on the order of 10 watt/(m·K) or below. On the other hand, the value of the thermal conductivity of the GaN-based compound semiconductor constituting the light emitting structure 20 is on the order of 50 to 100 watt/(m·K).

A manufacturing method for the light emitting element of Embodiment 4 will be described below, referring to FIGS. 13A, 13B, 14, 15, 16, 17, and 18, which are schematic partial end views of the stacked structure and the like.
[Step-400]

First, a light emitting structure 20 that includes, in a stacked state,
a first compound semiconductor layer 21 having a first surface 21a and a second surface 21b opposite to the first surface 21a,
an active layer (light emitting layer) 23 facing the second surface 21b of the first compound semiconductor layer 21, and
a second compound semiconductor layer 22 having a first surface 22a facing the active layer 23 and a second surface 22b opposite to the first surface 22a, and
that includes a GaN-based compound semiconductor is formed on a second surface 11b of a compound semiconductor substrate 11 having a thickness on the order of 0.4 mm. Specifically, based on an epitaxial growth method by a known MOCVD method, the first compound semiconductor layer 21, the active layer 23, and the second compound semiconductor layer 22 are sequentially formed over the second surface 11b of the compound semiconductor substrate 11, whereby the light emitting structure 20 can be obtained (see FIG. 13A).
[Step-410]

Figure 13A:
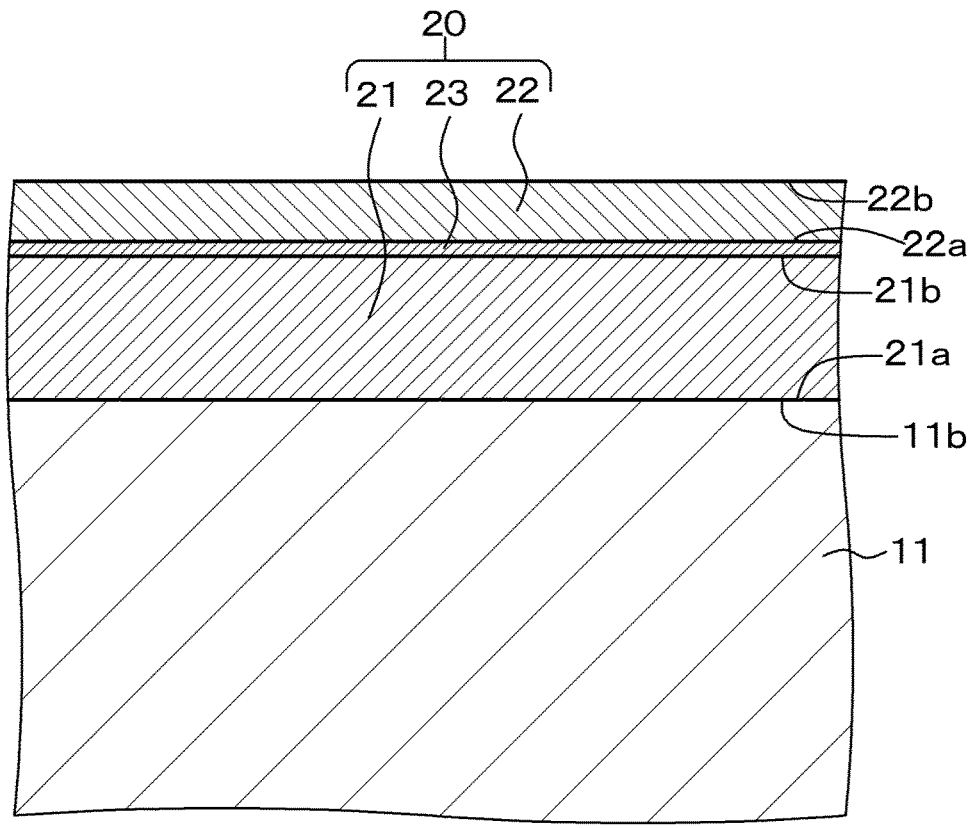
FIGS. 13A and 13B are schematic partial end views of a stacked structure and the like for explaining a manufacturing method for the light emitting element of Embodiment 4.
Figure 13B:
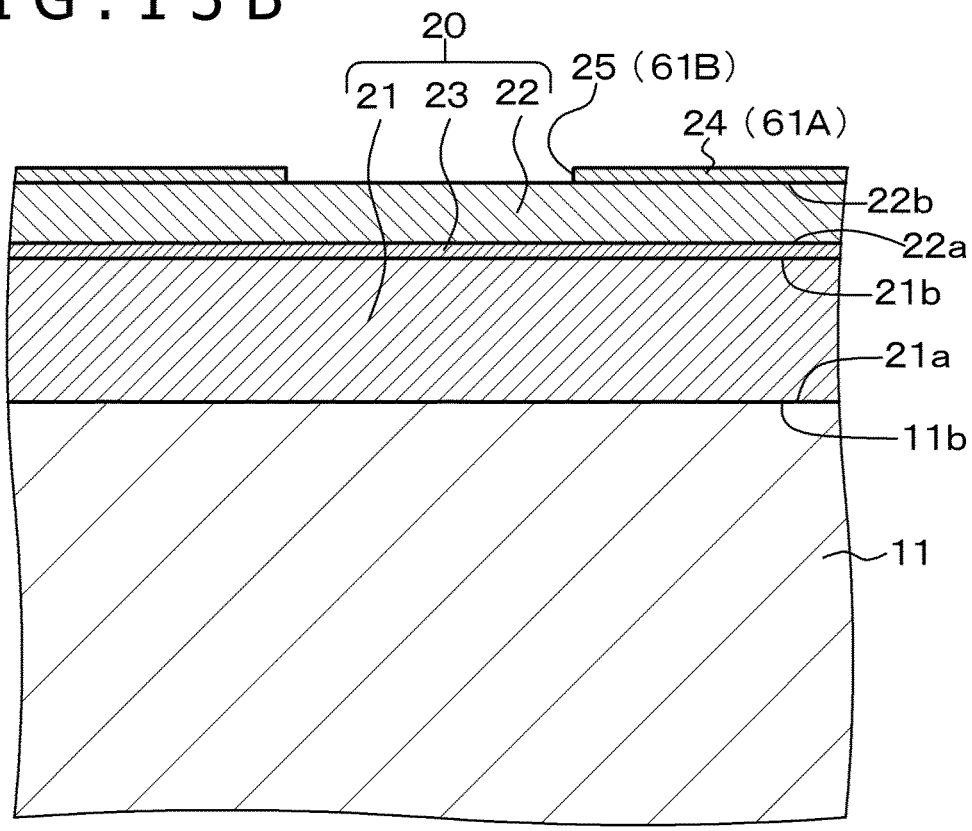
Figure 14:
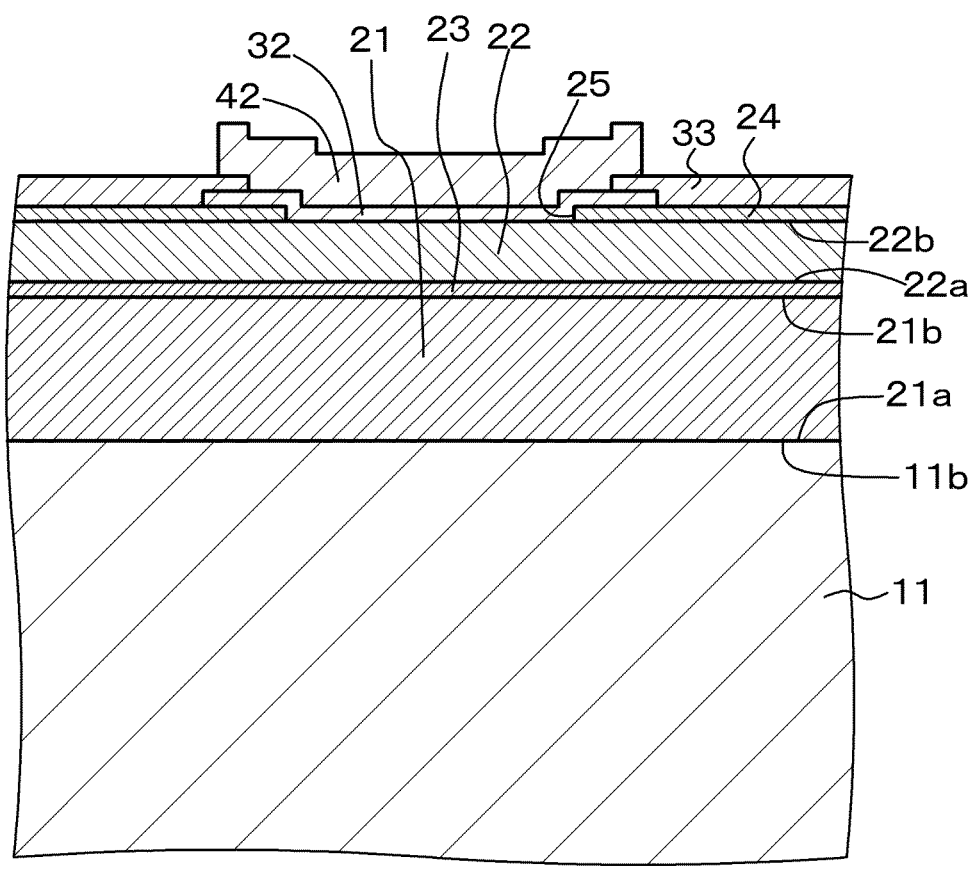
FIG. 14 is, subsequent to FIG. 13B, a schematic partial end view of the stacked structure and the like for explaining the manufacturing method for the light emitting element of Embodiment 4.

Next, an insulating layer (current constriction layer) 24 having an opening 25 and including SiO$_2$ is formed on the second surface 22b of the second compound semiconductor layer 22, based on a combination of a film forming method such as a CVD method, a sputtering method, or a vacuum deposition method with a wet etching method or a dry etching method (see FIG. 13B). By the insulating layer 24 having the opening 25, a current constriction region (a current injection region 61A and a current non-injection region 61B) is defined. In other words, the current injection region 61A is defined by the opening 25.

In order to obtain the current constriction region, an insulating layer (current constriction layer) including an insulating material (for example, SiO$_X$, SiN$_X$, or AlO$_X$) may be formed between the second electrode 32 and the second compound semiconductor layer 22, the second compound semiconductor layer 22 may be etched by an RIE method or the like to form a mesa structure, a layer of a part of the stacked second compound semiconductor layer 22 may partially be oxidized from a lateral side to form the current constriction region, or an impurity may be ion-injected into the second compound semiconductor layer 22 to form a region lowered in conductivity, or these method may be combined, as required. It is to be noted, however, that the second electrode 32 should be electrically connected to the part of the second compound semiconductor layer 22 in which a current flows due to current constriction.
[Step-420]

Thereafter, the second electrode 32 and the second light reflection layer 42 are formed over the second compound semiconductor layer 22. Specifically, over the range from the second surface 22b of the second compound semiconductor layer 22 exposed at a bottom surface of the opening 25 (the current injection region 61A) to a position on the insulating layer 24, the second electrode 32 is formed based, for example, on a lift-off method, and, further, a pad electrode 33 is formed based on a combination of a film forming method such as a sputtering method or a vacuum deposition method with a patterning method such as a wet etching method or a dry etching method. Next, over the range from a position on the second electrode 32 to a position on the pad electrode 33, the second light reflection layer 42 is formed based on a combination of a film forming method such as a sputtering method or a vacuum deposition method with a patterning method such as a wet etching method or a dry etching method. The second light reflection layer 42 on the second electrode 32 has a flat shape. In this way, a structure depicted in FIG. 14 can be obtained.

[Step-430]

Figure 15:
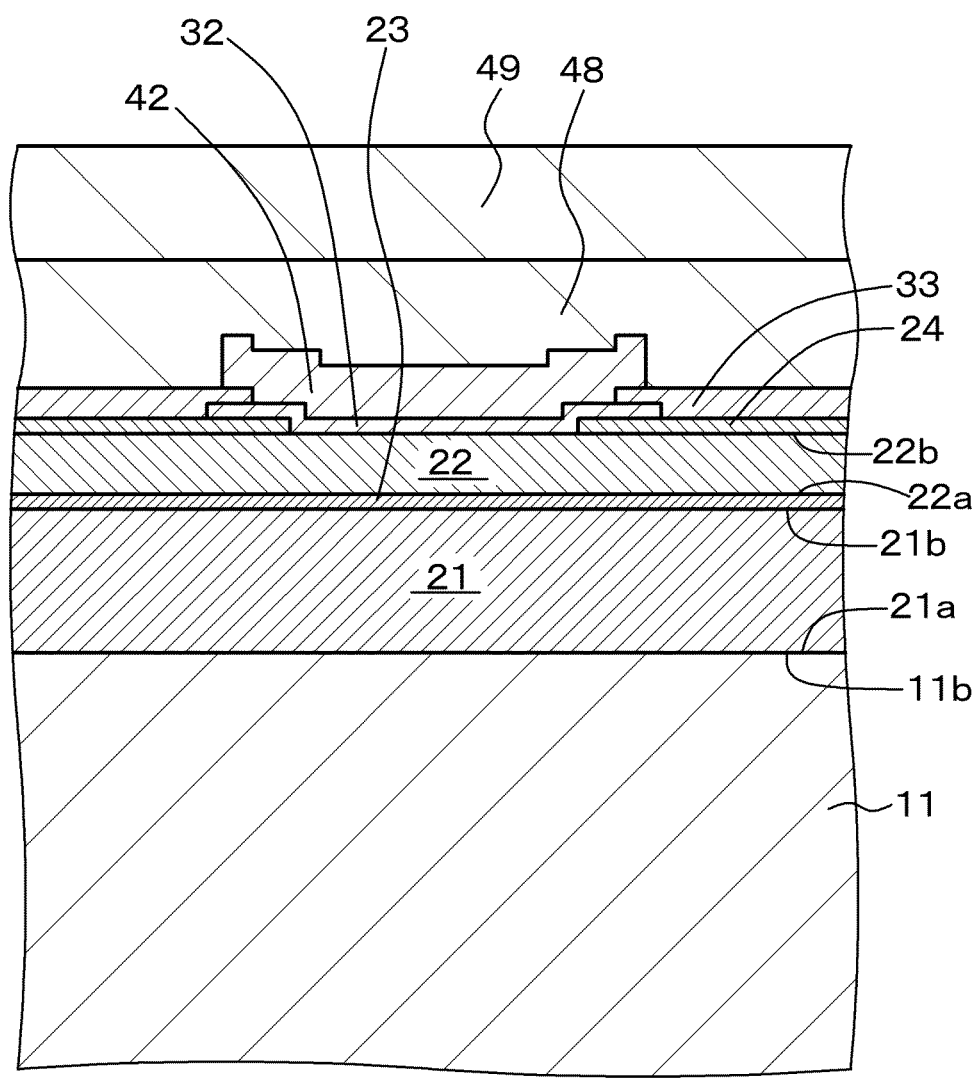
FIG. 15 is, subsequent to FIG. 14, a schematic partial end view of the stacked structure and the like for explaining the manufacturing method for the light emitting element of Embodiment 4.

Subsequently, the second light reflection layer 42 is fixed to a support substrate 49 through a joint layer 48 (see FIG. 15). Specifically, the second light reflection layer 42 is fixed to the support substrate 49, which includes a sapphire substrate, by use of the joint layer 48 including an adhesive.

[Step-440]

Figure 16:
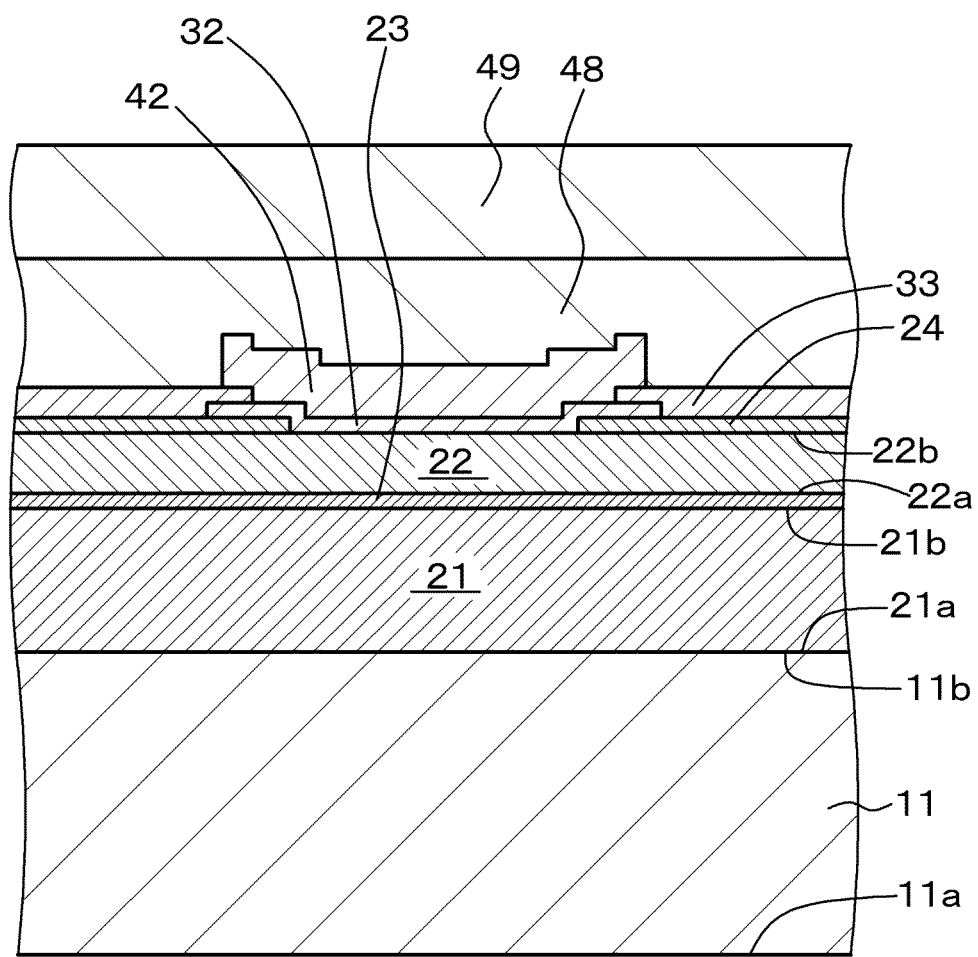
FIG. 16 is, subsequent to FIG. 15, a schematic partial end view of the stacked structure and the like for explaining the manufacturing method for the light emitting element of Embodiment 4.
Figure 17:
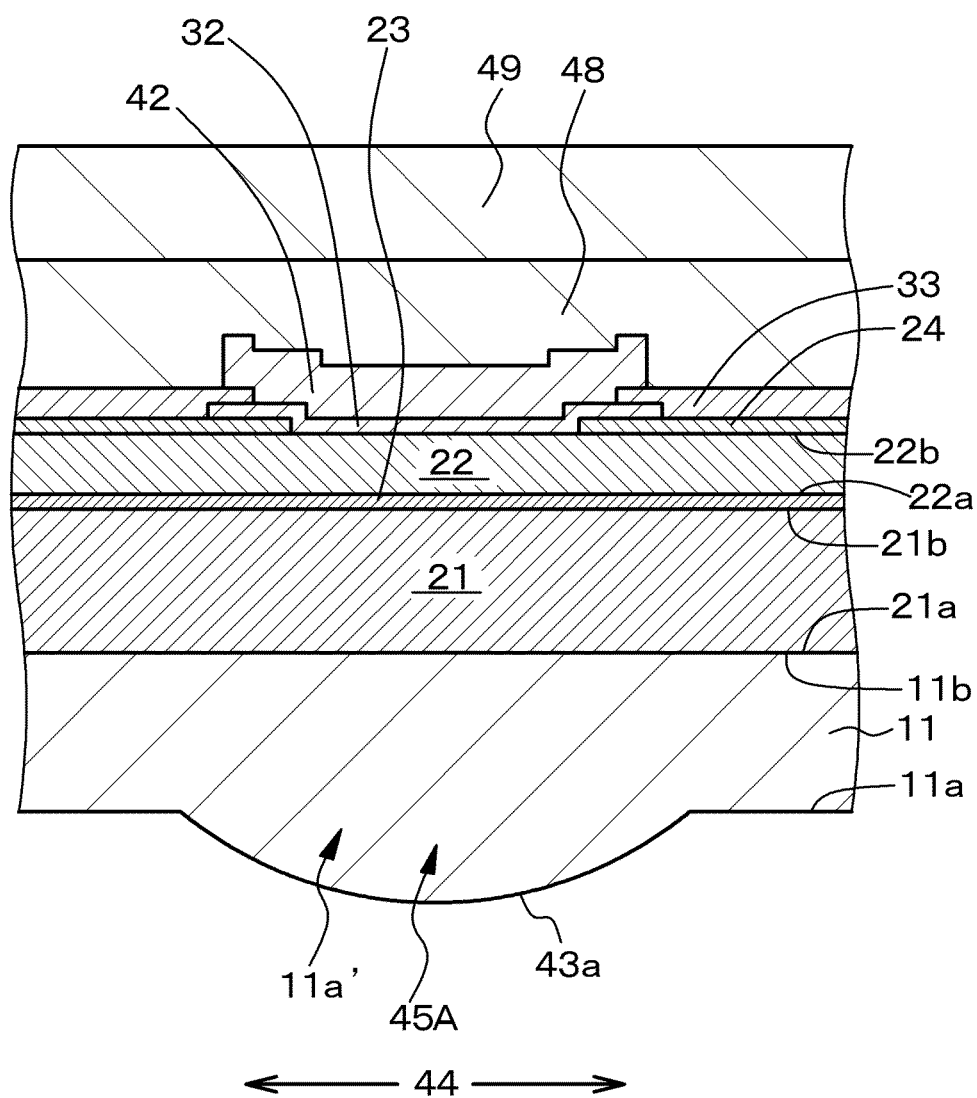
FIG. 17 is, subsequent to FIG. 16, a schematic partial end view of the stacked structure and the like for explaining the manufacturing method for the light emitting element of Embodiment 4.
Figure 18:
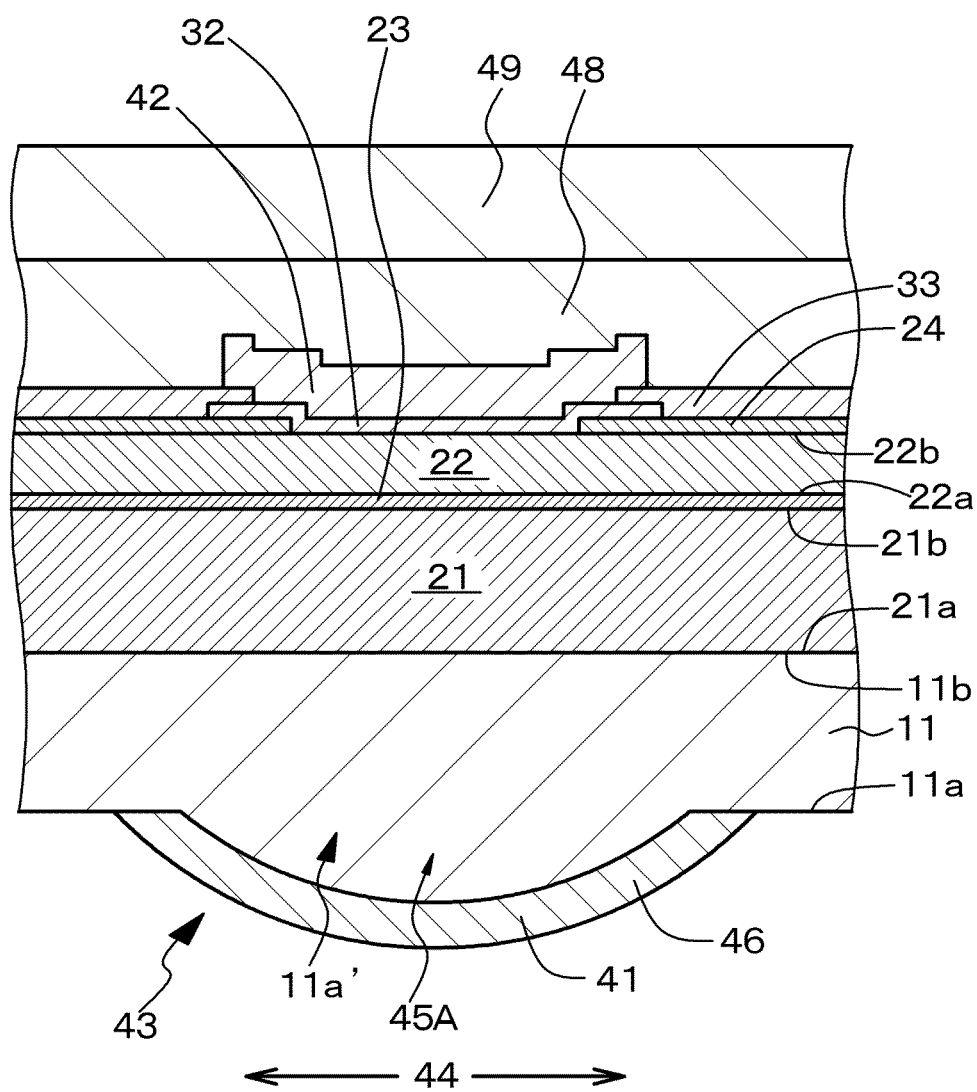
FIG. 18 is, subsequent to FIG. 17, a schematic partial end view of the stacked structure and the like for explaining the manufacturing method for the light emitting element of Embodiment 4.

Next, a compound semiconductor substrate 11 is thinned based on a mechanical polishing method or a CMP method, and, further, a first surface 11a of the compound semiconductor substrate 11 is subjected to mirror finishing (see FIG. 16). The value of surface roughness Ra of the first surface 11a of the compound semiconductor substrate 11 is preferably equal to or less than 10 nm. The surface roughness Ra is defined in JIS B-610:2001, and, specifically, can be measured based on observation under an AFM or a section TEM. Then, a base section 45A including a projecting section 11a' is formed at an exposed surface (first surface 11a) of the compound semiconductor substrate 11. Specifically, a patterned resist layer is formed on the first surface 11a of the compound semiconductor substrate 11 where the base section 45A is to be formed, and the resist layer is heated to put the resist layer into reflow, whereby a resist pattern is obtained. The same shape as (or a shape similar to) the shape of the projecting section 11a' is imparted to the resist pattern. Then, the resist pattern and the first surface 11a of the compound semiconductor substrate 11 are etched back by use of an RIE method or the like, whereby the base section 45A including the projecting section 11a' can be formed on the exposed surface (first surface 11a) of the compound semiconductor substrate 11 (see FIG. 17).

[Step-450]

Thereafter, a multilayer light reflection film 46 is formed on at least a part of the base section 45A. Specifically, over the range from the exposed surface (first surface 11a) of the compound semiconductor substrate 11 to a position on the base section 45A, the multilayer light reflection film 46 is formed based on a known method such as a sputtering method or a vacuum deposition method. Then, an unrequired portion of the multilayer light reflection film 46 is removed based on a patterning method such as a wet etching method or a dry etching method to obtain a first light reflection layer 41 (see FIG. 18), and a first electrode 31 is formed on the first surface 11a of the compound semiconductor substrate 11 by a combination of a film forming method such as a sputtering method or a vacuum deposition method with a patterning method such as a wet etching method or a dry etching method, whereby the first electrode 31 electrically connected to the first compound semiconductor layer 21 can be obtained.

[Step-460]

Then, the support substrate 49 is peeled off. In this way, a structure depicted in FIG. 12 can be obtained. Thereafter, what is generally called element isolation is conducted to isolate the light emitting element, and side surfaces and exposed surfaces of the stacked structure and the light emitting structure are coated with an insulating film including $SiO_2$, for example. Next, packaging or sealing is conducted, to complete the light emitting element of Embodiment 4.

Note that after the compound semiconductor substrate 11 is thinned and, further, the mirror finishing is conducted, in [Step-440], the support substrate 49 may be peeled off.

Figure 19:
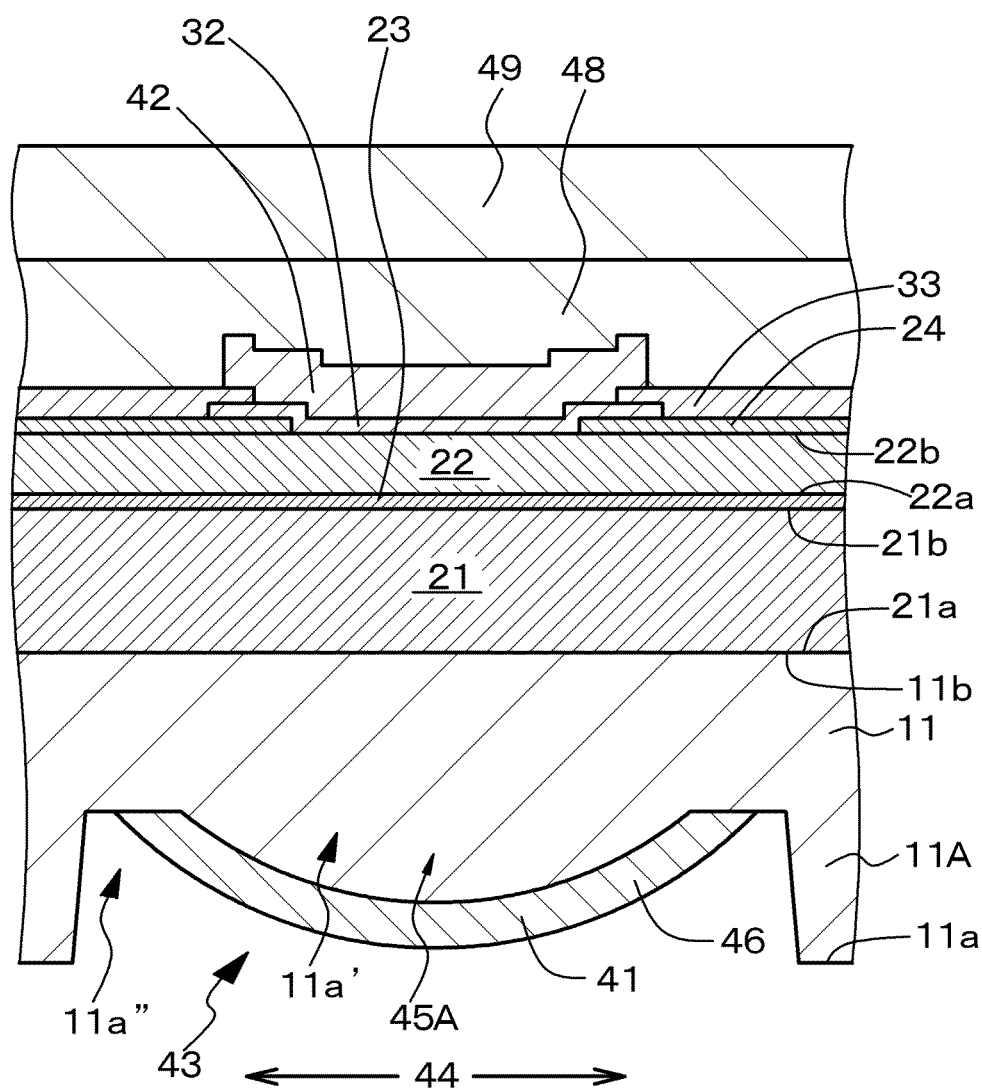
FIG. 19 is a schematic partial end view of a stacked structure and the like of a modification of the light emitting element of Embodiment 4.

In addition, as a modification of the light emitting element of Embodiment 4, after the compound semiconductor substrate 11 is thinned and, further, the mirror finishing is conducted, in [Step-440], but before the base section 45A including the projecting section 11a' is formed on the exposed surface (first surface 11a) of the compound semiconductor substrate 11, a recess 11a'' is formed in a region of the exposed surface (first surface 11a) of the compound semiconductor substrate 11 where the base section 45A is to be formed, a patterned resist layer is formed in the recess 11a'', and the resist layer is heated to put the resist layer into reflow, whereby a resist pattern is obtained. The same shape as (or a shape similar to) the shape of the projecting section 11a' is imparted to the resist pattern. Then, the resist pattern and the part of the recess 11a'' may be etched back by use of an RIE method or the like, whereby the base section 45A including the projecting section 11a' may be formed in the recess 11a'' in the exposed surface (first surface 11a) of the compound semiconductor substrate 11 (see FIG. 19). Next, the multilayer light reflection film 46 is formed on the whole surface inclusive of the upper side of the base section 45A, based on a known method such as a sputtering method or a vacuum deposition method. Then, an unrequired portion of the multilayer light reflection film 46 is removed based on a patterning method such as a wet etching method or a dry etching method, whereby the first light reflection layer 41 can be obtained. In other words, a protuberant-shaped portion 11A is formed in the periphery of the first light reflection layer 41, and the first light reflection layer 41 does not project from the protuberant-shaped portion 11A (including the exposed surface (first surface 11a) of the compound semiconductor substrate 11), whereby the first light reflection layer 41 can be protected.

Alternatively, simultaneously with the formation of the base section 45A including the projecting section 11a' on the exposed surface (first surface 11a) of the compound semiconductor substrate 11, in [Step-440], the exposed surface (first surface 11a) of the compound semiconductor substrate 11 may be formed with a projection section such as to surround the base section 45A while being spaced from the base section 45A. Specifically, a patterned resist layer is formed on the first surface 11a of the compound semiconductor substrate 11 where the base section 45A is to be formed, and the resist layer is heated to put the resist layer into reflow, whereby a resist pattern is obtained. The same shape as (or a shape similar to) the shape of the projecting section 11a' is imparted to the resist pattern. In addition, a resist layer is formed on the part of the first surface 11a of the compound semiconductor substrate 11 where the projection section is to be formed, such as to surround the resist pattern while being spaced from the resist pattern. Then, the resist pattern, the resist layer, and the first surface 11a of the compound semiconductor substrate 11 are etched back by use of an RIE method or the like, whereby the base section 45A including the projecting section 11a' can be formed on the exposed surface (first surface 11a) of the compound semiconductor substrate 11, and, concurrently, the projection section can be formed. The projection section is formed in the periphery of the first light reflection layer 41, and the first light reflection layer 41 does not project from the projection section (including the exposed surface (first surface 11a) of the compound semiconductor substrate 11), whereby the first light reflection layer 41 can be protected.

Figure 20:
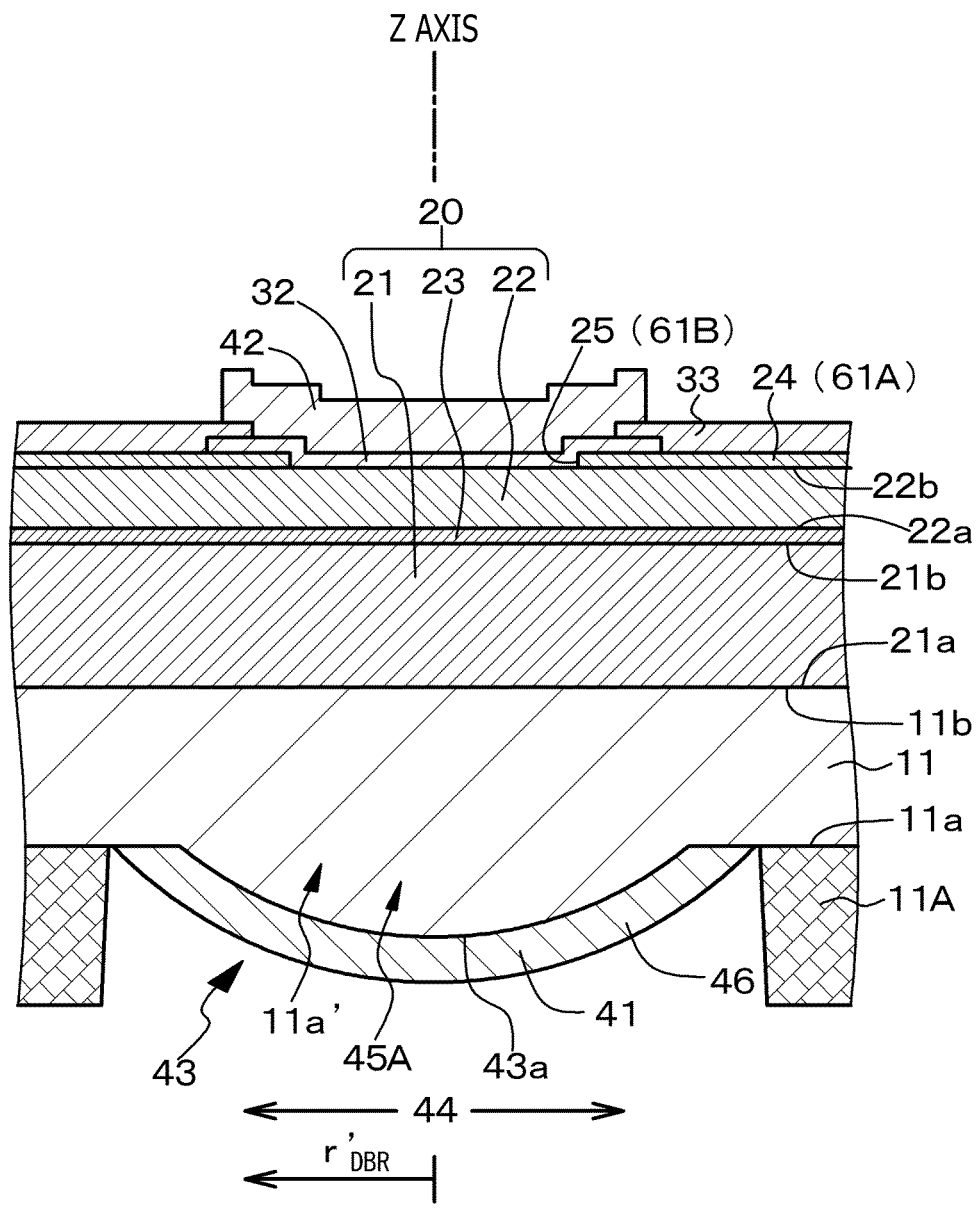
FIG. 20 is a schematic partial end view of the stacked structure and the like of a modification of the light emitting element of Embodiment 4.

Alternatively, after the first light reflection layer 41 is obtained by forming the multilayer light reflection film 46 on at least a part of the base section 45A, in [Step-450] above, a protuberant-shaped portion 11A surrounding the first light reflection layer 41 may be formed on the first surface 11a of the compound semiconductor substrate 11 (see FIG. 20). It is sufficient if the protuberant-shaped portion 11A includes, for example, a dielectric material or a metallic material. Thus, the protuberant-shaped portion 11A is formed in the periphery of the first light reflection layer 41, and the first light reflection layer 41 does not project from the protuberant-shaped portion 11A, whereby the first light reflection layer 41 can be protected.

In the light emitting element of Embodiment 4, the first light reflection layer has the recessed mirror section. Therefore, the light spreading by diffraction with the active layer as a starting point and being incident on the first light reflection layer can securely be reflected toward the active layer and can be concentrated on the active layer. Accordingly, an increase in diffraction loss can be avoided even when the cavity length $L_{OR}$ is equal to or more than $1 \times 10^{-5}$ m, resulting in that laser oscillation can be securely performed, and, since the cavity length $L_{OR}$ can be set to be equal to or more than $1 \times 10^{-5}$ m, the problem of thermal saturation can be mitigated. In addition, since the cavity length $L_{OR}$ can be equal to or more than $1 \times 10^{-5}$ m, allowance in the manufacturing process of the light emitting element is enhanced, resulting in that enhanced yield can be realized.

Further, except for Embodiment 7 to be described below, in the manufacturing process of the light emitting element, the GaN substrate is used, but a GaN-based compound semiconductor is not formed based on a method for lateral epitaxial growth such as an ELO method. Therefore, as the GaN substrate, not only a polar GaN substrate but also a semi-polar GaN substrate and a nonpolar GaN substrate can be used. While the use of the polar GaN substrate tends to lower the light emission efficiency due to a piezoelectric effect in the active layer, the use of the nonpolar GaN substrate or the semi-polar GaN substrate makes it possible to solve or mitigate such a problem.

Embodiment 5

Figure 21:
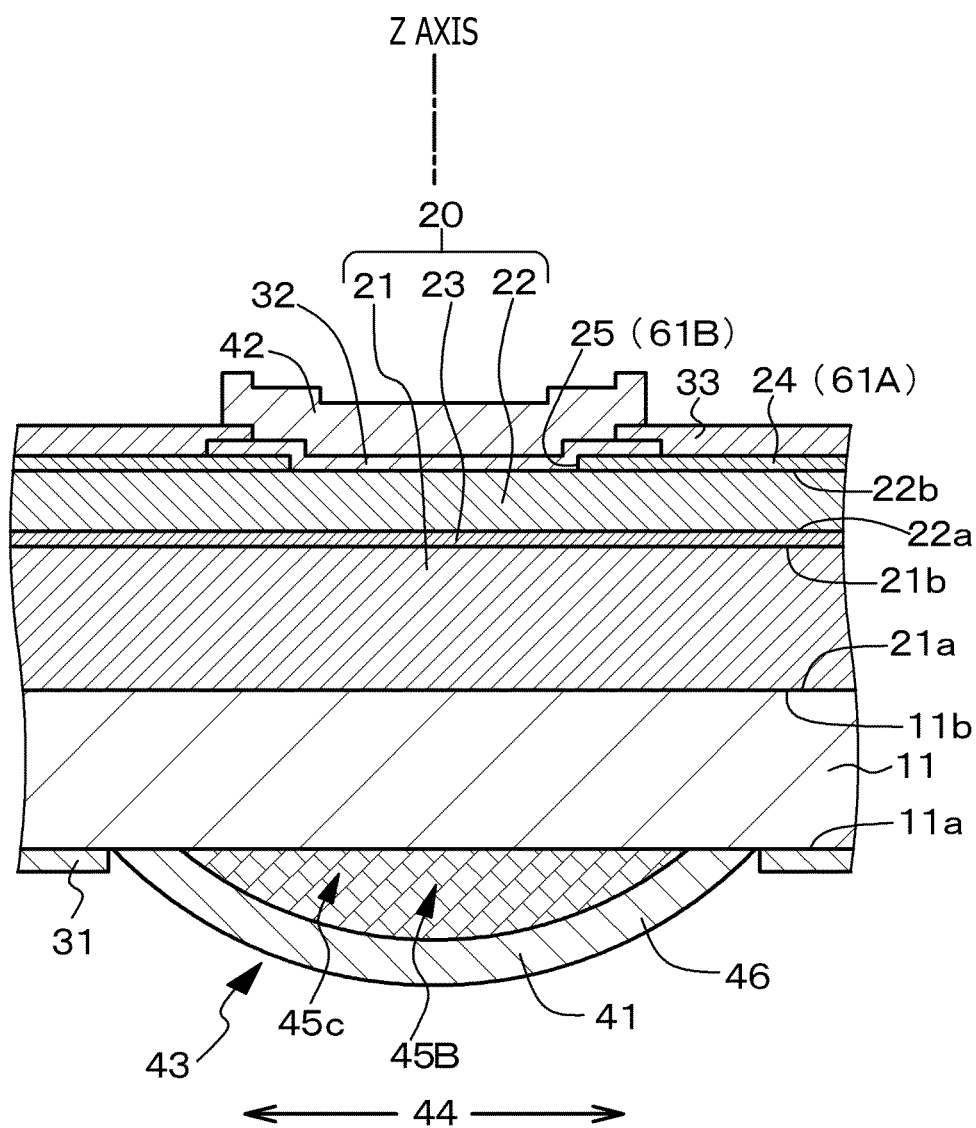
FIG. 21 is a schematic partial end view of a light emitting element of Embodiment 5.

Embodiment 5 is a modification of Embodiment 4 and relates to a light emitting element of the (4-B)th configuration. In the light emitting element of Embodiment 5 of which a schematic partial end view is depicted in FIG. 21, a recessed mirror section 43 of a first light reflection layer 41 includes a base section 45B including a projecting section 45c formed on a compound semiconductor substrate 11 (specifically, on a first surface 11a of the compound semiconductor substrate 11) and a multilayer light reflection film 46 formed on at least a part of the base section 45B (specifically, on the surface of the base section 45B). Examples of the material constituting the base section 45B (projection section 45C) include transparent dielectric materials such as $TiO_2$, $Ta_2O_5$, or $SiO_2$, silicone resins, and epoxy resins.

In the light emitting element of Embodiment 5, after the compound semiconductor substrate 11 is thinned and mirror finishing is conducted in a step similar to [Step-440] of Embodiment 4, the base section 45B including the projecting section 45c is formed on the exposed surface (first surface 11a) of the compound semiconductor substrate 11. Specifically, for example, a $TiO_2$ layer or a $Ta_2O_5$ layer is formed on the exposed surface (first surface 11a) of the compound semiconductor substrate 11, next, a patterned resist layer is formed on the $TiO_2$ layer or the $Ta_2O_5$ layer where the base section 45B is to be formed, and the resist layer is heated to put the resist layer into reflow, whereby a resist pattern is obtained. The same shape as (or a shape similar to) the shape of the projecting section 45c is imparted to the resist pattern. Then, the resist pattern and the $TiO_2$ layer or the $Ta_2O_5$ layer are etched back, whereby the base section 45B including the projecting section 45c can be formed on the exposed surface (first surface 11a) of the compound semiconductor substrate 11. Subsequently, over the range from the exposed surface (first surface 11a) of the compound semiconductor substrate 11 to a position on the base section 45B, the multilayer light reflection film 46 is formed based on a known method. Thereafter, an unrequired portion of the multilayer light reflection film 46 is removed to obtain the first light reflection layer 41, after which a first electrode 31 is formed on the first surface 11a of the compound semiconductor substrate 11, whereby the first electrode 31 electrically connected to the first compound semiconductor layer 21 can be obtained.

Except for the above-mentioned points, the configuration and structure of the light emitting element of Embodiment 5 can be made similar to the configuration and structure of the light emitting element of Embodiment 4, and, therefore, detailed description thereof is omitted. Note that the modification of the light emitting element of Embodiment 4 is also applicable to Embodiment 5.

Embodiment 6

Figure 22:
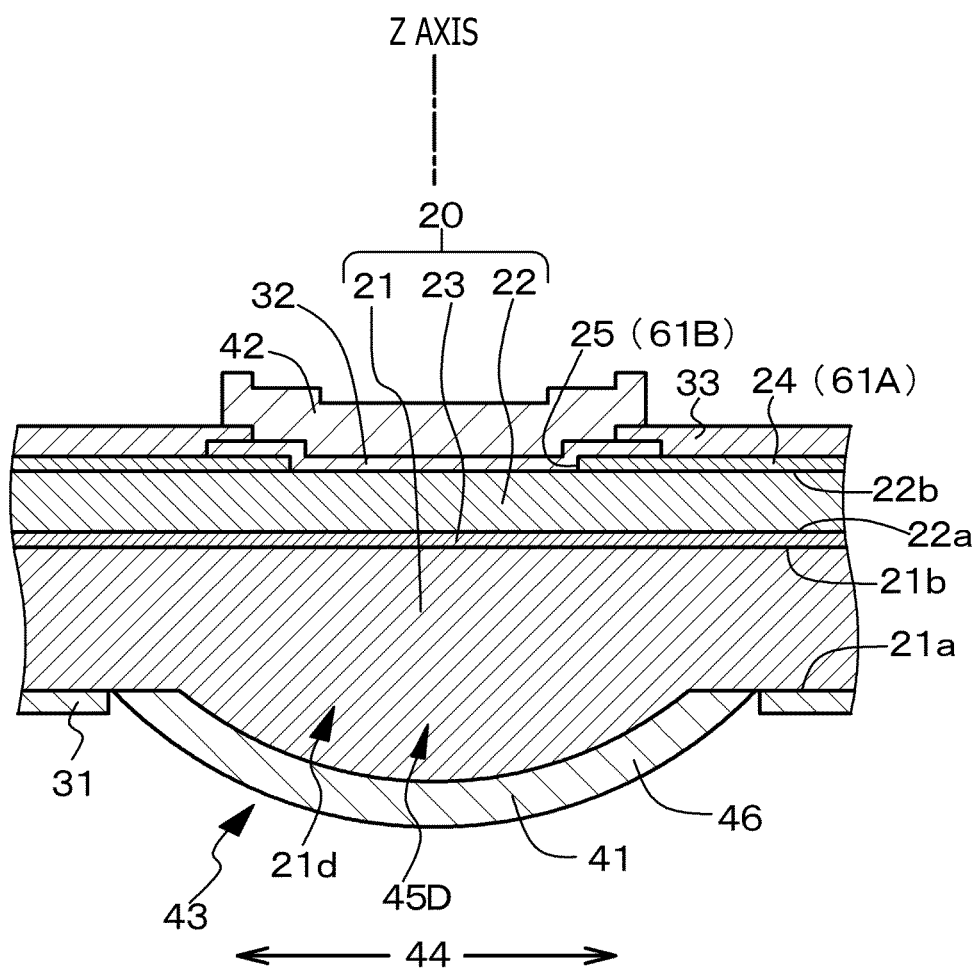
FIG. 22 is a schematic partial end view of a light emitting element of Embodiment 6.
Figure 23:
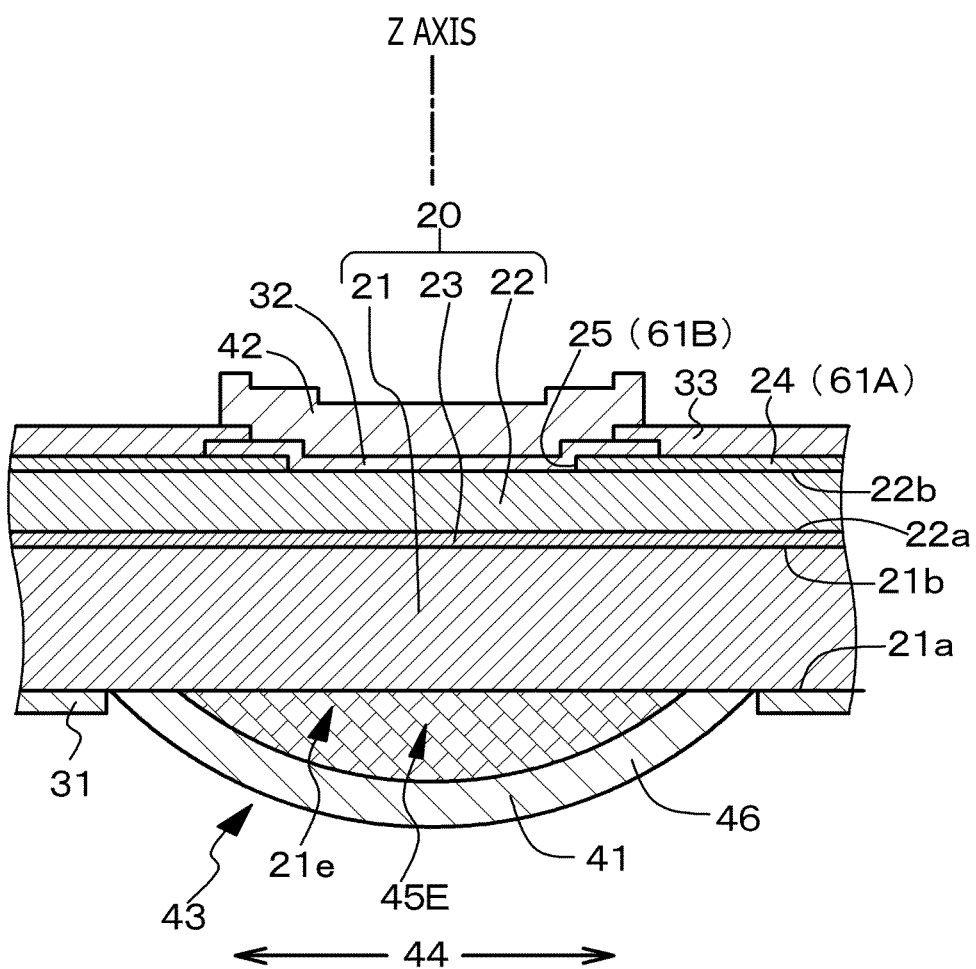
FIG. 23 is a schematic partial end view of a modification of the light emitting element of Embodiment 6.

Embodiment 6 is also a modification of Embodiment 4 or Embodiment 5 and relates to a light emitting element of the fifth configuration. In the light emitting element of Embodiment 6 of which a schematic partial end view is depicted in FIG. 22, a first light reflection layer 41 is formed on a first surface 21a of a first compound semiconductor layer 21. In manufacturing the light emitting element of Embodiment 6, in a step similar to [Step-440] of Embodiment 4, a light emitting element production substrate 11 is removed, to expose the first surface 21a of the first compound semiconductor layer 21. Then, similarly to Embodiment 4, a patterned resist layer is formed on the first surface 21a of the first compound semiconductor layer 21 where a base section 45D is to be formed, and the resist layer is heated to put the resist layer into reflow, whereby a resist pattern is obtained. The same shape as (or a shape similar to) the shape of a projecting section 21d is imparted to the resist pattern. Then, the resist pattern and the first surface 21a of the first compound semiconductor layer 21 are etched back, whereby the base section 45D including the projecting section 21d can be formed on the first surface 21a of the first compound semiconductor layer 21. Alternatively, in a modification of the light emitting element of Embodiment 6 of which a schematic partial end view is depicted in FIG. 23, for example, a $TiO_2$ layer or a $Ta_2O_5$ layer is formed on the first surface 21a of the first compound semiconductor layer 21, next, a patterned resist layer is formed on the $TiO_2$ layer or the $Ta_2O_5$ layer where a base section 45E is to be formed, and the resist layer is heated to put the resist layer into reflow, whereby a resist pattern is obtained. The same shape as (or a shape similar to) the shape of a projecting section 21e is imparted to the resist pattern. Then, the resist pattern and the $TiO_2$ layer or the $Ta_2O_5$ layer are etched back, whereby the base section 45E including the projecting section 21e can be formed on the first surface 21a of the first compound semiconductor layer 21.

Except for the above-mentioned points, the configurations and structures of the light emitting element of Embodiment 6 and the modification thereof can be made similar to the configuration and structure of the light emitting element of Embodiment 4 or Embodiment 5, and, therefore, detailed description thereof is omitted. Note that a support substrate 49 and a joint layer 48 may be left unremoved.

Embodiment 7

Embodiment 7 is a modification of Embodiment 6. A schematic partial end view of a light emitting element of Embodiment 7 is substantially similar to FIG. 23, and the configuration and structure of the light emitting element of Embodiment 7 may be substantially similar to the configuration and structure of the light emitting element of Embodiment 6; therefore, detailed description thereof is omitted.

Figure 24A:
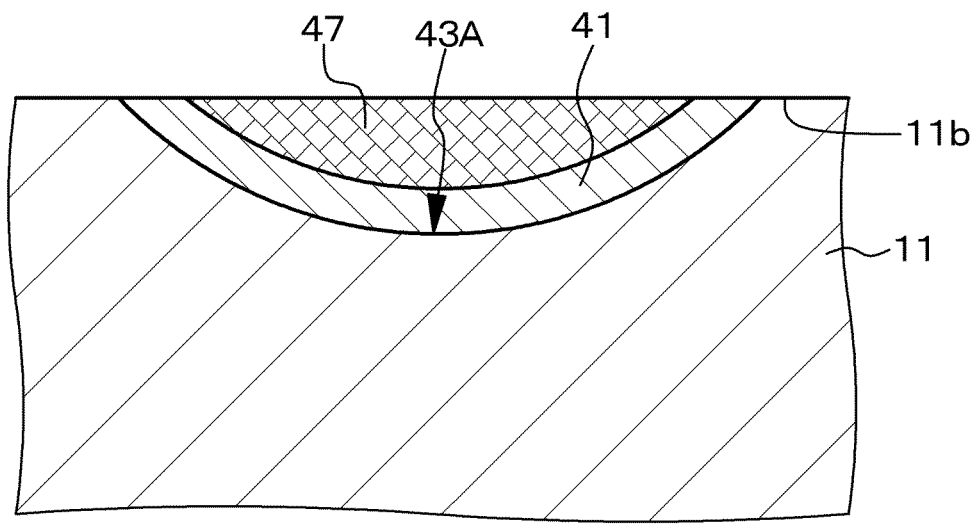
FIGS. 24A and 24B are schematic partial end views of a stacked structure and the like for explaining a manufacturing method for a light emitting element of Embodiment 7.

In Embodiment 7, first, a second surface 11b of a light emitting element production substrate 11 is formed with a recess 43A for forming a recessed mirror section 43. Then, a first light reflection layer 41 including a multilayer film is formed on the second surface 11b of the light emitting element production substrate 11, after which a planarization film 47 is formed on the first light reflection layer 41, and the planarization film 47 and the first light reflection layer 41 are subjected to a planarizing treatment, whereby a part of the second surface 11b of the light emitting element production substrate 11 is exposed, while the planarization film 47 and the first light reflection layer 41 are left (see FIG. 24A). The plan-view shape of the first light reflection layer 41 is circular. It is to be noted, however, that the shape of the first light reflection layer 41 is not limited to this.

Figure 24B:
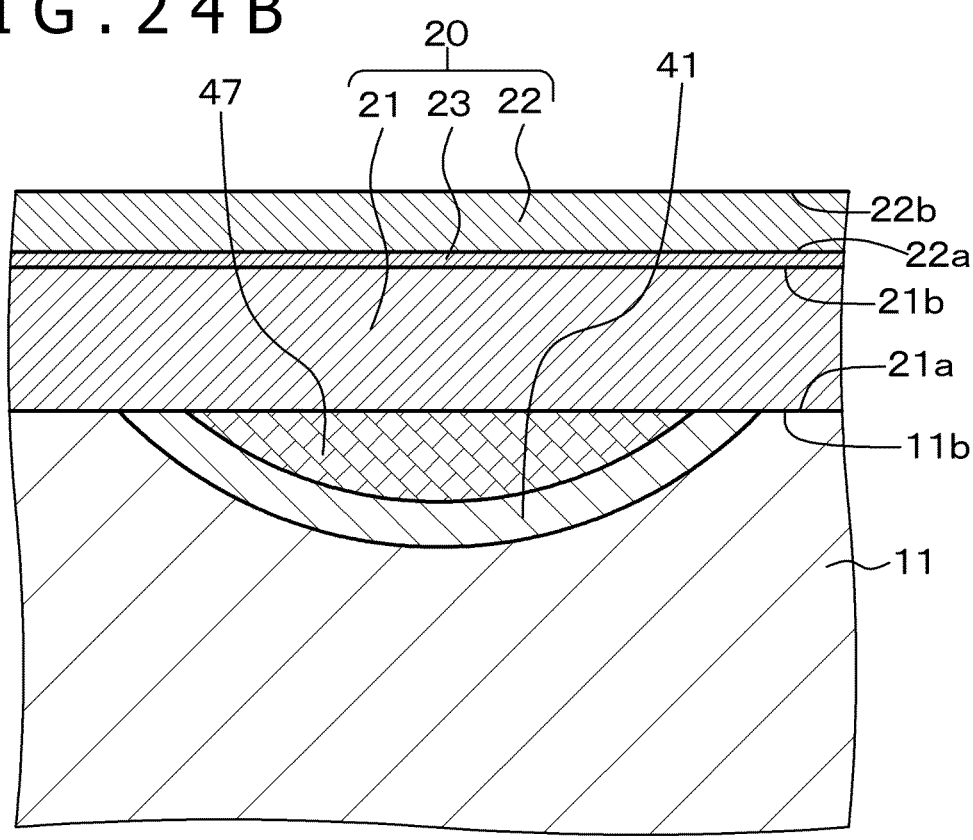

Next, on the light emitting element production substrate 11 including the first light reflection layer 41, a light emitting structure 20 is formed based on lateral growth by use of a method for lateral epitaxial growth such as an ELO method (see FIG. 24B). Thereafter, [Step-410] and [Step-420] of Embodiment 4 are carried out. Then, the light emitting element production substrate 11 is removed, and a first electrode 31 is formed on the first surface 21a of the first compound semiconductor layer 21 exposed. Alternatively, without removing the light emitting element production substrate 11, the first electrode 31 is formed on a first surface 11a of the light emitting element production substrate 11. Thereafter, what is generally called element isolation is conducted to isolate the light emitting element, and side surfaces and exposed surfaces of the stacked structure and the light emitting structure are coated with an insulating film including $SiO_2$, for example. Then, packaging or sealing is conducted, whereby the light emitting element of Embodiment 7 can be completed.

Embodiment 8

Embodiment 8 is a modification of Embodiments 4 to 7 and relates to a light emitting element of the first configuration. As mentioned above, a current constriction region (a current injection region 61A and a current non-injection region 61B) is defined by an insulating layer 24 having an opening 25. In other words, the current injection region 61A is defined by the opening 25. Specifically, in the light emitting element of Embodiment 8, a second compound semiconductor layer 22 is provided with the current injection region 61A and the current non-injection region 61B surrounding the current injection region 61A, and the shortest distance Do from the area center of gravity of the current injection region 61A to a boundary 61C between the current injection region 61A and the current non-injection region 61B satisfies the above-mentioned formulas (1-1) and (1-2).

In the light emitting element of Embodiment 8, the radius $r'_{DBR}$ of an effective region in a recessed mirror section 43 of a first light reflection layer 41 satisfies $$\omega_0 \le r'_{DBR} \le 20 \cdot \omega_0.$$

In addition, $D_{CI} \ge \omega_0$ is satisfied. Further, $R_{DBR} \le 1 \times 10^{-3}$ m is satisfied. Specifically, $D_{CI}$=4 µm,
$\omega_0$=1.5 µm,
$L_{OR}$=50 µm,
$R_{DBR}$=60 µm, and
$\lambda_0$=525 nm may be mentioned as examples. Besides, as the diameter of the opening 25, 8 µm may be mentioned as an example. As the GaN substrate, a substrate with a plane obtained by inclining a c-plane by approximately 75 degrees in an m-axis direction as a principal plane is used. In other words, the GaN substrate has a {20-21} plane which is a semi-polar plane, as a principal plane. Note that such a GaN substrate can also be used in other Embodiments.

A deviation between the center axis (Z axis) of a recessed mirror section 43 and the current injection region 61A in XY plane directions causes worsening of characteristics of the light emitting element. While both patterning for forming the recessed mirror section 43 and patterning for forming the opening 25 are often conducted using a lithography technique, in this case, the positional relation between the two is often deviated in the XY plane according to the performance of an exposure apparatus. Particularly, the opening 25 (current injection region 61A) is positioned by performance of alignment from the side of the second compound semiconductor layer 22. On the other hand, the recessed mirror section 43 is positioned by performance of alignment from the side of the compound semiconductor substrate 11. In view of this, in the light emitting element of Embodiment 8, the opening 25 (current injection region 61) is formed to be larger than a region into which light is converged by the recessed mirror section 43, whereby a structure in which oscillation characteristics are not affected even when a deviation is generated between the center axis (Z axis) of the recessed mirror section 43 and the current injection region 61A in the XY plane directions is realized.

Specifically, in the case where the region to which light reflected by the first light reflection layer is concentrated is not included in the current injection region corresponding to a region in which an active layer has a gain due to current injection, induced emission of light from carriers may be hindered, which may lead to hindrance of laser oscillation. However, with the above-mentioned formulas (1-1) and (1-2) satisfied, it can be ensured that the region to which the light reflected by the first light reflection layer is concentrated is included in the current injection region, so that laser oscillation can securely be achieved.

Embodiment 9

Figure 25:
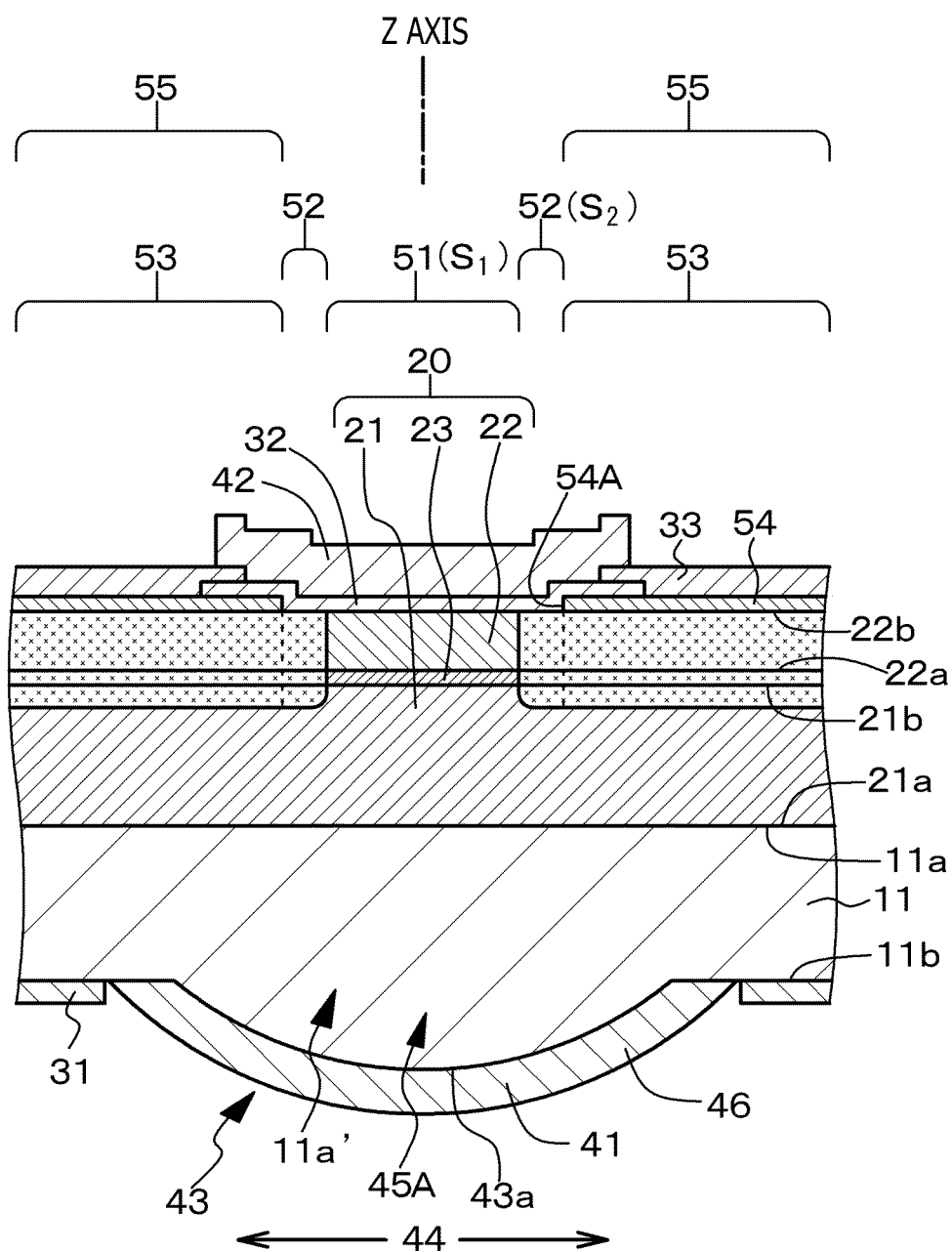
FIG. 25 is a schematic partial end view of a light emitting element of Embodiment 9.

Embodiment 9 is a modification of Embodiments 4 to 8 and relates to a light emitting element of the second configuration, specifically, a light emitting element of the (2-A) th configuration. A schematic partial end view of the light emitting element of Embodiment 9 is depicted in FIG. 25.

Incidentally, for controlling a flow path (current injection region) for a current flowing between a first electrode and a second electrode, a current non-injection region is formed such as to surround the current injection region. In a GaAs-based surface-emitting laser element (a surface-emitting laser element including a GaAs-based compound semiconductor), an active layer is oxidized from the outside along the XY plane, whereby the current non-injection region surrounding the current injection region can be formed. The oxidized region (current non-injection region) of the active layer is lowered in refractive index as compared to the non-oxidized region (current injection region). As a result, the optical path length (represented by the product of the refractive index and physical distance) of the resonator is shorter in the current non-injection region than in the current injection region. Then, as a result, a kind of "lens effect" is generated, producing an action to confine laser light into a central portion of the surface-emitting laser element. In general, light tends to spread due to a diffraction effect; therefore, laser light reciprocating in the resonator is gradually dissipated to the outside of the resonator (diffraction loss), producing adverse influence such as an increase in the threshold current. However, the lens effect compensates for the diffraction loss, so that an increase in the threshold current or the like can be restrained.

However, in the light emitting element including a GaN-based compound semiconductor, it is difficult, on the basis of characteristics of material, to (laterally) oxidize the active layer from outside along the XY plane. Therefore, as has been described in Embodiments 4 to 8, an insulating layer 24 having an opening 25 and including $SiO_2$ is formed on a second compound semiconductor layer 22, a second electrode 32 including a transparent conductive material is formed over the range from the second compound semiconductor layer 22 exposed at a bottom portion of the opening 25 to a position on the insulating layer 24, and a second light reflection layer 42 including a stacked structure of insulating materials is formed on the second electrode 32. With the insulating layer 24 thus formed, a current non-injection region 61B is formed. Then, the part of the second compound semiconductor layer 22 located in the opening 25 provided in the insulating layer 24 becomes a current injection region 61A.

In the case where the insulating layer 24 is formed on the second compound semiconductor layer 22, the cavity length in the region where the insulating layer 24 is formed (current non-injection region 61B) is longer than the cavity length in the region where the insulating layer 24 is not formed (current injection region 61A), by an amount corresponding to the optical thickness of the insulating layer 24. Therefore, an action for causing the laser light reciprocating in the resonator formed by the two light reflection layers 41 and 42 of the surface-emitting laser element (light emitting element) to be dispersed or dissipated to the outside of the resonator would be generated. Such an action is referred to as a "reverse lens effect" for the sake of convenience. Then, as a result, an oscillation mode loss is generated in the laser light, the threshold current may be increased, or the slope efficiency may be worsened. Here, the "oscillation mode loss" is a physical quantity that causes a variation in the light field intensities in the fundamental mode and higher order mode in the laser light oscillated, and different oscillation mode losses are defined for the individual modes. Note that the "light field intensity" is a light field intensity of a function of distance L from the Z axis in the XY plane; in general, in the fundamental mode, the light field intensity is monotonously decreased with an increase in the distance L, but, in the higher order mode, the light field intensity repeats an increase and a decrease once or a plurality of times and is eventually reduced, with an increase in the distance L (see a conceptual diagram of (A) of FIG. 27). Note that in FIG. 27, a solid line represents the light field intensity distribution in the fundamental mode, while a broken line represents the light field intensity distribution in the higher order mode. In addition, while the first light reflection layer 41 is represented in a flat state in FIG. 27 for the sake of convenience, it has the recessed mirror section in practice.

The light emitting element of Embodiment 9 or light emitting elements of Embodiments 10 to 13 to be described below include (A) a light emitting structure 20 that includes, in a stacked state, a first compound semiconductor layer 21 having a first surface 21a and a second surface 21b opposite to the first surface 21a, an active layer (light emitting layer) 23 facing the second surface 21b of the first compound semiconductor layer 21, and a second compound semiconductor layer 22 having a first surface 22a facing the active layer 23 and a second surface 22b opposite to the first surface 22a, and that includes GaN-based compound semiconductors, (B) a mode loss action part (mode loss action layer) 54 that is provided on the second surface 22b of the second compound semiconductor layer 22 and that constitutes a mode loss action region 55 acting on a variation in an oscillation mode loss, (C) a second electrode 32 formed ranging from a position on the second surface 22b of the second compound semiconductor layer 22 to a position on the mode loss action part 54, (D) a second light reflection layer 42 formed on the second electrode 32, (E) a first light reflection layer 41 provided on the first surface 21a side of the first compound semiconductor layer 21, and (F) a first electrode 31 electrically connected to the first compound semiconductor layer 21.

The light emitting structure 20 is formed with a current injection region 51, a current non-injection inside region 52 surrounding the current injection region 51, and a current non-injection outside region 53 surrounding the current non-injection inside region 52, and an orthogonal projection image of the mode loss action region 55 and an orthogonal projection image of the current non-injection outside region 53 overlap with each other. In other words, the current non-injection outside region 53 is located on the lower side of the mode loss action region 55. Note that the orthogonal projection image of the mode loss action region 55 and the orthogonal projection image of the current non-injection outside region 53 may not necessarily overlap with each other in a region sufficiently spaced from the current injection region 51 into which a current is injected. Here, the light emitting structure 20 is formed with the current non-injection regions 52 and 53 into which a current is not injected, and, in the example illustrated, these regions are formed over the range from the second compound semiconductor layer 22 to a part of the first compound semiconductor layer 21, in the thickness direction. It is to be noted that the current non-injection regions 52 and 53 may be formed in a region on the second electrode side of the second compound semiconductor layer 22, may be formed in the whole part of the second compound semiconductor layer 22, or may be formed in the second compound semiconductor layer 22 and the active layer 23, in the thickness direction.

In addition, the mode loss action part (mode loss action layer) 54 includes a dielectric material such as $SiO_2$, and, in the light emitting element of Embodiment 9 or the light emitting elements of Embodiments 10 to 13 described below, the mode loss action part 54 is formed between the second electrode 32 and the second compound semiconductor layer 22. The optical thickness of the mode loss action part 54 may be a value deviated from an integral multiple of ¼ of the oscillation wavelength $\lambda_0$. Alternatively, the optical thickness $t_0$ of the mode loss action part 54 may be an integral multiple of ¼ of the oscillation wavelength $\lambda_0$. In other words, the optical thickness $t_0$ of the mode loss action part 54 may be such a thickness that the phase of light generated in the light emitting element is not disturbed and a standing wave of the light is not broken. It is to be noted, however, that the optical thickness $t_0$ may not necessarily be an integral multiple of ¼ of the oscillation wavelength $\lambda_0$ in a strict sense, and it is sufficient if $$(\lambda_0/4n_{m\text{-}loss}) \times m - (\lambda_0/8n_{m\text{-}loss}) \leq t_0 \leq (\lambda_0/4n_{m\text{-}loss}) \times 2m + (\lambda_0/8n_{m\text{-}loss})$$

is satisfied. Specifically, let the value of ¼ of the wavelength of the light generated in the light emitting element be "100," then the optical thickness $t_0$ of the mode loss action part 54 is preferably on the order of 25 to 250. Further, with these configurations adopted, the phase difference between the laser light passing through the mode loss action part 54 and the laser light passing through the current injection region 51 can be changed (the phase difference can be controlled), control of the oscillation mode loss can be performed with a higher degree of freedom, and the degree of freedom in designing the light emitting element can further be enhanced.

In Embodiment 9, the shape of the boundary between the current injection region 51 and the current non-injection inside region 52 is made circular (diameter: 8 μm), and the shape of the boundary between the current non-injection inside region 52 and the current non-injection outside region 53 is made circular (diameter: 12 μm). In other words, let the area of the orthogonal projection image of the current injection region 51 be $S_1$ and let the area of the orthogonal projection image of the current non-injection inside region 52 be $S_2$, then, $$0.01 \leq S_1/(S_1+S_2) \leq 0.7$$

is satisfied. Specifically, $$S_1/(S_1+S_2) = 8^2/12^2 = 0.44.$$

In the light emitting element of Embodiment 9 or the light emitting elements of Embodiments 10, 11, and 13 described below, let the optical distance from the active layer 23 in the current injection region 51 to the second surface of the second compound semiconductor layer 22 be $L_2$ and let the optical distance from the active layer 23 in the mode loss action region 55 to a top surface of the mode loss action part 54 (a surface facing the second electrode 32) be $L_0$, then, $$L_0 > L_2$$

is satisfied. Specifically, a setting of $$L_0/L_2 = 1.5$$

is adopted. The laser light having a generated higher order mode is dissipated toward the outside of the resonator structure including the first light reflection layer 41 and the second light reflection layer 42, by the mode loss action region 55, whereby an oscillation mode loss is increased. In other words, the light field intensities in the fundamental mode and the higher order mode generated are reduced in going away from the Z axis in the orthogonal projection image of the mode loss action region 55, by the presence of the mode loss action region 55 acting on a variation in the oscillation mode loss (see a conceptual diagram of (B) of FIG. 27); in this case, a reduction in the light field intensity in the higher order mode is larger than a reduction in the light field intensity in the fundamental mode, so that the fundamental mode can be stabilized more, lowering in the threshold current can be realized, and the relative light field intensity of the fundamental mode can be increased. Moreover, since the part of a skirt of the light field intensity in the higher order mode is located farther from the current injection region than in the conventional light emitting element (see (A) of FIG. 27), lowering in the influence of the reverse lens effect can be realized. Note that, to begin with, in the case where the mode loss action part 54 including $SiO_2$ is not provided, mixing of oscillation modes would be generated.

The first compound semiconductor layer 21 includes an n-GaN layer, the active layer 23 includes a quintuple multi quantum well structure in which an $In_{0.04}Ga_{0.96}N$ layer (barrier layer) and an $In_{0.16}Ga_{0.84}N$ layer (well layer) are stacked, and the second compound semiconductor layer 22 includes a p-GaN layer. In addition, the first electrode 31 includes Ti/Pt/Au, and the second electrode 32 includes a transparent conductive material, specifically, ITO. The mode loss action part 54 is formed with a circular opening 54A, and the second compound semiconductor layer 22 is exposed at a bottom portion of the opening 54A. A pad electrode (not illustrated) including, for example, Ti/Pt/Au or V/Pt/Au, for electrical connection with an external electrode or circuit, is formed on or connected onto an edge portion of the first electrode 31. A pad electrode 33 including, for example, Ti/Pd/Au or Ti/Ni/Au, for electrical connection with an external electrode or circuit, is formed on or connected onto an edge portion of the second electrode 32. The first light reflection layer 41 and the second light reflection layer 42 include a stacked structure of SiN layers and $SiO_2$ layers (the total number of dielectric films stacked: 20).

In the light emitting element of Embodiment 9, the current non-injection inside region 52 and the current non-injection outside region 53 are formed by ion injection into the light emitting structure 20. As the ion species, for example, boron has been selected, but the boron ion is not limitative.

An outline of a manufacturing method for the light emitting element of Embodiment 9 will be described below.

[Step-900]

In manufacturing the light emitting element of Embodiment 9, first, a step similar to [Step-400] in Embodiment 4 is carried out.

[Step-910]

Next, based on an ion injection method using boron ions, the current non-injection inside region 52 and the current non-injection outside region 53 are formed in the light emitting structure 20.

[Step-920]

Figure 26A:
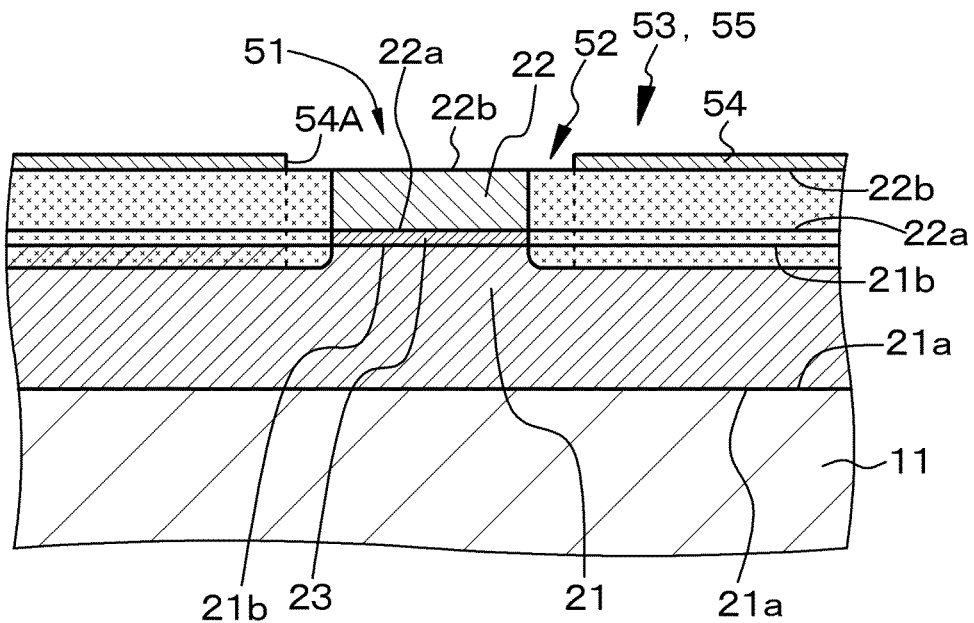
FIGS. 26A and 26B are schematic partial end views of a stacked structure and the like for explaining a manufacturing method for the light emitting element of Embodiment 9.

Thereafter, in a step similar to [Step-410] of Embodiment 4, on the second surface 22b of the second compound semiconductor layer 22, the mode loss action part (mode loss action layer) 54 having an opening 54A and including $SiO_2$ is formed based on a known method (see FIG. 26A).

[Step-930]

Figure 26B:
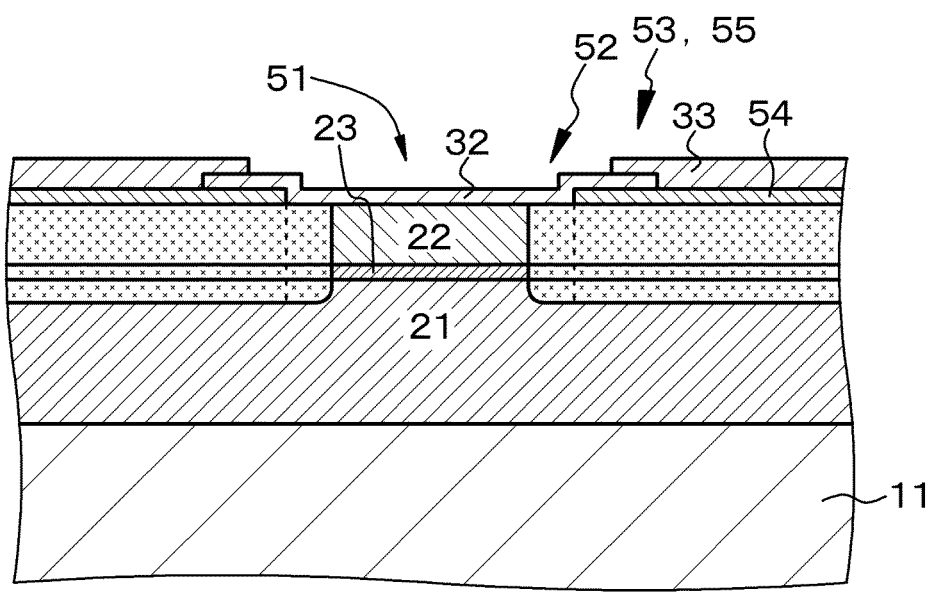

Thereafter, steps similar to [Step-420] to [Step-460] of Embodiment 4 are performed, whereby the light emitting element of Embodiment 9 can be obtained. Note that a structure obtained in the course of a step similar to [Step-420] is depicted in FIG. 26B.

In the light emitting element of Embodiment 9, the light emitting structure is formed with the current injection region, the current non-injection inside region surrounding the current injection region, and the current non-injection outside region surrounding the current non-injection inside region, and the orthogonal projection image of the mode loss action region and the orthogonal projection image of the current non-injection outside region overlap with each other.

In other words, the current injection region and the mode loss action region are partitioned (separated) from each other by the current non-injection inside region. Therefore, as a conceptual diagram is depicted in (B) of FIG. 27, a variation (specifically, an increase in Embodiment 9) in an oscillation mode loss can be set to a desired state. Alternatively, by determining, as required, the positional relation between the current injection region and the mode loss action region, the thickness of the mode loss action part constituting the mode loss action region, and the like, the variation in the oscillation mode loss can be set to a desired state. Then, as a result, problems in the conventional light emitting element such as an increase in the threshold current and worsening of the slope efficiency can be solved. For example, by decreasing the oscillation mode loss in the fundamental mode, lowering in the threshold current can be realized. Moreover, since the region to which an oscillation mode loss is caused and the region into which a current is injected and which contributes to light emission can be controlled independently, that is, since control of the oscillation mode loss and control of a light emitting state of the light emitting element can be performed independently, the degree of freedom of control and the degree of freedom in designing the light emitting element can be enhanced. Specifically, by setting the current injection region, the current non-injection region, and the mode loss action region into the above-mentioned predetermined positional relation, the magnitude relation of the oscillation mode losses that are caused by the mode loss action region to the fundamental mode and the higher order mode can be controlled, and, by relatively increasing the oscillation mode loss caused to the higher order mode with respect to the oscillation mode loss caused to the fundamental mode, the fundamental mode can be stabilized more. Furthermore, since the light emitting element of Embodiment 9 has the recessed mirror section 43, generation of the diffraction loss can be restrained more securely.

Embodiment 10

Embodiment 10 is a modification of Embodiment 9 and relates to a light emitting element of the (2-B)th configuration. As a schematic partial sectional view is depicted in FIG. 28, in the light emitting element of Embodiment 10, a current non-injection inside region 52 and a current non-injection outside region 53 are formed by irradiation with plasma of a second surface of a second compound semiconductor layer 22, an ashing treatment of the second surface of the second compound semiconductor layer 22, or a reactive ion etching (ME) treatment of the second surface of the second compound semiconductor layer 22. Since the current non-injection inside region 52 and the current non-injection outside region 53 are thus exposed to plasma particles (specifically, argon, oxygen, nitrogen, or the like), conductivity of the second compound semiconductor 22 is deteriorated, and the current non-injection inside region 52 and the current non-injection outside region 53 are brought into a high-resistance state. In other words, the current non-injection inside region 52 and the current non-injection outside region 53 are formed by exposure of the second surface 22b of the second compound semiconductor layer 22 to the plasma particles. Note that in FIGS. 28, 29, 30, and 31, illustration of a first light reflection layer 41 is omitted.

In Embodiment 10, the shape of the boundary between the current injection region 51 and the current non-injection inside region 52 is circular (diameter: 10 μm), and the shape of the boundary between the current non-injection inside region 52 and the current non-injection outside region 53 is circular (diameter: 15 μm). In other words, let the area of the orthogonal projection image of the current injection region 51 be $S_1$ and let the area of the orthogonal projection image of the current non-injection region 52 be $S_2$, then, $$0.01 \leq S_1/(S_1+S_2) \leq 0.7$$

is satisfied. Specifically, a setting of $$S_1/(S_1+S_2) = 10^2/15^2 = 0.44$$

is adopted.

In Embodiment 10, it is sufficient if the current non-injection inside region 52 and the current non-injection region 53 are formed in the light emitting structure 20, based on irradiation with plasma of the second surface of the second compound semiconductor layer 22, an ashing treatment of the second surface of the second compound semiconductor layer 22, or a reactive ion etching treatment of the second surface of the second compound semiconductor layer 22, in place of [Step-910] of Embodiment 9.

Except for the above-mentioned points, the configuration and structure of the light emitting element of Embodiment 10 may be similar to the configuration and structure of the light emitting element of Embodiment 9, and, therefore, detailed description thereof is omitted.

Also in the light emitting element of Embodiment 10 or of Embodiment 11 described below, by setting the current injection region, the current non-injection region, and the mode loss action region into the abovementioned predetermined positional relation, the magnitude relation of the oscillation mode losses that are caused by the mode loss action region to the fundamental mode and the higher order mode can be controlled, and, by relatively increasing the oscillation mode loss caused to the higher order mode with respect to the oscillation mode los caused to the fundamental mode, the fundamental mode can be stabilized more.

Embodiment 11

Embodiment 11 is a modification of Embodiments 9 and 10 and relates to a light emitting element of the (2-C)th configuration. As a schematic partial sectional view is depicted in FIG. 29, in the light emitting element of Embodiment 11, a second light reflection layer 42 has a region by which light from a first light reflection layer 41 is reflected or scattered toward the outside of a resonator structure including the first light reflection layer 41 and the second light reflection layer 42 (that is, toward a mode loss action region 55). Specifically, that part of the second light reflection layer 42 which is located on an upper side of a side wall (a side wall of an opening 54B) of a mode loss action part (mode loss action layer) 54 has a normal tapered inclined portion 42A, or, alternately, has a region curved to be protuberant toward the first light reflection layer 41.

In Embodiment 11, the shape of the boundary between a current injection region 51 and a current non-injection inside region 52 is made circular (diameter: 8 μm), and the shape of the boundary between the current non-injection inside region 52 and the current non-injection outside region 53 is made circular (diameter: 10 to 20 μm).

In Embodiment 11, when the mode loss action part (mode loss action layer) 54 having the opening 54B and including $SiO_2$ is formed in a step similar to [Step-920] of Embodiment 9, it is sufficient if the opening 54B having a normal tapered side wall is formed. Specifically, a resist layer is formed on the mode loss action layer formed on a second surface 22b of a second compound semiconductor layer 22, and the part of the resist layer where the opening 54B is to be formed is provided with an opening region, based on a photolithography technique. Based on a known method, a side wall of this opening region is formed into a normal tapered shape. Then, etching back is conducted, whereby the mode loss action part (mode loss action layer) 54 can be formed with the opening 54B having the normal tapered side wall. Further, a second electrode 32 and the second light reflection layer 42 are formed over such a mode loss action part (mode loss action layer) 54, whereby the normal tapered inclined portion 42A can be imparted to the second light reflection layer 42.

Except for the above-mentioned points, the configuration and structure of the light emitting element of Embodiment 11 may be similar to the configurations and structures of the light emitting elements of Embodiments 9 and 10, and, therefore, detailed description thereof is omitted.

Embodiment 12

Embodiment 12 is a modification of Embodiments 9 to 11 and relates to a light emitting element of the (2-D)th configuration. As a schematic partial sectional view of the light emitting element of Embodiment 12 is depicted in FIG. 30 and a schematic partial sectional view of a cut-out essential part is depicted in FIG. 31, a projected portion 22A is formed on a second surface 22b side of a second compound semiconductor layer 22. As illustrated in FIGS. 30 and 31, a mode loss action part (mode loss action layer) 54 is formed on a region 22B of the second surface 22b of the second compound semiconductor layer 22 that surrounds the projected portion 22A. The projected portion 22A occupies a current injection region 51, a current injection region 51, and a current non-injection inside region 52. The mode loss action part (mode loss action layer) 54 includes, for example, a dielectric material such as $SiO_2$, as in Embodiment 9. A current non-injection outside region 53 is provided in the region 22B. Let the optical distance from an active layer 23 in the current injection region 51 to the second surface of the second compound semiconductor layer 22 be $L_2$ and let the optical distance from the active layer 23 in a mode loss action region 55 to a top surface (a surface facing a second electrode 32) of the mode loss action part 54 be $L_0$, then, $$L_0 \leq L_2$$

is satisfied. Specifically, a setting of $$L_2/L_0 = 1.5$$

is adopted. As a result, a lens effect is generated in the light emitting element.

In the light emitting element of Embodiment 12, laser light having a generated higher order mode is confined in the current injection region 51 and the current non-injection inside region 52 by the mode loss action region 55, whereby the oscillation mode loss is reduced. In other words, the light field intensities in the fundamental mode and the higher order mode generated are increased in the orthogonal projection images of the current injection region 51 and the current non-injection inside region 52, by the presence of the mode loss action region 55 acting on the variation in the oscillation mode loss.

In Embodiment 12, the shape of the boundary between the current injection region 51 and the current non-injection inside region 52 is made circular (diameter: 8 µm), and the shape of the boundary between the current non-injection inside region 52 and the current non-injection outside region 53 is made circular (diameter: 30 µm).

In Embodiment 12, it is sufficient if the projected portion 22A is formed by removing a part of the second compound semiconductor layer 22 from the second surface 22b side, between [Step-910] and [Step-920] of Embodiment 9.

Except for the above-mentioned points, the configuration and structure of the light emitting element of Embodiment 12 may be similar to the configuration and structure of the light emitting element of Embodiment 9, and, therefore, detailed description thereof is omitted. In the light emitting element of Embodiment 12, oscillation mode losses caused to various modes by the mode loss action region can be restrained, and it is possible not only to put a transverse mode into multi-mode oscillation but also to decrease the threshold of laser oscillation. In addition, as a conceptual diagram is depicted in (C) of FIG. 27, the light field intensities in the fundamental mode and the higher order mode generated can be increased in the orthogonal projection images of the current injection region and the current non-injection inside region, by the presence of the mode loss action region acting on the variation (specifically, in Embodiment 12, a reduction) in the oscillation mode loss.

Embodiment 13

Embodiment 13 is a modification of Embodiments 9 to 12. A light emitting element of Embodiment 13 or of Embodiment 14 described below includes, more specifically, a surface-emitting laser element (light emitting element) (vertical-cavity surface-emitting laser, VCSEL) in which laser light is emitted from a top surface of a first compound semiconductor layer 21 via a first light reflection layer 41.

In the light emitting element of Embodiment 13, as a schematic partial sectional view is depicted in FIG. 32, a second compound semiconductor layer 42 is fixed to a support substrate 49 including a silicon semiconductor substrate, through a gold (Au) layer or a solder layer 48 including a tin (Sn)-containing solder layer, by a solder joining method. In manufacturing the light emitting element of Embodiment 13, it is sufficient if steps similar to [Step-900] to [Step-930] of Embodiment 9 are carried out, except for removal of the support substrate 49, that is, without removing the support substrate 49.

Also in the light emitting element of Embodiment 13, by setting the current injection region, the current non-injection region, and the mode loss action region into the above-mentioned predetermined positional relation, the magnitude relation of the oscillation mode losses caused to the fundamental mode and the higher order mode by the mode loss action region can be controlled, and, by relatively increasing the oscillation mode loss caused to the higher order mode with respect to the oscillation mode loss caused to the fundamental mode, the fundamental mode can be stabilized more.

In the example of the light emitting element described above and depicted in FIG. 32, an end portion of a first electrode 31 is spaced from the first light reflection layer 41. In other words, the first light reflection layer 41 and the first electrode 31 are spaced, or offset, from each other, and the spaced-apart distance is within 1 mm, specifically, for example, 0.05 mm on average. It is to be noted, however, that such a structure is not limitative, and the end portion of the first electrode 31 may be in contact with the first light reflection layer 41, or the end portion of the first electrode 31 may be formed ranging to a position on an edge portion of the first light reflection layer 41.

In addition, for example, after steps similar to [Step-900] to [Step-930] of Embodiment 9 are conducted, a light emitting element production substrate 11 may be removed to expose the first surface 21a of the first compound semiconductor layer 21, and then, the first light reflection layer 41 and the first electrode 31 may be formed over the first surface 21a of the first compound semiconductor layer 21. Besides, in forming the first light reflection layer 41 on the first surface 21a of the first compound semiconductor layer 21, the first compound semiconductor layer 21 may be etched to form a recess in the first surface 21a of the first compound semiconductor layer 21, and the first light reflection layer 41 may be formed in the recess. In addition, in this case, when a side wall of the recess is formed into a normal tapered shape, the light emitting element of the (2-C)th configuration can be obtained. In other words, the first light reflection layer 41 has a region (inclined portion) by which light from the second light reflection layer 42 is reflected or scattered toward the outside of a resonator structure including the first light reflection layer 41 and the second light reflection layer 42.

Embodiment 14

Embodiment 14 is a modification of Embodiments 4 to 8 and relates to a light emitting element of the third configuration, specifically, a light emitting element of the (3-A)th configuration. The light emitting element of Embodiment 14 includes, more specifically, a surface-emitting laser element (light emitting element) (vertical-cavity surface-emitting laser, VCSEL) in which laser light is emitted from a top surface of a first compound semiconductor layer 21 via a first light reflection layer 41.

The light emitting element of Embodiment 14 of which a schematic partial sectional view is depicted in FIG. 33, includes (a) a light emitting structure 20 including, in a stacked state,
   a first compound semiconductor layer 21 including a GaN-based compound semiconductor and having a first surface 21a and a second surface 21b opposite to the first surface 21a,
   an active layer (light emitting layer) 23 including a GaN-based compound semiconductor and being in contact with the second surface 21b of the first compound semiconductor layer 21, and
   a second compound semiconductor layer 22 including a GaN-based compound semiconductor and having a first surface 22a and a second surface 22b opposite to the first surface 22a, with the first surface 22a being in contact with the active layer 23, (b) a second electrode 32 formed on the second surface 22b of the second compound semiconductor layer 22, (c) a second light reflection layer 42 formed on the second electrode 32, (d) a mode loss action part 64 that is provided on the first surface 21a of the first compound semiconductor layer 21 and that constitutes a mode loss action region 65 acting on a variation in an oscillation mode loss, (e) a first light reflection layer 41 formed ranging from a position on the first surface 21a of the first compound semiconductor layer 21 to a position on the mode loss action part 64, and (f) a first electrode 31 electrically connected to the first compound semiconductor layer 21. Note that in the light emitting element of Embodiment 14, the first electrode 31 is formed on the first surface 21a of the first compound semiconductor layer 21.

Further, the light emitting structure 20 is formed with a current injection region 61, a current non-injection inside region 62 surrounding the current injection region 61, and a current non-injection outside region 63 surrounding the current non-injection inside region 62, and an orthogonal projection image of a mode loss action region 65 and an orthogonal projection image of the current non-injection outside region 63 overlap with each other. Here, while the light emitting structure 20 is formed with the current non-injection regions 62 and 63, in the example illustrated, these regions are formed ranging from the second compound semiconductor layer 22 to a part of the first compound semiconductor layer 21, in a thickness direction. It is to be noted, however, that the current non-injection regions 62 and 63 may be formed in a region on the second electrode side of the second compound semiconductor layer 22, may be formed in the whole part of the second compound semiconductor layer 22, or may be formed in the second compound semiconductor layer 22 and the active layer 23, in the thickness direction.

The configurations of the light emitting structure 20, a pad electrode 33, the first light reflection layer 41, and the second light reflection layer 42 may be similar to those in Embodiment 9, and the configurations of a joint layer 48 and a support substrate 49 may be similar to those in Embodiment 13. The mode loss action part 64 is formed with a circular opening 64A, and the first surface 21a of the first compound semiconductor layer 21 is exposed at a bottom portion of the opening 64A.

The mode loss action part (mode loss action layer) 64 includes a dielectric material such as $SiO_2$ and is formed on the first surface 21a of the first compound semiconductor layer 21. The optical thickness $t_0$ of the mode loss action part 64 may be a value deviated from an integral multiple of ¼ of the oscillation wavelength $\lambda_0$. Alternatively, the optical thickness $t_0$ of the mode loss action part 64 may be an integral multiple of ¼ of the oscillation wavelength $\lambda_0$. In other words, the optical thickness $t_0$ of the mode loss action part 64 may be such a thickness that the phase of light generated in the light emitting element is not disturbed and a standing wave of the light is not broken. It is to be noted, however, that the optical thickness $t_0$ may not necessarily be an integral multiple of ¼ of the oscillation wavelength $\lambda_0$ in a strict sense, and it is sufficient if $$(\lambda_0/4n_{m\text{-}loss}) \times m - (\lambda_0/8n_{m\text{-}loss}) \leq t_0 \leq (\lambda_0/4n_{m\text{-}loss}) \times 2m + (\lambda_0/8n_{m\text{-}loss})$$

is satisfied. Specifically, let the value of ¼ of the oscillation wavelength $\lambda_0$ be "100," then, the optical thickness $t_0$ of the mode loss action part 64 is preferably on the order of 25 to 250. In addition, with these configurations adopted, the phase difference between the laser light passing through the mode loss action part 64 and the laser light passing through the current injection region 61 can be changed (the phase difference can be controlled), control of the oscillation mode loss can be performed with a higher degree of freedom, and the degree of freedom in designing the light emitting element can further be enhanced.

In Embodiment 14, the shape of the boundary between the current injection region 61 and the current non-injection inside region 62 is made circular (diameter: 8 μm), and the shape of the boundary between the current non-injection inside region 62 and the current non-injection outside region 63 is made circular (diameter: 15 μm). In other words, let the area of the orthogonal projection image of the current injection region 61 be $S_1'$ and let the area of the orthogonal projection image of the current non-injection inside region 62 be $S_2'$, then, $$0.01 \leq S_1'/(S_1'+S_2') \leq 0.7$$

is satisfied. Specifically, a setting of $$S_1'/(S_1'+S_2')=8^2/15^2=0.28$$

is adopted.

In the light emitting element of Embodiment 14, let the optical distance from the active layer 23 in the current injection region 61 to the first surface of the first compound semiconductor layer 21 be $L_1'$ and let the optical distance from the active layer 23 in the mode loss action region 65 to a top surface (a surface facing the first electrode 31) of the mode loss action part 64 be $L_0'$, then, $$L_0' > L_1'$$

is satisfied. Specifically, a setting of $$L_0'/L_1'=1.01$$

is adopted. The laser light having a generated higher order mode is dissipated toward the outside of a resonator structure including the first light reflection layer 41 and the second light reflection layer 42, by the mode loss action region 65, whereby the oscillation mode loss is increased. Specifically, the light field intensities in the fundamental mode and the higher order mode generated are reduced in going away from the Z axis, in the orthogonal projection image of the mode loss action region 65, by the presence of the mode loss action region 65 acting on the variation in the oscillation mode loss (see a conceptual diagram in (B) of FIG. 27); in this case, a reduction in the light field intensity in the higher order mode is larger than a reduction in the light field intensity in the fundamental mode, so that the fundamental mode can be stabilized more, lowering in the threshold current can be realized, and the relative light field intensity in the fundamental mode can be increased.

In the light emitting element of Embodiment 14, the current non-injection inside region 62 and the current non-injection outside region 63 are formed by ion injection into the light emitting structure 20, as in Embodiment 9. As the ion species, for example, boron has been selected, but the boron ion is not limitative.

A manufacturing method for the light emitting element of Embodiment 14 will be described below.

[Step-1400]

First, a step similar to [Step-900] of Embodiment 9 is carried out, whereby the light emitting structure 20 can be obtained. Next, a step similar to [Step-910] of Embodiment 9 is performed, whereby the current non-injection inside region 62 and the current non-injection outside region 63 can be formed in the light emitting structure 20.

[Step-1410]

Subsequently, the second electrode 32 is formed on the second surface 22b of the second compound semiconductor layer 22, based on, for example, a lift-off method, and, further, the pad electrode 33 is formed based on a known method. Thereafter, the second light reflection layer 42 is formed ranging from a position on the second electrode 32 to a position on the pad electrode 33, based on a known method.

[Step-1420]

Thereafter, the second light reflection layer 42 is fixed to a support substrate 49 through a joint layer 48.

[Step-1430]

Next, a light emitting element production substrate 11 is removed, to expose the first surface 21a of the first compound semiconductor layer 21. Specifically, first, the thickness of the light emitting element production substrate 11 is reduced based on a mechanical polishing method, and, next, the remaining part of the light emitting element production substrate 11 is removed based on a CMP method. In this way, the first surface 21a of the first compound semiconductor layer 21 is exposed.

[Step-1440]

Thereafter, the mode loss action part (mode loss action layer) 64 having the opening 64A and including $SiO_2$ is formed on the first surface 21a of the first compound semiconductor layer 21, based on a known method.

[Step-1450]

Next, the first light reflection layer 41 that includes a recessed mirror section 43 including a base section 45F and a multilayer light reflection film 46 is formed on the first surface 21a of the first compound semiconductor layer 21 exposed at a bottom portion of the opening 64A in the mode loss action part 64, and, further, the first electrode 31 is formed. In this way, the light emitting element of Embodiment 14 having the structure depicted in FIG. 33 can be obtained.

[Step-1460]

Thereafter, what is generally called element isolation is conducted to isolate the light emitting element, and side surfaces and exposed surfaces of the stacked structure and the light emitting structure are coated with an insulating film including $SiO_2$, for example. Then, packaging or sealing is performed, to complete the light emitting element of Embodiment 14.

Also in the light emitting element of Embodiment 14, the light emitting structure is formed with the current injection region, the current non-injection inside region surrounding the current injection region, and the current non-injection outside region surrounding the current non-injection inside region, and the orthogonal projection image of the mode loss action region and the orthogonal projection image of the current non-injection outside region overlap with each other. Therefore, as a conceptual diagram is depicted in (B) of FIG. 27, a variation (specifically, in Embodiment 14, an increase) in an oscillation mode loss can be set to a desired state. Moreover, since control of the oscillation mode loss and control of a light emitting state of the light emitting element can be performed independently, the degree of freedom of control and the degree of freedom in designing the light emitting element can be enhanced. Specifically, by setting the current injection region, the current non-injection region, and the mode loss action region into the abovementioned predetermined positional relation, the magnitude relation of the oscillation mode losses caused to the fundamental mode and the higher order mode by the mode loss action region can be controlled, and, by relatively increasing the oscillation mode loss caused to the higher order mode with respect to the oscillation mode loss caused to the fundamental mode, the fundamental mode can be stabilized more. In addition, a reduction in the influence of the reverse lens effect can also be realized. Furthermore, since the light emitting element of Embodiment 14 has the recessed mirror section 43, generation of a diffraction loss can be restrained more securely.

Also in Embodiment 14, as in Embodiment 10, the current non-injection inside region 62 and the current non-injection outside region 63 can be formed by irradiation with plasma of the second surface of the second compound semiconductor layer 22, an ashing treatment of the second surface of the second compound semiconductor layer 22, or a reactive ion etching (RIE) treatment of the second surface of the second compound semiconductor layer 22 (light emitting element of the (3-B)th configuration). With the current non-injection inside region 62 and the current non-injection outside region 63 thus exposed to plasma particles, conductivity of the second compound semiconductor layer 22 is deteriorated, and the current non-injection inside region 62 and the current non-injection outside region 63 are brought into a high-resistance state. In other words, the current non-injection inside region 62 and the current non-injection outside region 63 are formed by exposure of the second surface 22b of the second compound semiconductor layer 22 to the plasma particles.

In addition, as in Embodiment 11, the second light reflection layer 42 may include a region by which light from the first light reflection layer 41 is reflected or scattered toward the outside of a resonator structure including the first light reflection layer 41 and the second light reflection layer 42 (that is, toward the mode loss action region 65) (light emitting element of the (3-C)th configuration). Alternatively, as in Embodiment 13, in forming the first light reflection layer 41 on the first surface 21a of the first compound semiconductor layer 21, the first compound semiconductor layer 21 may be etched to form a recess in the first surface 21a of the first compound semiconductor layer 21, and the first light reflection layer 41 may be formed in the recess; in this case, a side wall of the recess may be formed in a normal tapered shape.

Besides, as in Embodiment 12, a projected portion may be formed on the first surface 21a side of the first compound semiconductor layer 21, and the mode loss action part (mode loss action layer) 64 may be formed on a region of the first surface 21a of the first compound semiconductor layer 21 that surrounds the projected portion (light emitting element of the (3-D)th configuration). It is sufficient if the mode loss action part (mode loss action layer) 64 is formed on a region of the first surface 21a of the first compound semiconductor layer 21 that surrounds the projected portion. The projected portion occupies the current injection region 61, the current injection region 61 and the current non-injection inside region 62. As a result, the laser light having the generated higher order mode is confined in the current injection region 61 and the current non-injection inside region 62 by the mode loss action region 65, whereby the oscillation mode loss is reduced. In other words, the light field intensities in the fundamental mode and the higher order mode generated are increased in the orthogonal projection images of the current injection region 61 and the current non-injection inside region 62, by the presence of the mode loss action region 65 acting on the variation in the oscillation mode loss. Also in the modification of the light emitting element of Embodiment 14 having such a configuration, oscillation mode losses caused to various modes by the mode loss action region 65 can be restrained, and it is possible not only to put a transverse mode into multi-mode oscillation but also to decrease the threshold of laser oscillation. In addition, as a conceptual diagram is depicted in (C) of FIG. 27, the light field intensities in the fundamental mode and the higher order mode generated can be increased in the orthogonal projection images of the current injection region and the current non-injection inside region, by the presence of the mode loss action region 65 acting on the variation (specifically, in the modification of the light emitting element of Embodiment 14, a decrease) in the oscillation mode loss.

In some cases, a projected portion (mesa structure) may be formed on the first surface 21a side of the first compound semiconductor layer 21, and a region of the first compound semiconductor layer 21 that surrounds the projected portion may be made to be the mode loss action region (mode loss action part). In other words, in this case, it is sufficient if formation of the mode loss action layer is omitted and the mode loss action part includes the region of the first compound semiconductor layer that surrounds the projected portion. Then, it is sufficient if the first light reflection layer 41 is formed on the top surface of the projected portion. The projected portion occupies the current injection region 61, the current injection region 61, and the current non-injection inside region 62. As a result of this as well, the laser light having a generated higher order mode is confined in the current injection region 61 and the current non-injection inside region 62 by the mode loss action region, whereby the oscillation mode loss is reduced. In other words, the light field intensities in the fundamental mode and the higher order mode generated are increased in the orthogonal projection images of the current injection region 61 and the current non-injection inside region 62, by the presence of the mode loss action region acting on the variation in the oscillation mode loss. Also in the modification of the light emitting element of Embodiment 14 having such a configuration, oscillation mode losses caused to various modes by the mode loss action region can be restrained, and it is possible not only to put a transverse mode into multi-mode oscillation but also to reduce the threshold of laser oscillation. In addition, as a conceptual diagram is depicted in (C) of FIG. 27, the light field intensities in the fundamental mode and the higher order mode generated can be increased in the orthogonal projection images of the current injection region and the current non-injection inside region, by the presence of the mode loss action region acting on the variation (specifically, in the modification of the light emitting element of Embodiment 14, a decrease) in the oscillation mode loss.

While the present disclosure has been described based on preferred embodiments, the present disclosure is not to be limited to these embodiments. The configurations and structures of the light emitting elements described in the embodiments are merely illustrative and can be modified, as required, and the manufacturing methods for the light emitting elements can also be modified, as required. In some cases, by suitably selecting the joint layer and the support substrate, a surface-emitting laser element in which light is emitted from the top surface of the second compound semiconductor layer via the second light reflection layer can be realized. By removing the support substrate after forming the first light reflection layer and the first electrode, a surface-emitting laser element in which light is emitted from the top surface of the second compound semiconductor layer via the second light reflection layer can be completed. Alternatively, by fixing the first light reflection layer to a second support substrate and thereafter, removing the support substrate to expose the second light reflection layer, a surface-emitting laser element in which light is emitted from the top surface of the second compound semiconductor layer via the second light reflection layer can be completed.

Note that the present disclosure may also take the following configurations.

[A01]«Light Emitting Element . . . First Mode»
    A light emitting element including:
    a stacked structure including, in a stacked state,
    a first light reflection layer in which a plurality of thin films is stacked, a light emitting structure, and
a second light reflection layer in which a plurality of thin films is stacked,
in which the light emitting structure includes
a first compound semiconductor layer,
an active layer, and
a second compound semiconductor layer that are stacked from the first light reflection layer side,
the light emitting structure is formed with a light absorbing material layer in parallel to a virtual plane occupied by the active layer, and
let a wavelength of light which is emitted from the active layer and which has a maximum intensity be $\lambda_0$, let an equivalent refractive index of layers occupying layers ranging from the active layer to the light absorbing material layer be $n_{eq}$, let an optical distance from the active layer to the light absorbing material layer be $L_{op}$, and let $\Lambda \equiv \{(2m+1)\lambda_0\}/(4n_{eq})$ (where m is an integer of equal to or more than 0), then,
a value of $L_{op}$ is a value different from $\Lambda$, and
a thickness $T_{ave}$ of a light reflection layer on a side on which the light absorbing material layer is located is a value different from a thickness $T_{DBR}$,
where let refractive indexes of thin films constituting the light reflection layer on the side on which the light absorbing material layer is located be $n_i$ and let the total number of the thin films be 1, then, $T_{DBR} = \Sigma(\lambda_0/4n_i)$, i=1, 2, 3, . . . , 1, and
"$\Sigma$" means to sum up from i=1 to i=1.
[A02]
The light emitting element according to [A01],
in which the value of $L_{op}$ is $0.95 \times \Lambda \leq L_{op} \leq 0.99 \times \Lambda$ and $T_{DBR} < T_{ave}$.

[A03]
The light emitting element according to [A01],
in which the value of $L_{op}$ is $0.95 \times \Lambda \leq L_{op} \leq 0.99 \times \Lambda$ and
a wavelength of a stop band center of the light reflection layer on the side on which the light absorbing material layer is located is longer than $\lambda_0$.
[A04]
The light emitting element according to [A01],
in which the value of $L_{op}$ is $1.01 \times \Lambda \leq L_{op} \leq 1.05 \times \Lambda$ and $T_{ave} < T_{DBR}$.

[A05]
The light emitting element according to [A01],
in which the value of $L_{op}$ is $1.01 \times \Lambda \leq L_{op} \leq 1.05 \times \Lambda$ and
a wavelength of a stop band center of the light reflection layer on the side on which the light absorbing material layer is located is shorter than $\lambda_0$.

[A06] «Light Emitting Element . . . Second Mode»
A light emitting element including:
a stacked structure including, in a stacked state,
a first light reflection layer,
a light emitting structure, and
a second light reflection layer,
in which the light emitting structure includes
a first compound semiconductor layer,
an active layer, and
a second compound semiconductor layer that are stacked from the first light reflection layer side,
the light emitting structure is formed, at an end portion thereof, with a light absorbing material layer in parallel to a virtual plane occupied by the active layer,
a dielectric layer is formed between the light absorbing material layer and a light reflection layer on a side on which the light absorbing material layer is located, and
let a wavelength of light which is emitted from the active layer and which has a maximum intensity be $\lambda_0$, let an equivalent refractive index of layers occupying layers ranging from the active layer to the light absorbing material layer be $n_{eq}$, let an optical distance from the active layer to the light absorbing material layer be $L_{op}$, let a refractive index of the dielectric layer be $n_{del}$, let an optical distance from the light absorbing material layer to an interface between the light reflection layer on the side on which the light absorbing material layer is located and the dielectric layer be $L_{del}$, and let $\Lambda \equiv \{(2m+1)\lambda_0\}/(4n_{eq})$ (where m is an integer of equal to or more than 0), then,
a value of $L_{op}$ is a value different from $\Lambda$, and $L_{del} \neq \lambda_0/(4n_{del})$.

[A07]
The light emitting element according to [A06],
in which the value of $L_{op}$ is $0.95 \times \Lambda \leq L_{op} \leq 0.99 \times \Lambda$ and $\lambda_0/(4n_{del}) \leq L_{del}$.

[A08]
The light emitting element according to [A06],
in which the value of $L_{op}$ is $1.01 \times \Lambda \leq L_{op} \leq 1.05 \times \Lambda$ and $L_{del} < \lambda_0/(4n_{del})$.

[A09]
The light emitting element according to any one of [A01] to [A08],
in which the light absorbing material layer is located in the vicinity of a minimum amplitude portion generated in a standing wave of light formed inside the stacked structure.
[A10]
The light emitting element according to any one of [A01] to [A09],
in which the active layer is located in the vicinity of a maximum amplitude portion generated in a standing wave of light formed inside the stacked structure.
[A11]
The light emitting element according to any one of [A01] to [A10],
in which the light absorbing material layer has a light absorption coefficient of equal to or more than twice a light absorption coefficient of a compound semiconductor constituting the light emitting structure.

[A12]

The light emitting element according to any one of [A01] to [A11], in which the light absorbing material layer includes at least one material selected from the group including a compound semiconductor material narrower in bandgap than the compound semiconductor constituting the light emitting structure, a compound semiconductor material doped with an impurity, a transparent conductive material, and a dielectric material having a light absorption characteristic.

[A13]

The light emitting element according to any one of [A01] to [A12], in which the first compound semiconductor layer, the active layer, and the second compound semiconductor layer include a GaN-based compound semiconductor material.

[B01]

The light emitting element according to any one of [A01] to [A13], in which the first light reflection layer has a recessed mirror section, and the second light reflection layer has a flat shape.

[B02]

The light emitting element according to [B01], in which, let a cavity length be $L_{OR}$, then, $1\times10^{-5}$ m≤$L_{OR}$ is satisfied.

[B03]

The light emitting element according to [B01] or [B02], in which a figure drawn by an interface, facing the light emitting structure, of a part of the recessed mirror section of the first light reflection layer when the first light reflection layer is cut along a virtual plane containing a stacking direction of the stacked structure includes a part of a circle or a part of a parabola.

[C01]<<Light Emitting Element of First Configuration>>

The light emitting element according to any one of [B01] to [B03], in which the second compound semiconductor layer is provided with a current injection region and a current non-injection region surrounding the current injection region, and a shortest distance $D_{CI}$ from an area center of gravity of the current injection region to a boundary between the current injection region and the current non-injection region satisfies the following formula:

$$D_{CI} \geq \omega_0/2$$

provided that $$\omega_0^2 \equiv (\lambda_0/\pi)\{L_{OR}(R_{DBR}-L_{OR})\}^{1/2}$$

where $\lambda_0$: oscillation wavelength, $L_{OR}$: cavity length, and $R_{DBR}$: radius of curvature of recessed mirror section of first light reflection layer

[C02]

The light emitting element according to [C01], further including:

a mode loss action part that is provided on a second surface of the second compound semiconductor layer and that constitutes a mode loss action region acting on a variation in an oscillation mode loss;

a second electrode formed ranging from a position on the second surface of the second compound semiconductor layer to a position on the mode loss action part; and a first electrode electrically connected to the first compound semiconductor layer, in which the second light reflection layer is formed on the second electrode, the light emitting structure is formed with a current injection region, a current non-injection inside region surrounding the current injection region, and a current non-injection outside region surrounding the current non-injection inside region, and an orthogonal projection image of the mode loss action region and an orthogonal projection image of the current non-injection outside region overlap with each other.

[C03]

The light emitting element according to [C01] or [C02], in which a radius $r'_{DBR}$ of an effective region in the recessed mirror section of the first light reflection layer satisfies $$\omega_0 \leq r'_{DBR} \leq 20\cdot\omega_0.$$

[C04]

The light emitting element according to any one of [C01] to [C03], satisfying $D_{CI} \geq \omega_0$.

[C05]

The light emitting element according to any one of [C01] to [C04], satisfying $R_{DBR} \leq 1\times10^{-3}$ m.

[D01]<<Light Emitting Element of Second Configuration>>

The light emitting element according to any one of [A01] to [B03], further including:

a mode loss action part that is provided on a second surface of the second compound semiconductor layer and that constitutes a mode loss action region acting on a variation in an oscillation mode loss;

a second electrode formed ranging from a position on the second surface of the second compound semiconductor layer to a position on the mode loss action part; and a first electrode electrically connected to the first compound semiconductor layer, in which the second light reflection layer is formed on the second electrode, the light emitting structure is formed with a current injection region, a current non-injection inside region surrounding the current injection region, and a current non-injection outside region surrounding the current non-injection inside region, and an orthogonal projection image of the mode loss action region and an orthogonal projection image of the current non-injection outside region overlap with each other.

[D02]

The light emitting element according to [D01], in which the current non-injection outside region is located on a lower side of the mode loss action region.

[D03]

The light emitting element according to [D01] or [D02], in which let an area of a projection image of the current injection region be $S_1$ and let an area of a projection image of the current non-injection inside region be $S_2$, then, $$0.01 \leq S_1/(S_1+S_2) \leq 0.7$$

is satisfied.

[D04]

The light emitting element according to any one of [D01] to [D03], in which the current non-injection inside region and the current non-injection outside region are formed by ion injection into the light emitting structure.

[D05]

The light emitting element according to [D04], in which ion species includes at least one kind of ion selected from a group including boron, proton, phosphorus, arsenic, carbon, nitrogen, fluorine, oxygen, germanium, and silicon.

[D06]«Light Emitting Element of (2-B)th Configuration»

The light emitting element according to any one of [D01] to [D05], in which the current non-injection inside region and the current non-injection outside region are formed by irradiation with plasma of the second surface of the second compound semiconductor layer, an ashing treatment of the second surface of the second compound semiconductor layer, or a reactive ion etching treatment of the second surface of the second compound semiconductor layer.

[D07]«Light Emitting Element of (2-C)th Configuration»

The light emitting element according to any one of [D01] to [D06], in which the second light reflection layer has a region by which light from the first light reflection layer is reflected or scattered toward an outside of a resonator structure including the first light reflection layer and the second light reflection layer.

[D08]

The light emitting element according to any one of [D04] to [D07], in which let an optical distance from the active layer in the current injection region to the second surface of the second compound semiconductor layer be $L_2$ and let an optical distance from the active layer in the mode loss action region to a top surface of the mode loss action part be $L_0$, then, $$L_0 > L_2$$

is satisfied.

[D09]

The light emitting element according to any one of [D04] to [D08], in which light having a generated higher order mode is dissipated toward the outside of the resonator structure including the first light reflection layer and the second light reflection layer, by the mode loss action region, whereby the oscillation mode loss is increased.

[D10]

The light emitting element according to any one of [D04] to [D09], in which the mode loss action part includes a dielectric material, a metallic material, or an alloy material.

[D11]

The light emitting element according to [D10], in which the mode loss action part includes a dielectric material, and an optical thickness of the mode loss action part is a value deviated from an integral multiple of ¼ of a wavelength of light generated in the light emitting element.

[D12]

The light emitting element according to [D10], in which the mode loss action part includes a dielectric material, and the optical thickness of the mode loss action part is an integral multiple of ¼ of a wavelength of light generated in the light emitting element.

[D13]«Light Emitting Element of (2-D)th Configuration»

The light emitting element according to any one of [D01] to [D03], in which a projected portion is formed on a second surface side of the second compound semiconductor layer, and the mode loss action part is formed on a region of the second surface of the second compound semiconductor layer that surrounds the projected portion.

[D14]

The light emitting element according to [D13], in which let an optical distance from the active layer in the current injection region to the second surface of the second compound semiconductor layer be $L_2$ and let an optical distance from the active layer in the mode loss action region to a top surface of the mode loss action part be $L_0$, then, $$L_0 < L_2$$

is satisfied.

[D15]

The light emitting element according to [D13] or [D14], in which light having a generated higher order mode is confined in the current injection region and the current non-injection inside region, by the mode loss action region, whereby the oscillation mode loss is reduced.

[D16]

The light emitting element according to any one of [D13] to [D15], in which the mode loss action part includes a dielectric material, a metallic material, or an alloy material.

[D17]

The light emitting element according to any one of [D01] to [D16], in which the second electrode includes a transparent conductive material.

[E01]«Light Emitting Element of Third Configuration»

The light emitting element according to any one of [A01] to [B03], further including:

a second electrode formed on a second surface of the second compound semiconductor layer;

a second light reflection layer formed on the second electrode;

a mode loss action part that is provided on a first surface of the first compound semiconductor layer and that constitutes a mode loss action region acting on a variation in an oscillation mode loss; and a first electrode electrically connected to the first compound semiconductor layer, in which the first light reflection layer is formed ranging from a position on the first surface of the first compound semiconductor layer to a position on the mode loss action part, the light emitting structure is formed with a current injection region, a current non-injection inside region surrounding the current injection region, and a current non-injection outside region surrounding the current non-injection inside region, and an orthogonal projection image of the mode loss action region and an orthogonal projection image of the current non-injection outside region overlap with each other.

[E02]

The light emitting element according to [E01], in which let an area of a projection image of the current injection region be $S_1$ and let an area of a projection image of the current non-injection inside region be $S_2$, then, $$0.01 \leq S_1'/(S_1'+S_2') \leq 0.7$$

is satisfied.

[E03]«Light Emitting Element of (3-A)th Configuration»

The light emitting element according to [E01] or [E02], in which the current non-injection inside region and the current non-injection outside region are formed by ion injection into the light emitting structure.

[E04]

The light emitting element according to [E03],
in which ion species includes at least one kind of ion selected from a group including boron, proton, phosphorus, arsenic, carbon, nitrogen, fluorine, oxygen, germanium, and silicon.

[E05] «Light Emitting Element of (3-B)th Configuration»

The light emitting element according to any one of [E01] to [E04], in which the current non-injection inside region and the current non-injection outside region are formed by irradiation with plasma of the second surface of the second compound semiconductor layer, an ashing treatment of the second surface of the second compound semiconductor layer, or a reactive ion etching treatment of the second surface of the second compound semiconductor layer.

[E06] «Light Emitting Element of (3-C)th Configuration»

The light emitting element according to any one of [E01] to [E05], in which the second light reflection layer has a region by which light from the first light reflection layer is reflected or scattered toward an outside of a resonator structure including the first light reflection layer and the second light reflection layer.

[E07]

The light emitting element according to any one of [E03] to [E06], in which let an optical distance from the active layer in the current injection region to the first surface of the first compound semiconductor layer be $L_1'$, and let an optical distance from the active layer in the mode loss action region to a top surface of the mode loss action part be $L_0'$, then, $$L_0' > L_1'$$

is satisfied.

[E08]

The light emitting element according to any one of [E03] to [E07],
in which light having a generated higher order mode is dissipated toward the outside of the resonator structure including the first light reflection layer and a second light reflection layer, by the mode loss action region, whereby the oscillation mode loss is increased.

[E09]

The light emitting element according to any one of [E03] to [E08], in which the mode loss action part includes a dielectric material, a metallic material, or an alloy material.

[E10]

The light emitting element according to [E09],
in which the mode loss action part includes a dielectric material, and
an optical thickness of the mode loss action part is a value deviated from an integral multiple of ¼ of a wavelength of light generated in the light emitting element.

[E11]

The light emitting element according to [E09],
in which the mode loss action part includes a dielectric material, and
an optical thickness of the mode loss action part is an integral multiple of ¼ of a wavelength of light generated in the light emitting element.

[E12] «Light Emitting Element of (3-D)th Configuration»

The light emitting element according to [E01] or [E02],
in which a projected portion is formed on a first surface side of the first compound semiconductor layer, and
the mode loss action part is formed on a region of the first surface of the first compound semiconductor layer that surrounds the projected portion.

[E13]

The light emitting element according to [E12],
in which let an optical distance from the active layer in the current injection region to the first surface of the first compound semiconductor layer be $L_1'$ and let an optical distance from the active layer in the mode loss action region to a top surface of the mode loss action part be $L_0'$, then, $$L_0' < L_1'$$

is satisfied.

[E14]

The light emitting element according to [E01] or [E02],
in which a projected portion is formed on a first surface side of the first compound semiconductor layer, and
the mode loss action part includes a region of the first surface of the first compound semiconductor layer that surrounds the projected portion.

[E15]

The light emitting element according to any one of [E12] to [E14],
in which light having a generated higher order mode is confined in the current injection region and the current non-injection inside region, by the mode loss action region, whereby the oscillation mode loss is decreased.

[E16]

The light emitting element according to any one of [E12] to [E15],
in which the mode loss action part includes a dielectric material, a metallic material, or an alloy material.

[E17]

The light emitting element according to any one of [E01] to [E16],
in which the second electrode includes a transparent conductive material.

[F01]

The light emitting element according to any one of [B01] to [E08],
in which a compound semiconductor substrate is disposed between the first surface of the first compound semiconductor layer and the first light reflection layer.

[F02]

The light emitting element according to [F01],
in which the compound semiconductor substrate includes a GaN substrate.

[F03]

The light emitting element according to [F01] or [F02],
in which a recessed mirror section of the first light reflection layer includes
  a base section including a projecting section of the compound semiconductor substrate, and
  a multilayer light reflection film formed on a surface of at least a part of the base section.

[F04]

The light emitting element according to [F01] or [F02],
in which a recessed mirror section of the first light reflection layer includes
  a base section formed on the compound semiconductor substrate, and
  a multilayer light reflection film formed on a surface of at least a part of a base section.

[F05]

The light emitting element according to any one of [B01] to [E08],
in which the first light reflection layer is formed on the first surface of the first compound semiconductor layer.

[F06]

The light emitting element according to any one of [B01] to [F05], in which a value of thermal conductivity of the light emitting structure is higher than a value of thermal conductivity of the first light reflection layer.

[F07]

The light emitting element according to any one of [B01] to [F06], in which let a radius of curvature of the recessed mirror section of the light emitting element be $R_{DBR}$, then, $R_{DBR} \leq 1 \times 10^{-3}$ m is satisfied.

[F08]

The light emitting element according to any one of [B01] to [F07], in which a protuberant-shaped portion is formed in the periphery of the first light reflection layer, and the first light reflection layer does not project from the protuberant-shaped portion.

[G01]《Manufacturing Method for Light Emitting Element》

A method of manufacturing a light emitting element, the method including the steps of:

forming on a compound semiconductor substrate a light emitting structure including a GaN-based compound semiconductor, the light emitting structure including, in a stacked state,
- a first compound semiconductor layer having a first surface and a second surface opposite to the first surface,
- an active layer facing the second surface of the first compound semiconductor layer, and
- a second compound semiconductor layer having a first surface facing the active layer and a second surface opposite to the first surface;

forming a second electrode and a second light reflection layer over the second compound semiconductor layer;

next, fixing the second light reflection layer to a support substrate;

thereafter, thinning the compound semiconductor substrate;

thereafter, forming a base section including a projecting section in an exposed surface of the compound semiconductor substrate, or forming the base section including the projecting section on the exposed surface of the compound semiconductor substrate;

thereafter, forming a first light reflection layer on at least a part of the base section, and forming a first electrode electrically connected to the first compound semiconductor layer, in which the base section constitutes a recessed mirror section, and the second light reflection layer has a flat shape.

REFERENCE SIGN LIST

11 . . . Compound semiconductor substrate (Light emitting element production substrate, GaN substrate), 11a . . . First surface of compound semiconductor substrate (light emitting element production substrate) that faces first compound semiconductor layer, 11a' . . . Projecting section of first surface of compound semiconductor substrate, 11a" . . . Recess, 11b . . . Second surface of compound semiconductor substrate (light emitting element production substrate) that faces first compound semiconductor layer, 11A . . . Protuberant-shaped portion, 20 . . . Light emitting structure, 21 . . . First compound semiconductor layer, 21a . . . First surface of first compound semiconductor layer, 21b . . . Second surface of first compound semiconductor layer, 21d, 21e . . . Projecting section of first surface of first compound semiconductor layer, 22 . . . Second compound semiconductor layer, 22a . . . First surface of second compound semiconductor layer, 22b . . . Second surface of second compound semiconductor layer, 23 . . . Active layer (Light emitting layer), 24 . . . Current constriction layer (Insulating layer), 25 . . . Opening formed in current constriction layer (insulating layer), 26 . . . Dielectric layer, 31 . . . First electrode, 32 . . . Second electrode, 33 . . . Pad electrode, 41 . . . First light reflection layer, 41A . . . Inclined portion formed in first compound semiconductor layer, 42 . . . Second light reflection layer, 42A . . . Normal tapered inclined portion formed in second light reflection layer, 43 . . . Recessed mirror section, 43A . . . Recess, 43a . . . Interface, facing light emitting structure, of effective region in recessed mirror section of first light reflection layer, 44 . . . Effective region in recessed mirror section of first light reflection layer, 45A, 45B, 45D, 45E, 45F . . . Base section, 45c . . . Projecting section, 46 . . . Multilayer light reflection film, 47 . . . Planarization film, 48 . . . Joint layer, 49 . . . Support substrate, 51, 61 . . . Current injection region, 52, 62 . . . Current non-injection inside region, 53, 63 . . . Current non-injection outside region, 54, 64 . . . Mode loss action part (Mode loss action layer), 54A, 54B, 64A . . . Opening formed in mode loss action part, 55, 65 . . . Mode loss action region, 71 . . . Light absorbing material layer

The invention claimed is:

1. A light emitting element comprising:
a stacked structure including, in a stacked state,
a first light reflection layer in which a plurality of thin films is stacked,
a light emitting structure, and
a second light reflection layer in which a plurality of thin films is stacked,
wherein the light emitting structure includes
a first compound semiconductor layer,
an active layer, and
a second compound semiconductor layer, that are stacked from a first light reflection layer side,
the light emitting structure is formed with a light absorbing material layer in parallel to a virtual plane occupied by the active layer, and
where a wavelength of light which is emitted from the active layer and which has a maximum intensity be $\lambda_0$, an equivalent refractive index of layers occupying layers ranging from the active layer to the light absorbing material layer is $n_{eq}$, an optical distance from the active layer to the light absorbing material layer is $L_{op}$, and let $\lambda \equiv \{(2m+1)\lambda_0\}/(4n_{eq})$ (where m is an integer of equal to or more than 0), then,
a value of $L_{op}$ is a value different from A, and
a thickness $T_{ave}$ of a light reflection layer on a side on which the light absorbing material layer is located is a value different from a thickness $T_{DBR}$, and
where refractive indexes of thin films constituting the light reflection layer on the side on which the light absorbing material layer is located is $n_i$ and the total number of the thin films is 1, then, $T_{DBR} = \Sigma(\lambda_0/4n_i)$, i=1, 2, 3, . . . , 1, and
"Σ" means to sum up from i=1 to i=1,
wherein the first compound semiconductor layer, the active layer, and the second compound semiconductor layer include a GaN-based compound semiconductor material.

2. The light emitting element according to claim 1, wherein the value of $L_{op}$ is $$0.95 \times \Lambda \leq L_{op} \leq 0.99 \times \Lambda$$

and $T_{DBR} < T_{ave}$.

3. The light emitting element according to claim 1, wherein the value of $L_{op}$ is $$0.95 \times \Lambda \leq L_{op} \leq 0.99 \times \Lambda$$

and
a wavelength of a stop band center of the light reflection layer on the side on which the light absorbing material layer is located is longer than $\lambda_0$.

4. The light emitting element according to claim 1, wherein the value of $L_{op}$ is $$1.01 \times \Lambda \leq L_{op} \leq 1.05 \times \Lambda$$

and $T_{ave} < T_{DBR}$.

5. The light emitting element according to claim 1, wherein the value of $L_{op}$ is $$1.01 \times \Lambda \leq L_{op} \leq 1.05 \times \Lambda$$

and
a wavelength of a stop band center of the light reflection layer on the side on which the light absorbing material layer is located is shorter than $\lambda_0$.

6. The light emitting element according to claim 1, wherein the light absorbing material layer is located in a vicinity of a minimum amplitude portion generated in a standing wave of light formed inside the stacked structure.

7. The light emitting element according to claim 1, wherein the active layer is located in a vicinity of a maximum amplitude portion generated in a standing wave of light formed inside the stacked structure.

8. The light emitting element according to claim 1, wherein the light absorbing material layer has a light absorption coefficient of equal to or more than twice a light absorption coefficient of a compound semiconductor constituting the light emitting structure.

9. The light emitting element according to claim 1, wherein the light absorbing material layer includes at least one material selected from a group including a compound semiconductor material narrower in bandgap than a compound semiconductor constituting the light emitting structure, a compound semiconductor material doped with an impurity, a transparent conductive material, and a dielectric material having a light absorption characteristic.

10. A light emitting element comprising:
a stacked structure including, in a stacked state,
a first light reflection layer,
a light emitting structure, and
a second light reflection layer,
wherein the light emitting structure includes
a first compound semiconductor layer,
an active layer, and
a second compound semiconductor layer, that are stacked from a first light reflection layer side,
the light emitting structure is formed, at an end portion thereof, with a light absorbing material layer in parallel to a virtual plane occupied by the active layer,
a dielectric layer is formed between the light absorbing material layer and a light reflection layer on a side on which the light absorbing material layer is located, and
where a wavelength of light which is emitted from the active layer and which has a maximum intensity be $\lambda_0$ let an equivalent refractive index of layers occupying layers ranging from the active layer to the light absorbing material layer is $n_{eq}$, an optical distance from the active layer to the light absorbing material layer be $L_{op}$, a refractive index of the dielectric layer is $n_{del}$, let an optical distance from the light absorbing material layer to an interface between the light reflection layer on the side on which the light absorbing material layer is located and the dielectric layer is $L_{del}$, and $\Lambda = \{(2m+1)\lambda_0\}/(4n_{eq})$ (where m is an integer of equal to or more than 0), then
a value of $L_{op}$ is a value different from $\Lambda$, and
$L_{del} \neq \lambda_0/(4n_{del})$.

11. The light emitting element according to claim 10, wherein the value of $L_{op}$ is $$0.95 \times \Lambda \leq L_{op} \leq 0.99 \times \Lambda$$

and
$\lambda_0/(4n_{del}) < L_{del}$.

12. The light emitting element according to claim 6, wherein the value of $L_{op}$ is $$1.01 \times \Lambda \leq L_{op} \leq 1.05 \times \Lambda$$

and
$L_{del} < \lambda_0/(4n_{del})$.

* * * * *